United States Patent
Chamberland et al.

(10) Patent No.: US 12,165,013 B1
(45) Date of Patent: Dec. 10, 2024

(54) TRAINING NEURAL NETWORK LOCAL DECODERS FOR CIRCUIT-LEVEL QUANTUM ERROR CORRECTION

(71) Applicant: Amazon Technologies, Inc., Seattle, WA (US)

(72) Inventors: Christopher Chamberland, Pasadena, CA (US); Luis Goncalves, Pasadena, CA (US); Prasahnt Sivarajah, Pasadena, CA (US); Eric Christopher Peterson, Oakland, CA (US); Sebastian Johannes Grimberg, San Francisco, CA (US)

(73) Assignee: Amazon Technologies, Inc., Seattle, WA (US)

( * ) Notice: Subject to any disclaimer, the term of this patent is extended or adjusted under 35 U.S.C. 154(b) by 196 days.

(21) Appl. No.: 17/937,413

(22) Filed: Sep. 30, 2022

Related U.S. Application Data

(60) Provisional application No. 63/370,094, filed on Aug. 1, 2022.

(51) Int. Cl.
  *G06F 11/00*    (2006.01)
  *G06F 11/08*    (2006.01)
  (Continued)

(52) U.S. Cl.
  CPC .......... *G06N 10/70* (2022.01); *G06F 11/08* (2013.01); *G06F 11/10* (2013.01);
  (Continued)

(58) Field of Classification Search
  CPC .......... G06F 11/1044; G06F 11/1068; G06F 11/16; G06F 11/0736; G06F 11/08; G06F 11/0787; G06F 11/1048; G06N 10/70
  See application file for complete search history.

(56) References Cited

U.S. PATENT DOCUMENTS

| | | | |
|---|---|---|---|
| 11,374,594 B2 * | 6/2022 | Hogaboam | G06N 3/065 |
| 2021/0303704 A1 | 9/2021 | Chen | |

(Continued)

OTHER PUBLICATIONS

S. Huang, M. Newman, and K. R. Brown, "Fault-tolerant weighted union-find decoding on the toric code," Phys. Rev. A 102, 012419 (2020 American Physical Society), pp. 1-6.

(Continued)

*Primary Examiner* — Charles Ehne
(74) *Attorney, Agent, or Firm* — Alexander A. Knapp; Kowert, Hood, Munyon, Rankin & Goetzel, P.C.

(57) ABSTRACT

Techniques for training local decoders for use in a local and global decoding scheme for quantum error correction of circuit-level noise within quantum surface codes such that the decoding schemes have fast decoding throughout and low latency times for quantum algorithms are disclosed. The local decoders may have a neural network architecture and may be trained using training data sets comprising simulated rounds of syndrome measurements for respective simulated quantum surface codes in addition to information such as syndrome differences, qubit placements, and temporal boundaries within the simulated rounds of syndrome measurements in order to train the local decoders for arbitrarily sized quantum surface codes and arbitrary numbers of rounds of syndrome measurements. Following a local decoding stage in which a large number of data errors have been corrected by a local decoder, error correction for remaining errors may continue with a more efficient global decoding stage.

20 Claims, 20 Drawing Sheets

(51) Int. Cl.

| | | |
|---|---|---|
| *G06F 11/10* | (2006.01) | |
| *G06N 3/04* | (2023.01) | |
| *G06N 10/20* | (2022.01) | |
| *G06N 10/70* | (2022.01) | |

(52) U.S. Cl.
CPC .......... *G06F 11/1044* (2013.01); *G06N 3/04* (2013.01); *G06N 10/20* (2022.01)

(56) References Cited

U.S. PATENT DOCUMENTS

| | | | | |
|---|---|---|---|---|
| 2021/0391873 | A1* | 12/2021 | Zheng | ................. G06F 11/1068 |
| 2022/0076829 | A1 | 3/2022 | Middlebrooks | |
| 2022/0414514 | A1* | 12/2022 | Korotkov | ............... G06N 10/70 |

OTHER PUBLICATIONS

A. G. Fowler, "Minimum weight perfect matching of fault-tolerant topological quantum error correction in average o(1) parallel time," Quantum Info. Comput. 15, 145-158 (retrieved from arXiv:1307.1740v3, pp. 1-8) (2015).

A. G. Fowler, A. C. Whiteside, and L. C. L. Hollenberg, "Towards practical classical processing for the surface code: Timing analysis," Phys. Rev. A 86, 042313 (2012), arXiv: 1202.5602v1, pp. 1-7.

P. Das, C. A. Pattison, S. Manne, D. M. Carmean, K. M. Svore, M. K. Qureshi, and N. Delfosse, "A scalable decoder microarchitecture for fault-tolerant quantum computing," CoRR abs/2001.06598 (2020), 2001.06598, arXiv:2001.06598v1, pp. 1-19.

C. Chamberland, G. Zhu, T. J. Yoder, J. B. Hertzberg, and A. W. Cross, "Topological and Subsystem Codes on Low-Degree Graphs with Flag Qubits," Phys. Rev. X 10, 011022, (Published by the American Physical Society 2020), pp. 1-19.

C. Chamberland, A. Kubica, T. J. Yoder, and G. Zhu, "Triangular color codes on trivalent graphs with flag qubits," New Journal of Physics 22, 023019, IOP Publishing (2020), pp. 1-24.

E. Knill, "Quantum computing with realistically noisy devices," Nature 434, 39 (2005), arXiv:quant-ph/0410199, pp. 1-47.

C. Chamberland, P. Iyer, and D. Poulin, "Fault-tolerant quantum computing in the Pauli or Clifford frame with slow error diagnostics," Quantum 2, 43 (2018),arXiv:1704.06662v2, pp. 1-11.

D. Litinski and F. v. Oppen, "Lattice Surgery with a Twist: Simplifying Clifford Gates of Surface Codes," Quantum 2, 62 (2018), pp. 1-16.

C. Chamberland and E. T. Campbell, "Circuit-level protocol and analysis for twist-based lattice surgery," Phys. Rev. Research 4, 023090 (Published by the American Physical Society 2022), pp. 1-11.

C. Gidney and A. G. Fowler, "Flexible layout of surface code computations using AutoCCZ states," arXiv e-prints arXiv:1905.08916, pp. 1-17.

S. Krinner, et al., "Realizing repeated quantum error correction in a distance-three surface code," Nature 605, 669-674 (2022), arXiv:2112.03708v1, pp. 1-28.

K. He, X. Zhang, S. Ren, and J. Sun, "Deep Residual Learning for Image Recognition," 2016 IEEE Conference on Computer Vision and Pattern Recognition (CVPR), pp. 770-778 (2016), arXiv:1512.03385v1.

D. Wu, Y. Wang, S.-T. Xia, J. Bailey, and X. Ma, "Skip Connections Matter: On the Transferability of Adversarial Examples Generated with ResNets," arXiv e-prints: arXiv:2002.05990 (2020), pp. 1-15.

F. Fahim, et al., "hls4ml: An open-source codesign workflow to empower scientific low-power machine learning devices," CoRR abs/2103.05579 (2021), 2103.05579, pp. 1-10.

Z. Liu, P. Chow, J. Xu, J. Jiang, Y. Dou, and J. Zhou, "AA Uniform Architecture Design for Accelerating 2D and 3D CNNs on FPGAs," Electronics 8, 10.3390/electronics8010065, (2019), pp. 1-19.

T. Geng, T. Wang, C. Wu, C. Yang, S. L. Song, A. Li, and M. Herbordt, "LP-BNN: Ultra-low-Latency BNN Inference with Layer Parallelism, "Proceedings of the International Conference on Application-Specific Systems, Architectures and Processors 2019—(Jul. 9, 2019), pp. 1-8.

O. Higgott, "PyMatching: A Python package for decoding quantum codes with minimum-weight perfect matching," arXiv e-prints , arXiv:2105.13082 (2021), pp. 1-15.

M. Edwards and X. Xie, "Graph Based Convolutional Neural Network," , arXiv:1609.08965 (2016), pp. 1-11.

C. Vuillot, L. Lao, B. Criger, C. G. Almud'ever, K. Bertels, and B. M. Terhal, "Code deformation and lattice surgery are gauge fixing," New J. Phys. 21, 033028 IOP Instute of Physics, (2019), pp. 1-21.

Christopher Chamberland, et al., "Techniques for combining fast local decoders with global decoders under circuit-level noise," pp. 1-28.

U.S. Appl. No. 17/937,411, filed Sep. 30, 2022, Christopher Chamberland et al.

U.S. Appl. No. 17/937,416, filed Sep. 30, 2022, Christopher Chamberland et al.

P. W. Shor, "Polynomial-time algorithms for prime factorization and discrete logarithms on a quantum computer," In Proceedings of the 35th Annual Symposium on Foundations of Computer Science, Santa Fe, NM (1994), https://arxiv.org/abs/quant-ph/9508027v2, pp. 1-28.

L. K. Grover, "Rapid sampling though quantum computing," in Proceedings of the 28th Annual ACM Symposium on the Theory of Computation (ACM, New York, 1996) p. 212-219; retrieved from arXiv:quant-ph/9912001 v2, 2000, pp. 1-9.

L. K. Grover, "Quantum mechanics helps in searching for a needle in a haystack," Phys. Rev. Lett. 79, 325 (1997), pp. 1-4.

P. W. Shor, "Fault-tolerant quantum computation," in Proceedings of the 37th Annual Symposium on Foundations of Computer Science (IEEE, 1996) pp. 56-65 (retrieved copy from quant-ph/9605011 v2 Mar. 4, 1997, pp. 1-11).

C. Chamberland, T. Jochym-O'Connor, and R. Laflamme, "Thresholds for universal concatenated quantum codes," Phys. Rev. Lett. 117, 010501 (2016) (retrieved from arXiv:1603.02704v1 [quant-ph] Mar. 8, 2016, pp. 1-10).

C. Chamberland, T. Jochym-O'Connor, and R. Laflamme, "Overhead analysis of universal concatenated quantum codes," Phys. Rev. A 95, 022313 (2017) (retrieved from arXiv:1609.07497v3 [quant-ph] Jun. 17, 2017, pp. 1-25).

A. G. Fowler, M. Mariantoni, J. M. Martinis, and A. N. Cleland, "Surface codes: Towards practical large-scale quantum computation," Phys. Rev. A 86, 032324, © 2012 American Physical Society, pp. 1-48, (2012).

A. Paetznick and B. W. Reichardt, "Universal faul-ttolerant quantum computation with only transversal gates and error correction," Physical review letters 111, 090505, copyright 2013 American Physical Society, pp. 1-5.

J. T. Anderson, G. Duclos-Cianci, and D. Poulin, "Fault-Tolerant Conversion between the Steane and Reed-Muller Quantum Codes", Phys. Rev. Lett. 113, 080501 copyright 2014 American Physical Society, pp. 1-7.

T. J. Yoder, R. Takagi, and I. L. Chuang, "Universal Fault-Tolerant Gates on Concatenated Stabilizer Codes," Phys. Rev. X 6, 031039 (2016), Published by the American Physical Society, pp. 1-23.

A. G. Fowler and C. Gidney, "Low overhead quantum computation using lattice surgery", arXiv preprint arXiv:1808.06709 (2018), pp. 1-15.

D. Litinski, A Game of Surface Codes: Large-Scale Quantum Computing with Lattice Surgery, Quantum vol. 3, (2019), arXiv:1808.02892v3, pp. 1-37.

D. Litinski, "Magic State Distillation: Not as Costly as You Think", Quantum 3, 205 (2019), arXiv:1905.06903v3, pp. 1-22.

C. Chamberland and K. Noh, "Very low overhead fault-tolerant magic state preparation using redundant ancilla encoding and flag qubits," npj Quantum Information 6, 91 (2020), pp. 1-12.

C. Chamberland, K. Noh, P. Arrangoiz-Arriola, E. T. Campbell, C. T. Hann, J. Iverson, H. Putterman, T. C. Bohdanowicz, S. T. Flammia, A. Keller, G. Refael, J. Preskill, L. Jiang, A. H. Safavi-Naeini, O. Painter, and F. G. Brand"ao, "Building a Fault-Tolerant Quantum Computer Using Concatenated Cat Codes," PRX Quantum 3, 010329 (2022), pp. 1-117.

(56) References Cited

OTHER PUBLICATIONS

C. Chamberland and E. T. Campbell, "Universal Quantum Computing with Twist-Free and Temporally Encoded Lattice Surgery," Published by the American Physical Society, PRX Quantum 3, 010331 (2022), pp. 1-25.
D. Gottesman, "A Theory of fault-tolerant quantum computation," Phys. Rev. A 57, 127 (1998) (retrieved from arXiv:quant-ph/9702029 v2 Feb. 18, 1997), pp. 1-30.
B. M. Terhal, "Quantum Error Correction for Quantum Memories," Rev. Mod. Phys. 87, 307 (2015), (retrieved from arXiv:1302.3428v7 [quant-ph] Apr. 10, 2015), pp. 1-47.
J. Harrington, "Analysis of Quantum Error-Correcting Codes: Symplectic Lattice Codes and Toric Codes," California Institute of Technology Pasadena, California, (2004), pp. 1-210.
N. P. Breuckmann, K. Duivenvoorden, D. Michels, and B. M. Terhal, "Local Decoders for the 2D and 4D Toric Code," Quantum Information and Computation 17, 0181, (2017) (retrieved from arXiv:1609.00510v2 [quant-ph] Sep. 19, 2016), pp. 1-28.
M. Herold, M. J. Kastoryano, E. T. Campbell, and J. Eisert, "Cellular automaton decoders of topological quantum memories in the fault tolerant setting," New Journal of Physics 19, 063012 (2017), pp. 1-11.
A. Kubica and J. Preskill, "Cellular-Automaton Decoders with Provable Thresholds for Topological Codes," Phys. Rev. Lett. 123, 020501 (2019) (retrieved from arXiv:1809.10145v1 [quant-ph] Sep. 26, 2018), pp. 1-13.
M. Vasmer, D. E. Browne, and A. Kubica, "Cellular automaton decoders for topological quantum codes with noisy measurements and beyond," Scientific Reports 11, 2027, naturereasearch (2021), pp. 1-14.
G. Duclos-Cianci and D. Poulin, "Fast Decoders for Topological Quantum Codes," Phys. Rev. Lett. 104, 050504(2010), (retrieved from arXiv:0911.0581v2 [quant-ph] Feb. 5, 2010), pp. 1-5.
G. Duclos-Cianci and D. Poulin, "Fault-Tolerant Renormalization Group Decoder for Abelian Topological Codes," Quantum Information Computation 14, 721-740 (2014) (retrieved fro arXiv:1304.6100v1 [quant-ph] Apr. 22, 2013), pp. 1-11.
N. Delfosse and N. H. Nickerson, "Almost-linear time decoding algorithm for topological codes," Quantum 5, 595 (2021), (retrieved from arXiv:1709.06218v3 [quant-ph] Nov. 24, 2021) pp. 1-12.
N. Delfosse, "Hierarchical decoding to reduce hardware requirements for quantum computing," arXiv e-prints , arXiv:2001.11427 (2020), pp. 1-8.
G. Torlai and R. G. Melko, "Neural Decoder for Topological Codes," Chorus (Aps Physics), Phys. Rev. Lett. 119, 030501 (2017), pp. 1-6.
S. Krastanov and L. Jiang, "Deep Neural Network Probabilistic Decoder for Stabilizer Codes," Scientific Reports 7, 11003 (2017), pp. 1-7.
S. Varsamopoulos, B. Criger, and K. Bertels, "Decoding small surface codes with feedforward neural networks," Quantum Science and Technology v3, 015004 (2017 IOP Publishing Ltd.), pp. 1-13.
P. Baireuther, T. E. O'Brien, B. Tarasinski, and C. W. J. Beenakker, "Machine-learning-assisted correction of correlated qubit errors in a topological code," Quantum 2, 48 (2018), arXiv:1705.07855v3, pp. 1-10.
N. P. Breuckmann and X. Ni, "Scalable Neural Network Decoders for Higher Dimensional Quantum Codes,", Quantum V2, 68, arXiv:1710.09489v3, 2018, pp. 1-24.

C. Chamberland and P. Ronagh, "Deep neural decoders for near term fault-tolerant experiments," Quantum Science and Technology v3, 044002 (2018 IOP Publishing Ltd), arXiv:1802.06441v1, pp. 1-26.
R. Sweke, M. S. Kesselring, E. P. L. van Nieuwenburg, and J. Eisert, "Reinforcement learning decoders for fault-tolerant quantum computation," Machine Learning: Science and Technology 2, 025005 (2020), pp. 1-20.
S. Varsamopoulos, K. Bertels, and C. G. Almudever, "Decoding surface code with a distributed neural network-based decoder," Quantum Machine Intelligence 2, (Springer 2020), pp. 1-12.
P. Andreasson, J. Johansson, S. Liljestrand, and M. Granath, "Quantum error correction for the toric code using deep reinforcement learning," Quantum 3, 183 (2019), arXiv:1811.12338v3, pp. 1-12.
T. Wagner, H. Kampermann, and D. Bruß, "Symmetries for a high-level neural decoder on the toric code," Phys. Rev. A 102, 042411 (2020), arXiv:1910.01662v3, pp. 1-13.
S. Varsamopoulos, K. Bertels, and C. G. Almudever, "Comparing Neural Network Based Decoders for the Surface Code," IEEE Transactions on Computers 69, 300 (2020), arXiv:1811.12456v3, pp. 1-18.
D. Fitzek, M. Eliasson, A. F. Kockum, and M. Granath, "Deep q-learning decoder for depolarizing noise on the toric code," Phys. Rev. Research 2, 023230 (2020), arXiv:1912.12919v1, pp. 1-18.
M. Sheth, S. Z. Jafarzadeh, and V. Gheorghiu, "Neural ensemble decoding for topological quantum error-correcting codes," Phys. Rev. A 101, 032338 (2020), arXiv:1905.02345v2, pp. 1-9.
X. Ni, "Neural Network Decoders for Large-Distance 2D Toric Codes," Quantum v4, (2020), arXiv:1809.06640v3, pp. 1-11.
L. Domingo Colomer, M. Skotiniotis, and R. Munoz-Tapia, "Reinforcement learning for optimal error correction of toric codes," ScienceDirect, Physics Letters A v384, issued 17, (2020), arXiv:1911.02308v2, pp. 1-10.
K. Meinerz, C.-Y. Park, and S. Trebst, "Scalable Neural Decoder for Topological Surface Codes," Phys. Rev. Lett. 128, 080505 (2022 American Physical Society), pp. 1-6.
S. Gicev, L. C. L. Hollenberg, and M. Usman, "A scalable and fast artificial neural network syndrome decoder for surface codes," arXiv e-prints , arXiv:2110.05854, pp. 1-60.
Y. Tomita and K. M. Svore, "Low-distance surface codes under realistic quantum noise," Phys. Rev. A 90, 062320 (2014), arXiv:1404.3747v1, pp. 1-14.
J. Edmonds, "Paths, Trees, and Flowers," Canadian Journal of mathematics 17, pp. 449-467 (1965).
A. Y. Kitaev, "Fault-tolerant quantum computation by anyons," ScienceDirect, Elsevier, Annals of Physics v. 303, issue 2 (2003),pp. 2-30.
E. Dennis, A. Kitaev, A. Landahl, and J. Preskill, "Topological quantum memory", Journal of Mathematical Physics 43, 4452 (2002), arXiv preprint: arXIV:quant-ph/0110143v1, pp. 1-39.
A. R. Calderbank and P. W. Shor, "Good quantum error-correcting codes exist," Phys. Rev. A, vol. 54, No. 2, pp. 1098-1105 (1996).
A. Steane, "Multiple particle interference and quantum error correction," Proc.Roy.Soc.Lond. A 452, pp. 2551-2577 (1996 The Royal Society).
Heim, et al., "Optimal Circuit-Level Decoding for Surface Codes," arXiv:1609.06373v1, Sep. 2016, pp. 1-5.

\* cited by examiner

```
┌─────────────────────────────────────────────────────────────────┐
│ Perform error correction that accounts for circuit-level noise  │
│ in rounds of syndrome measurements of a surface code, wherein   │
│ the results of the syndrome measurements form a measurement     │
│ results volume bounded by the dimensions of the surface code    │
│           and number of rounds of syndrome measurements         │
│                              100                                │
│                                                                 │
│      ┌──────────────────────────────────────────────────┐       │
│      │ Decode, in a first decoding step, the measurement│       │
│      │  results volume via a local neural network       │       │
│      │  decoder that incrementally decodes a first set  │       │
│      │  of detected syndrome differences in the         │       │
│      │             measurement results volume           │       │
│      │                      102                         │       │
│      └──────────────────────────────────────────────────┘       │
│                              │                                  │
│                              ▼                                  │
│      ┌──────────────────────────────────────────────────┐       │
│      │  Treat vertical pairs of highlighted vertices in │       │
│      │  the decoded measurement results volume to       │       │
│      │  reduce the syndrome density of the decoded      │       │
│      │             measurement results volume           │       │
│      │                      104                         │       │
│      └──────────────────────────────────────────────────┘       │
│                              │                                  │
│                              ▼                                  │
│      ┌──────────────────────────────────────────────────┐       │
│      │ Decode, in a second decoding step, the decoded   │       │
│      │ measurement results volume via a global decoder  │       │
│      │ that decodes a second set of detected syndrome   │       │
│      │ differences in the decoded measurement results   │       │
│      │                      volume                      │       │
│      │                       106                        │       │
│      └──────────────────────────────────────────────────┘       │
└─────────────────────────────────────────────────────────────────┘
                                │
                                ▼
         ┌────────────────────────────────────────────┐
         │      Provide results of the error correction│
         │                     108                     │
         └────────────────────────────────────────────┘
```

*FIG. 1*

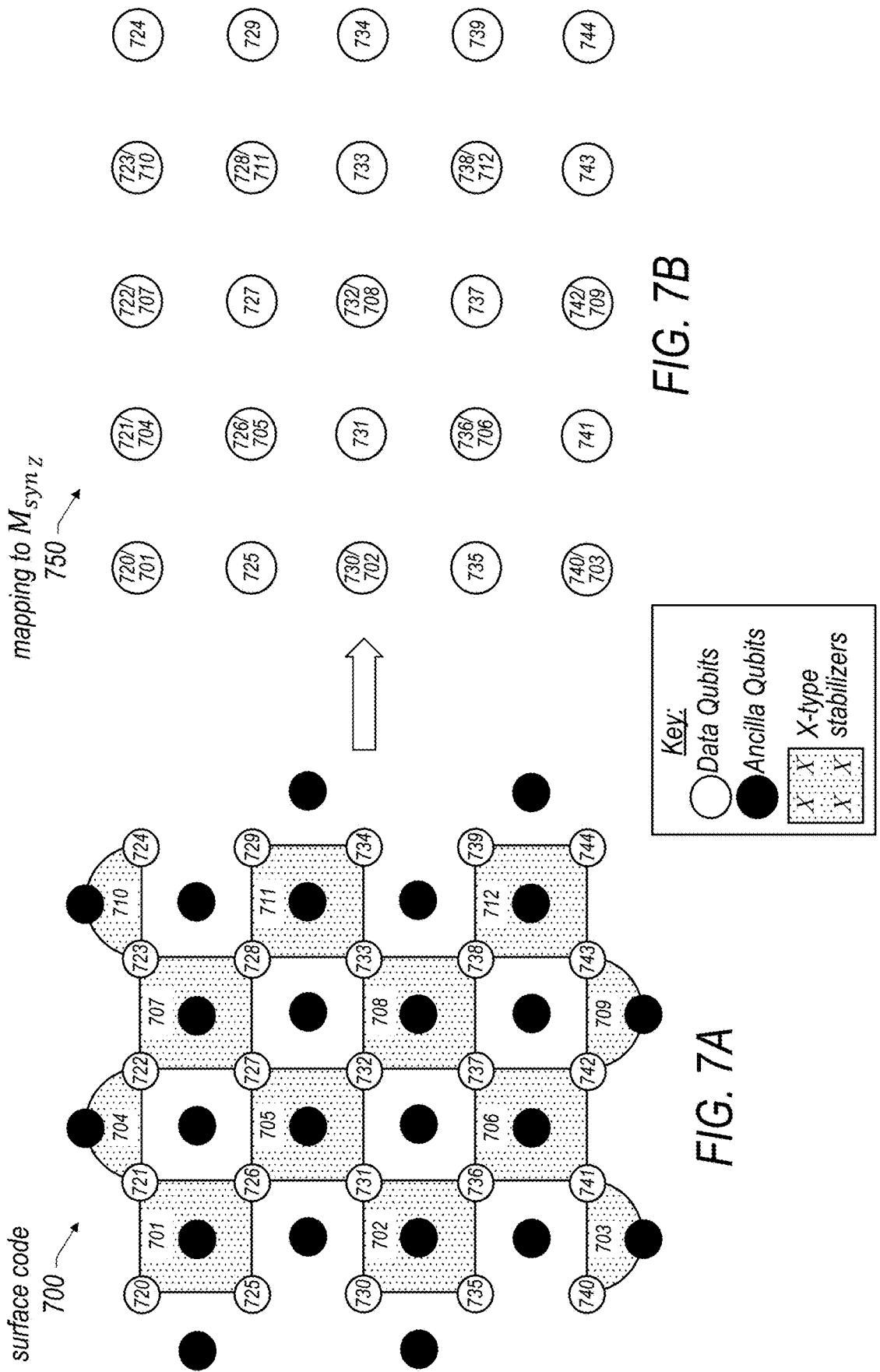

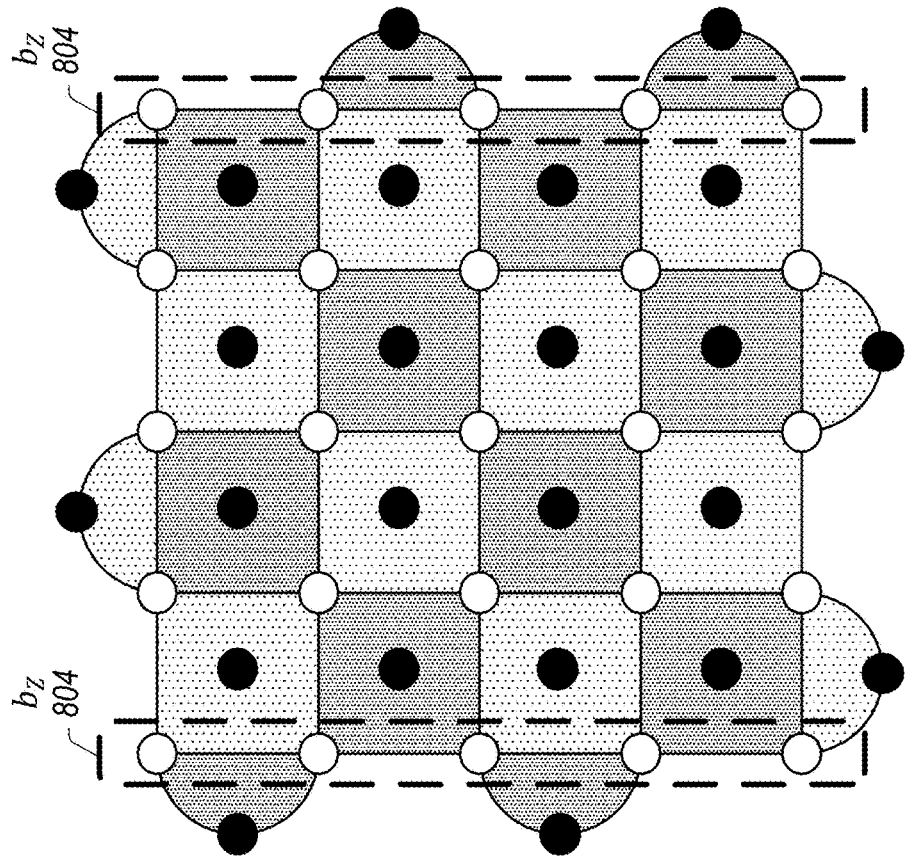
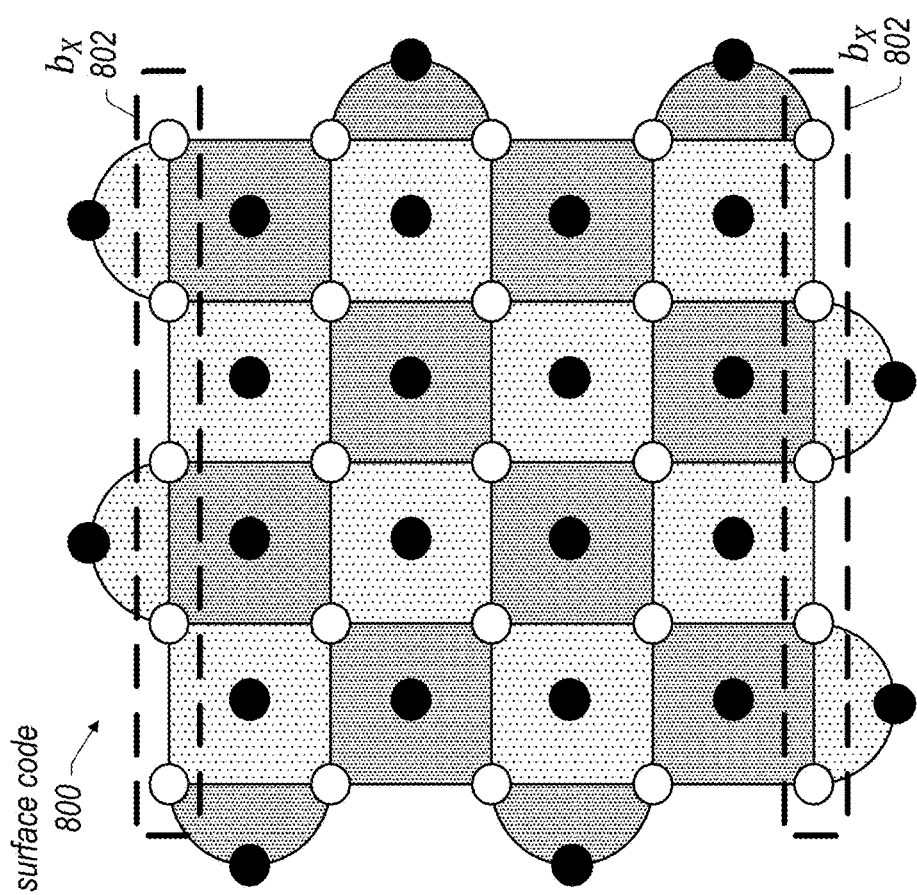
FIG. 8B
FIG. 8A

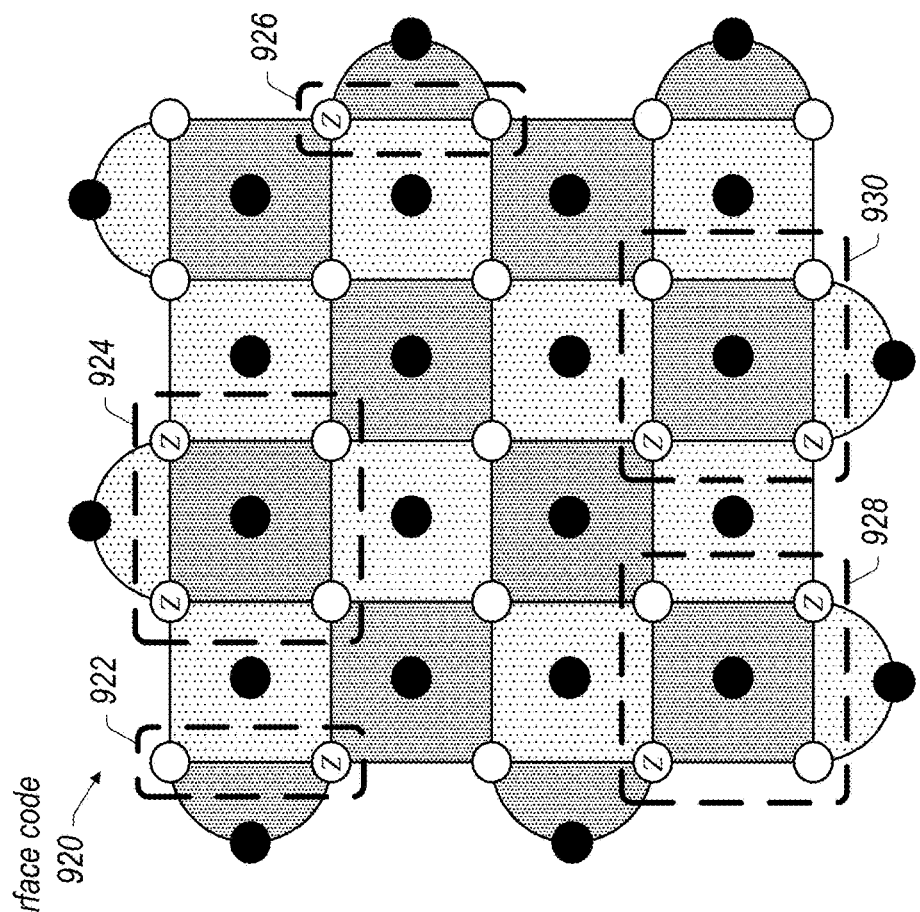
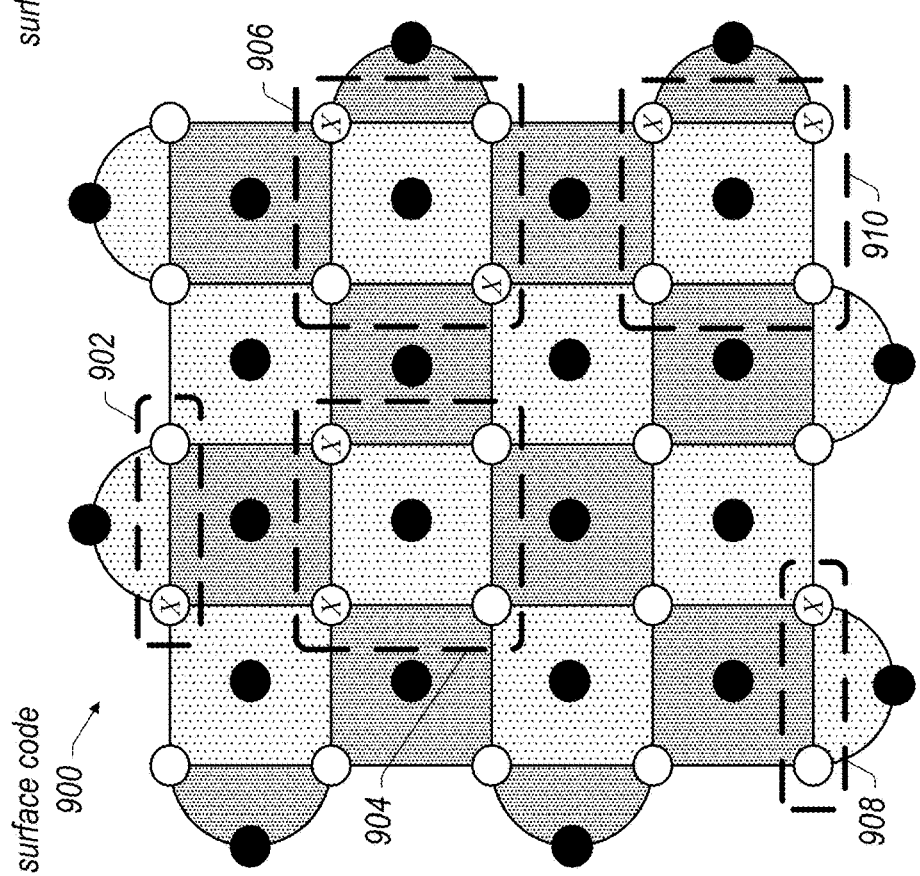
FIG. 9A
FIG. 9B

```
┌─────────────────────────────────────────────────────────────────┐
│ Train, via a supervised learning technique, a local decoder to  │
│ be used to perform error correction for quantum surface codes   │
│                           1000                                  │
│                                                                 │
│  ┌───────────────────────────────────────────────────────────┐  │
│  │ Determine a neural network architecture for the local     │  │
│  │ decoder such that the architecture accounts for           │  │
│  │ circuit-level noise during error correction               │  │
│  │                        1002                               │  │
│  └───────────────────────────────────────────────────────────┘  │
│                              │                                  │
│                              ▼                                  │
│  ┌───────────────────────────────────────────────────────────┐  │
│  │ Provide a training data set, wherein the training data    │  │
│  │ set includes training examples of simulated rounds of     │  │
│  │ syndrome measurements, syndrome difference information    │  │
│  │ for the rounds, location information about qubit          │  │
│  │ placement within the measurement results volume and their │  │
│  │ reference to the boundaries of the given quantum surface  │  │
│  │ code, and temporal boundaries information                 │  │
│  │                        1004                               │  │
│  └───────────────────────────────────────────────────────────┘  │
│                              │                                  │
│                              ▼                                  │
│  ┌───────────────────────────────────────────────────────────┐  │
│  │ Determine predictions of locations of alleged errors on   │  │
│  │ data qubits within the training data set                  │  │
│  │                        1006                               │  │
│  └───────────────────────────────────────────────────────────┘  │
│                              │                                  │
│                              ▼                                  │
│  ┌───────────────────────────────────────────────────────────┐  │
│  │ Compare the predictions to ground truth information       │  │
│  │ (e.g., actual locations of errors on data qubits within   │  │
│  │ the training data set)                                    │  │
│  │                        1008                               │  │
│  └───────────────────────────────────────────────────────────┘  │
│                              │                                  │
│                              ▼                                  │
│  ┌───────────────────────────────────────────────────────────┐  │
│  │          Provide the trained local decoder                │  │
│  │                        1010                               │  │
│  └───────────────────────────────────────────────────────────┘  │
└─────────────────────────────────────────────────────────────────┘
```

FIG. 10

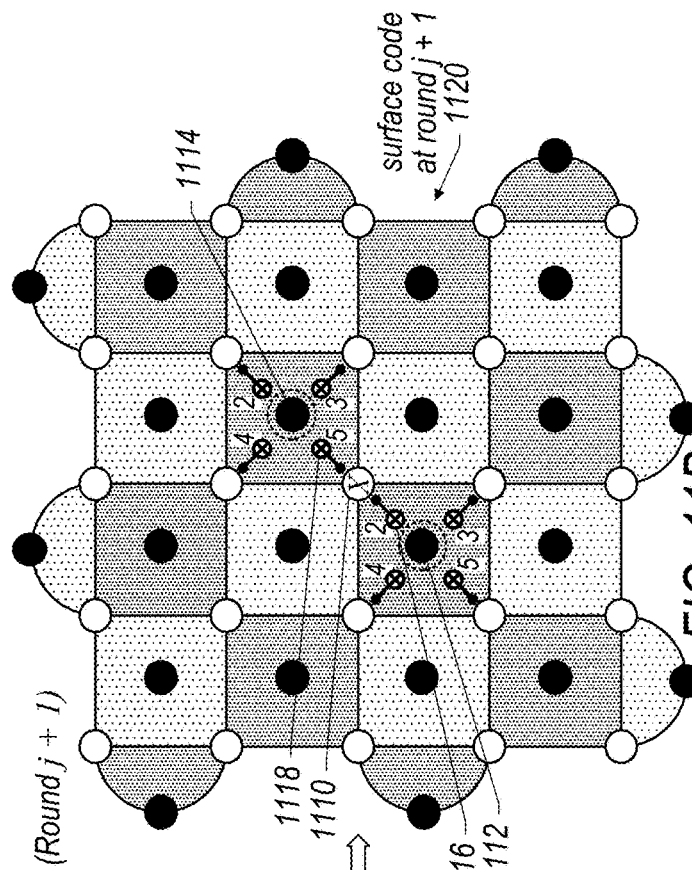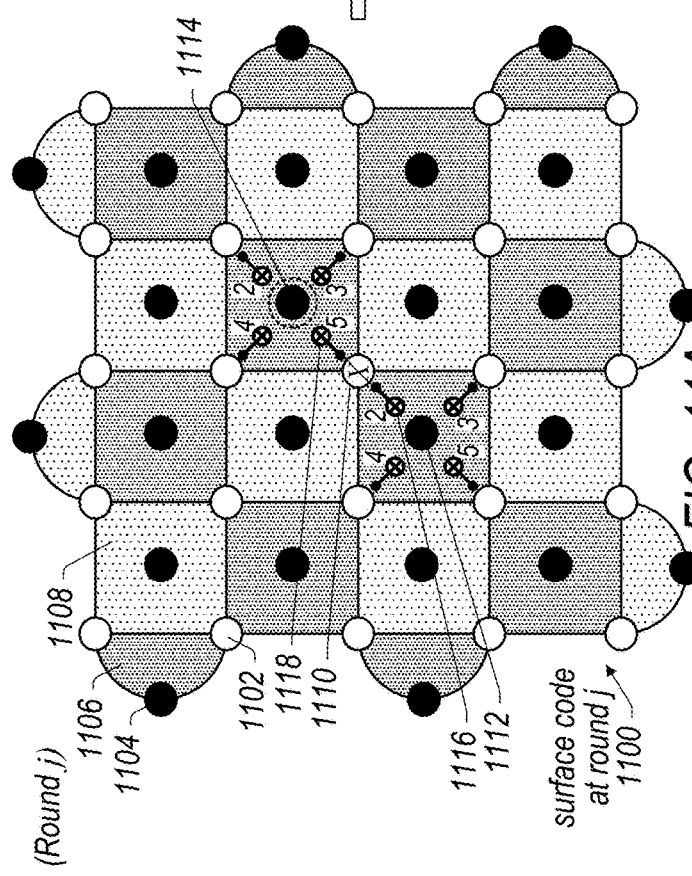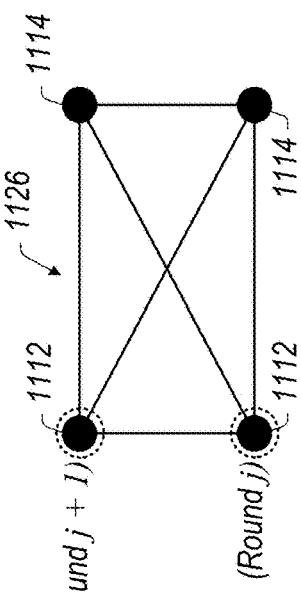

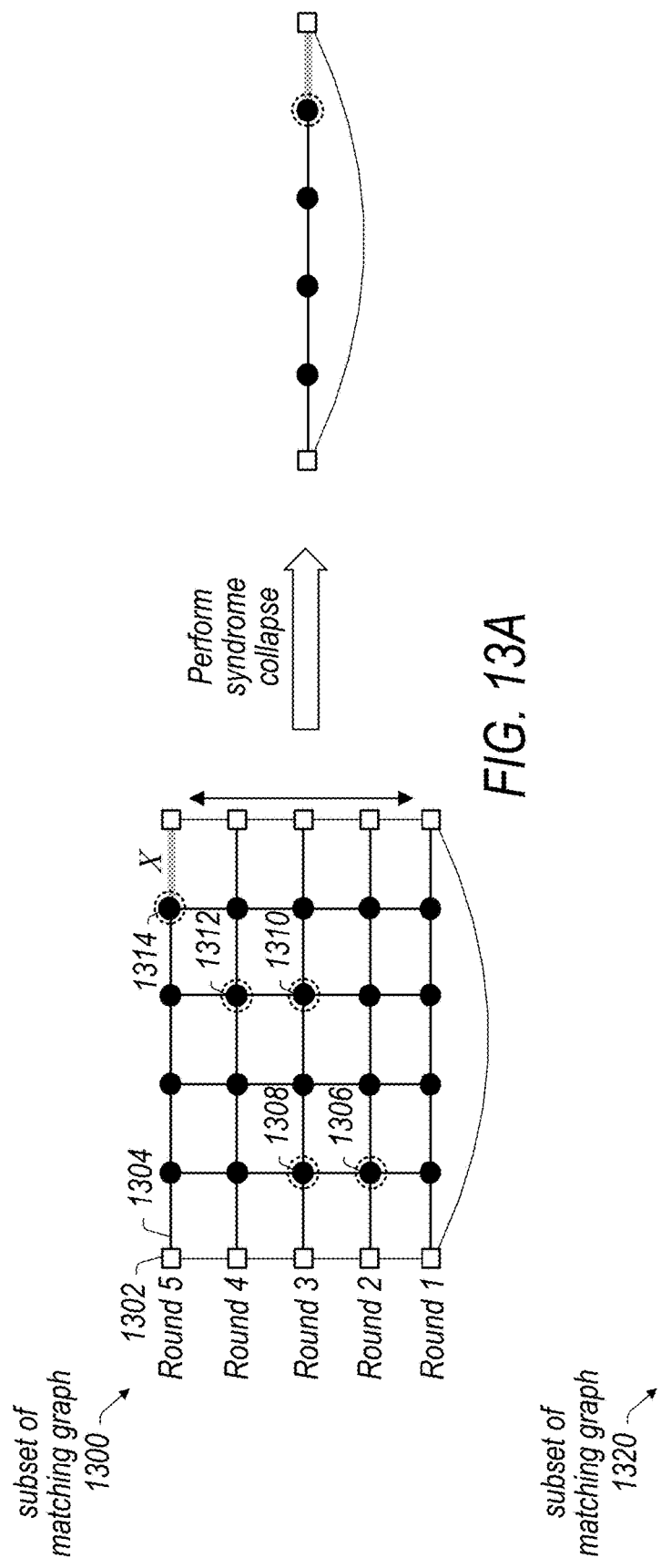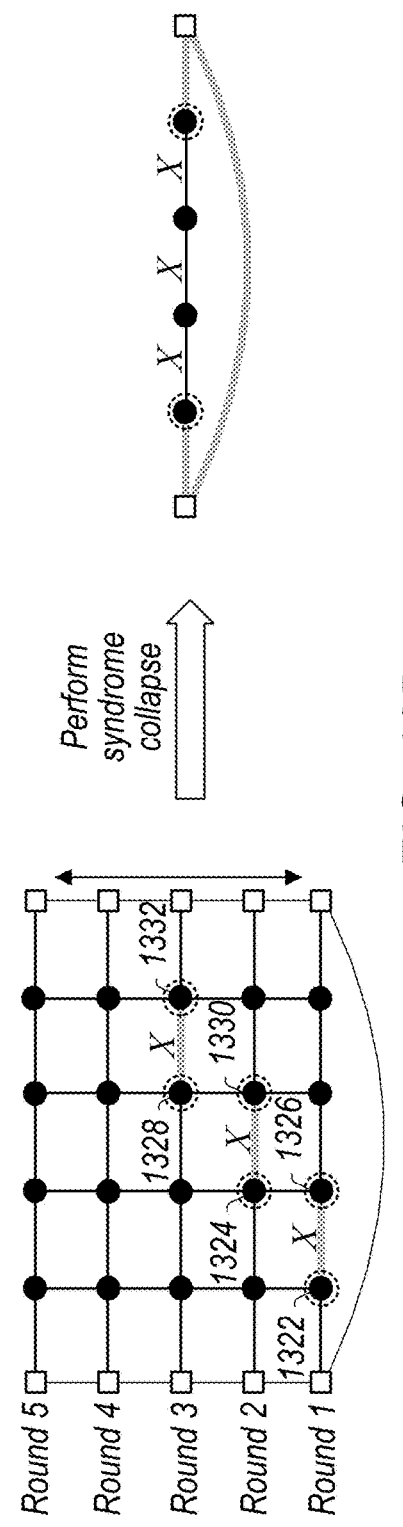
FIG. 13A
FIG. 13B

TRAINING NEURAL NETWORK LOCAL DECODERS FOR CIRCUIT-LEVEL QUANTUM ERROR CORRECTION

RELATED APPLICATION

This application claims benefit of priority to U.S. Provisional Application Ser. No. 63/370,094, entitled "Techniques for Combining Fast Local Decoders with Global Decoders under Circuit-level Noise," filed Aug. 1, 2022, and which is incorporated herein by reference in its entirety.

BACKGROUND

Quantum computing utilizes the laws of quantum physics to process information. Quantum physics is a theory that describes the behavior of reality at the fundamental level. It is currently the only physical theory that is capable of consistently predicting the behavior of microscopic quantum objects like photons, molecules, atoms, and electrons.

A quantum computer is a device that utilizes quantum mechanics to allow one to write, store, process and read out information encoded in quantum states, e.g., the states of quantum objects. A quantum object is a physical object that behaves according to the laws of quantum physics. The state of a physical object is a description of the object at a given time.

In quantum mechanics, the state of a two-level quantum system, or simply a qubit, is a list of two complex numbers whose squares sum up to one. Each of the two numbers is called an amplitude, or quasi-probability. The square of an amplitude gives a potentially negative probability. Hence, each of the two numbers correspond to the square root that event zero and event one will happen, respectively. A fundamental and counterintuitive difference between a probabilistic bit (e.g., a traditional zero or one bit) and the qubit is that a probabilistic bit represents a lack of information about a two-level classical system, while a qubit contains maximal information about a two-level quantum system.

Quantum computers are based on such quantum bits (qubits), which may experience the phenomena of "superposition" and "entanglement." Superposition allows a quantum system to be in multiple states at the same time. For example, whereas a classical computer is based on bits that are either zero or one, a qubit may be both zero and one at the same time, with different probabilities assigned to zero and one. Entanglement is a strong correlation between quantum particles, such that the quantum particles are inextricably linked in unison even if separated by great distances.

A quantum algorithm is a reversible transformation acting on qubits in a desired and controlled way, followed by a measurement on one or multiple qubits. For example, if a system has two qubits, a transformation may modify four numbers; with three qubits this becomes eight numbers, and so on. As such, a quantum algorithm acts on a list of numbers exponentially large as dictated by the number of qubits. To implement a transform, the transform may be decomposed into small operations acting on a single qubit, or a set of qubits, as an example. Such small operations may be called quantum gates and the arrangement of the gates to implement a transformation may form a quantum circuit.

There are different types of qubits that may be used in quantum computers, each having different advantages and disadvantages. For example, some quantum computers may include qubits built from superconductors, trapped ions, semiconductors, photonics, etc. Each may experience different levels of interference, errors and decoherence. Also, some may be more useful for generating particular types of quantum circuits or quantum algorithms, while others may be more useful for generating other types of quantum circuits or quantum algorithms.

For some types of quantum computations, such as fault tolerant computation of large-scale quantum algorithms, overhead costs for performing such quantum computations may be high. For example, for types of quantum gates that are not naturally fault tolerant, the quantum gates may be encoded in error correcting code, such as a surface code. However, this may add to the overhead number of qubits required to implement the large-scale quantum algorithms. Also, performing successive quantum gates, measurement of quantum circuits, etc. may introduce probabilities of errors in the quantum circuits and/or measured results of the quantum circuits. In some situations, error rates for a quantum algorithm may be reduced by increasing a number of times measurements are repeated when executing the quantum algorithm. However, this may increase a run-time for executing the quantum algorithm. Thus, overhead may be evaluated as a space-time cost that takes into account both run-times and qubit costs to achieve results having at least a threshold level of certainty (e.g., probability of error less than a threshold amount).

BRIEF DESCRIPTION OF THE DRAWINGS

FIG. 1 is a flow diagram illustrating a process of performing error correction for syndrome measurement results of a surface code, wherein the decoding process involves decoding via local and global decoders, according to some embodiments.

FIGS. 7A and 7B illustrate X-type stabilizers of a surface code, shown in FIG. 7A, that may be mapped to a matrix representation of Z-type error syndromes (e.g., matrix $M_{syn_z}$), shown in FIG. 7B, according to some embodiments.

FIG. 8A illustrates the placements of boundary qubits for X-type stabilizers for a given surface code, according to some embodiments.

FIG. 8B illustrates the placements of boundary qubits for Z-type stabilizers for a given surface code, according to some embodiments.

FIGS. 9A and 9B illustrate a homological equivalence convention used for X-type errors, as shown in FIG. 9A, and for Z-type errors, as shown in FIG. 9B, according to some embodiments.

FIG. 10 is a flow diagram illustrating a process of training a local neural network decoder to be used to perform error correction for a surface code, according to some embodiments.

FIG. 11A illustrates a hypothetical example of having a failure of a CNOT gate during a given round j of syndrome measurements for the surface code shown in the figure, according to some embodiments.

FIG. 11B illustrates the propagation of the CNOT gate failure, introduced in FIG. 11A, into round j+1 of the syndrome measurements for the surface code, according to some embodiments.

FIG. 11C illustrates a subset of a matching graph corresponding to the surface code shown in FIG. 11A following round j of the syndrome measurements, according to some embodiments.

FIG. 11D illustrates the subset of the matching graph following round j+1 of the syndrome measurements, according to some embodiments.

FIG. 11E illustrates the subset of the matching graph following an error correction made by a local decoder, resulting in the creation of a vertical pair of highlighted vertices, according to some embodiments.

FIG. 13A illustrates a subset of a matching graph following an error correction made by a local decoder to which syndrome collapse is applied in order to treat vertical pairs of highlighted vertices that were created, at least in part, due to the error correction made by the local decoder, according to some embodiments.

FIG. 13B illustrates a subset of a matching graph that has not been subjected to error correction made by a local decoder prior to the use of syndrome collapse to treat vertical pairs of highlighted vertices, resulting in a logical X-type error after the syndrome collapse is performed, according to some embodiments.

Figure 2:
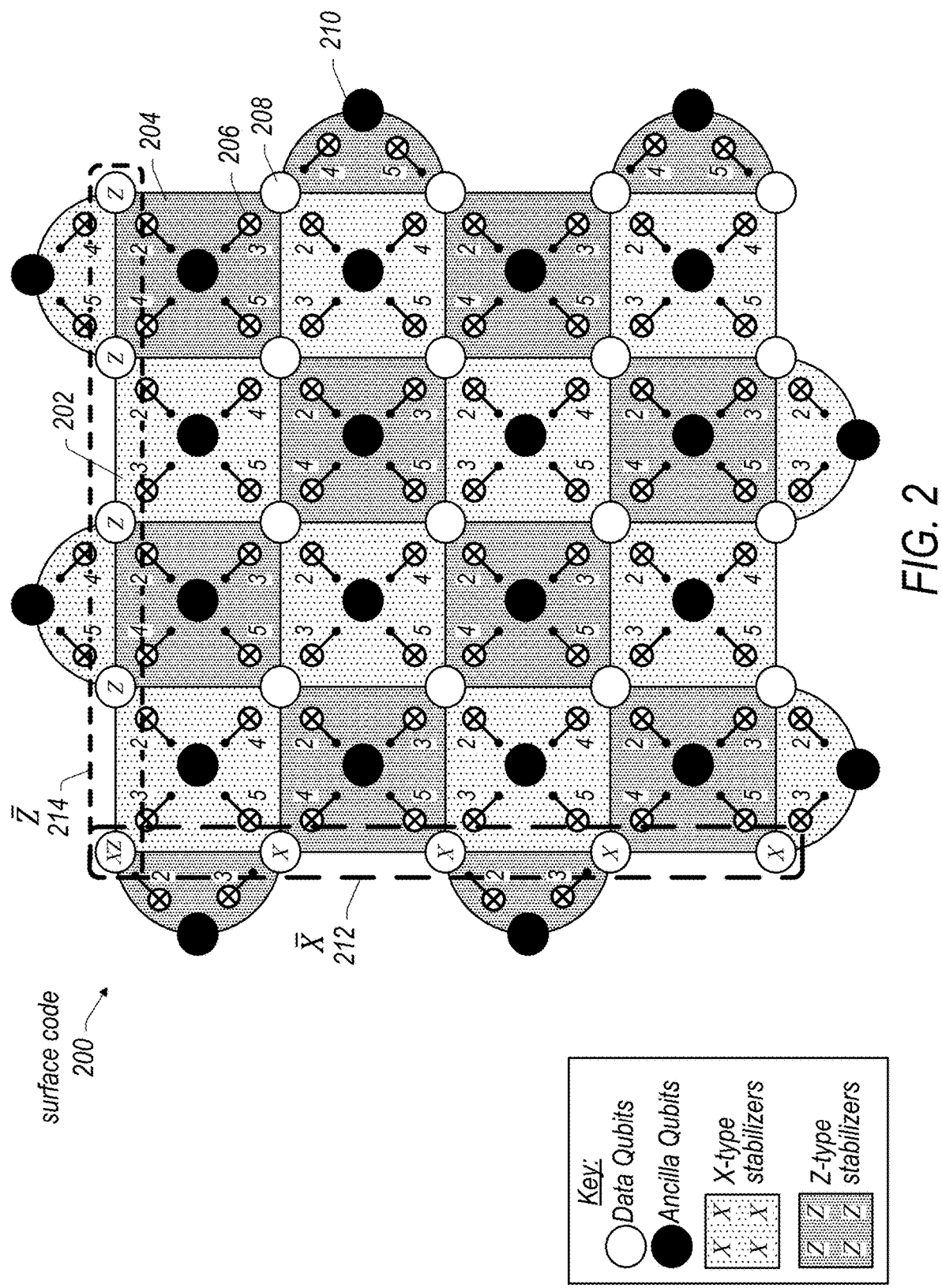
FIG. 2 illustrates an example of a surface code used to encode logical qubits using a set of physical data qubits, according to some embodiments.

While embodiments are described herein by way of example for several embodiments and illustrative drawings, those skilled in the art will recognize that embodiments are not limited to the embodiments or drawings described. It should be understood, that the drawings and detailed description thereto are not intended to limit embodiments to the particular form disclosed, but on the contrary, the intention is to cover all modifications, equivalents and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to. When used in the claims, the term "or" is used as an inclusive or and not as an exclusive or. For example, the phrase "at least one of x, y, or z" means any one of x, y, and z, as well as any combination thereof.

DETAILED DESCRIPTION

Various embodiments of methods and apparatus for performing error correction for rounds of syndrome measurements of a surface code, wherein the rounds of syndrome measurements may form a three-dimensional measurement results volume (e.g., a "surface code volume") using local and global decoding stages such that the error correction accounts for circuit-level noise are described. A person having ordinary skill in the art should understand that circuit-level noise may be defined as an ability to treat error-types such as at least errors pertaining to single and/or multi-qubit gates between qubits of a quantum surface code, measurement errors pertaining to rounds of syndrome measurements, errors pertaining to ancilla qubit reset timesteps in respective rounds of syndrome measurements, errors pertaining to idling of qubits of a quantum surface code, etc. In addition, circuit-level noise may encompass treatment of crosstalk errors (e.g., spatial and/or temporal crosstalk errors), and/or errors caused by leakage outside of a code space for a given qubit.

A neural network architecture may be implemented as a local decoder, and may be trained such that the local decoder may detect error patterns within a given measurement results volume and treat errors up to a given sized error pattern. As this local decoding procedure may cause vertical pairs of highlighted vertices (e.g., pairs of syndrome differences that are temporally (e.g., "vertically") separated by one round of syndrome measurements within a given measurement results volume) to be formed, the present written description also relates to methods and techniques for treating said vertical pairs, namely via syndrome collapse and/or vertical cleanup techniques. Treating vertical pairs may reduce a syndrome density in the measurement results volume prior to a global decoding stage, such that the methods and techniques described herein provide both fast decoding throughput and latency times, and efficient error correction for quantum surface codes.

In some embodiments, quantum computers have the potential to implement families of algorithms with significant speedups relative to classical computers. One of the main challenges in building a quantum computer, however, is in mitigating the effects of noise, which may introduce errors during a computation, therefore corrupting the results. Since the successful implementation of quantum algorithms require that qubits, gates and measurements fail with low probabilities, additional methods are required for detecting and correcting errors when they occur. Universal fault-tolerant quantum computers are one such strategy, wherein the low desired failure rates come at the cost of substantial extra qubit and gate overhead requirements.

In some embodiments, stabilizer-based error correction may be defined as the encoding of logical qubits using a set of physical data qubits. The qubits may be encoded in a state which is a +1 eigenstate of all operators in a stabilizer group (e.g., an Abelian group of Pauli operators). Measuring operators in the stabilizer group, known as a syndrome measurement, may provide information on the possible errors afflicting the data qubits. The results of the syndrome measurements may then be fed to a classical decoding algorithm whose goal is to determine the most likely errors afflicting the data qubits. Improving the performance of error correcting codes and fault-tolerant quantum computing architectures in order to reduce the large overhead requirements arising from error correction, however, remains a challenge, along with determining classical decoding algorithms which operate on the very fast time scales required to avoid exponential backlogs during the implementation of a given quantum algorithm.

In the past, some decoders have been proposed to attempt to meet the speed requirements imposed by quantum algorithms: Decoders such as cellular automata and renormalization group decoders are based on simple local update rules and have the potential of achieving fast runtimes when using distributed hardware resources. However, such decoders do not demonstrate the low logical failure rates imposed by algorithms in the circuit-level noise setting. Similarly, linear-time decoders, such as Union Find (UF) and a hierarchical implementation of Union Find with local update rules, have been proposed for complex decoding algorithms. However, the hierarchical implementation of Union Find with local update rules has not been shown to achieve the small throughput times required to run quantum algorithms in the circuit-level noise regime.

The present written description overcomes these challenges through at least the use of neural network decoders. For neural network decoders to be a viable candidate in universal fault-tolerant quantum computing, they must be fast, scalable, and exhibit competitive performance in the presence of circuit-level noise. In some embodiments, a scalable neural network decoder, based on fully three-dimensional convolutions, may be used to treat circuit-level noise for rotated surface codes. Such a scalable neural network decoder may be implemented as a local decoder, which may then be applied to regions of the spacetime volume of a measurement results volume in order to correct errors arising from a given number of faults. The remaining faults (e.g., faults with longer error chain lengths within the spacetime volume, etc.) may be corrected by applying a global decoder (e.g., a graph-based decoding technique such as minimum-weight perfect-matching, Union Find, etc.). By first applying a local neural network decoder, which treats a given number of errors afflicting the data qubits (e.g., via syndrome difference information), followed by applying a global decoder which treats remaining errors, overall decoding time for syndrome measurement rounds of a given surface code may be reduced.

Furthermore, such a decoding scheme may reduce the syndrome density (e.g., via syndrome collapse and/or vertical cleanup, discussed below), resulting in a faster implementation of the global decoder. In some embodiments, the use of a local neural network decoder to account for circuit-level noise, such as those described herein, may result in the creation of vertical pairs of highlighted syndrome vertices. It may be advantageous to treat such vertical pairs, via syndrome collapse and/or vertical cleanup, before the global decoding stage in order to reduce the syndrome density. In some embodiments, syndrome collapse may be defined as a procedure to remove a subset of vertical pairs (after the application of a local neural network decoder) while also reducing the number of error syndromes used as input to the global decoder. Vertical cleanup may be defined as a procedure of directly removing vertical pairs after the application of the local neural network decoder, but prior to the implementation of the global decoder, according to some embodiments.

This written description continues with a general description of the use of fast local and global decoders for quantum error-correcting codes to account for circuit-level noise. Examples of neural network architectures and their implementations as local decoders are discussed, followed by methods for training such local neural network decoders to treat circuit-level noise during error correction. Methods for performing syndrome collapse and vertical cleanup in preparation for a global decoding stage are then discussed. Finally, a description of an example computing system upon which the various components, modules, systems, devices, and/or decoding algorithms may be implemented is provided. Various examples are provided throughout the specification. A person having ordinary skill in the art should also understand that the previous and following description of local and global decoding schemes is not to be construed as limiting as to the implementation of said decoding schemes, or portions thereof.

FIG. 1 is a flow diagram illustrating a process of performing error correction for syndrome measurement results of a surface code, wherein the decoding process involves decoding via local and global decoders, according to some embodiments.

In some embodiments, error correction for syndrome measurement results of a surface code (e.g., surface code 200 described herein with regard to FIG. 2) may be performed such that circuit-level noise may be accounted for, as described in block 100. Such error correction may be performed in three steps, as shown in blocks 102, 104, and 106, according to some embodiments.

Figure 3:
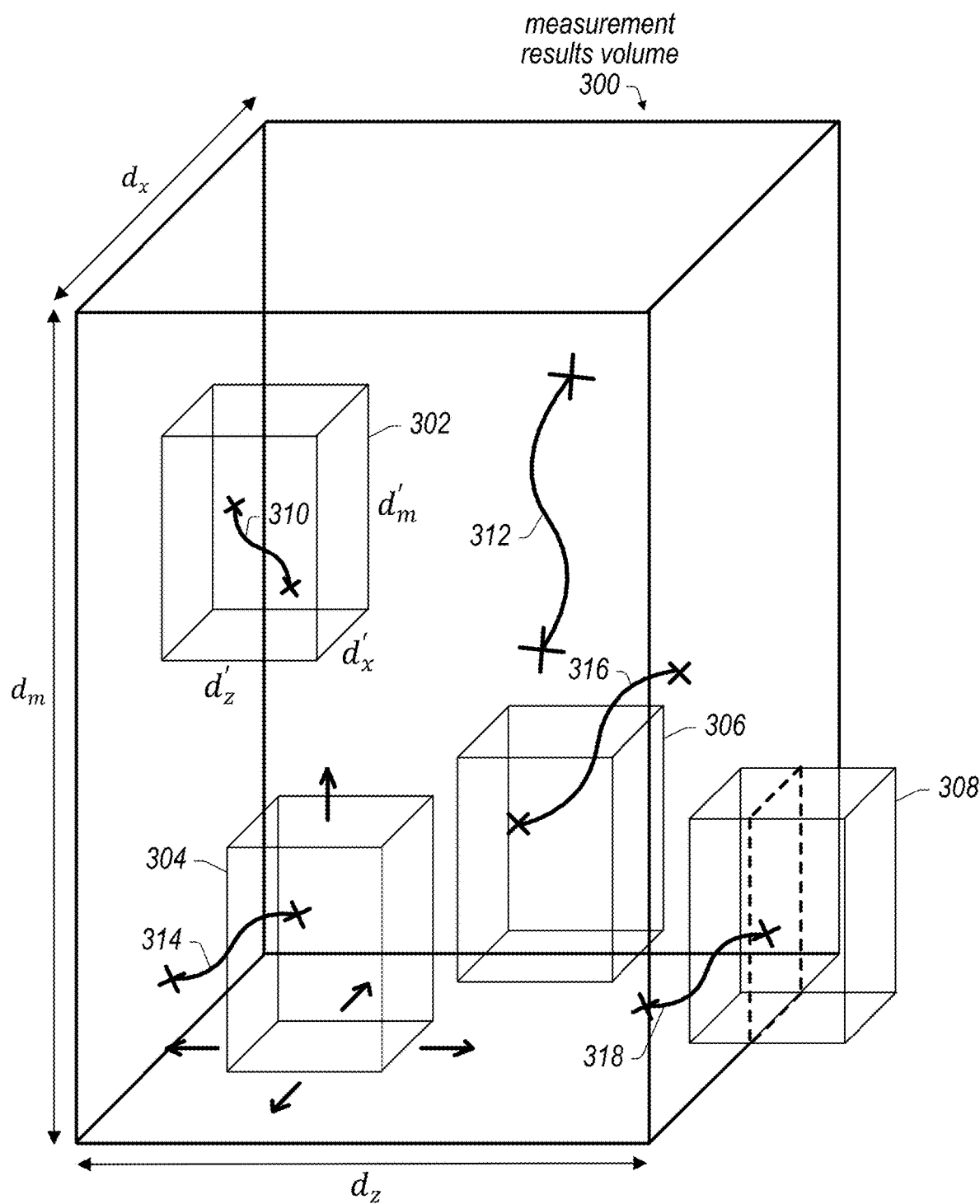
FIG. 3 illustrates an example of a local neural network decoder that sweeps through a measurement results volume in order to correct errors via a pattern recognition technique, according to some embodiments.

In block 102, a local neural network decoder may be used to sweep through a given measurement results volume (e.g., measurement results volume 300 described herein with regard to FIG. 3) in order to incrementally decode errors in said volume. For example, the local neural network decoder is visually represented by volume 304, as shown in FIG. 3, in which volume 304 moves throughout measurement results volume 300 and detects (via syndrome difference information), then corrects errors patterns of a certain size or smaller, such as error pattern 310. Volumes 302, 306, and 308 represent volume 304 at other stages of the decoding process in which volume 304 is sweeping across and up measurement results volume 300, according to some embodiments. In some embodiments, a local neural network decoder may detect errors (e.g., via a pattern recognition technique) by identifying syndrome differences within a measurement results volume and treating errors corresponding to said syndrome differences.

In some embodiments, vertical pairs of highlighted vertices may be generated during the decoding process described by block 102 (see also the description for FIGS. 11A-11E herein). Therefore, a second step (e.g., a "post-processing" step) in the error correction process described by block 102 may resemble that of block 104 in which said vertical pairs of highlighted vertices within the measurement results volume (that has already been decoded via a local decoding stage such as that which is described in block 102) are corrected before proceeding to a global decoder stage. Vertical pairs of highlighted vertices may be treated (e.g., removed) via syndrome collapse or vertical cleanup (see also the description for FIGS. 12A-17 herein). The process described by block 104 may also reduce the syndrome density, allowing for a faster and more efficient global decoding step, according to some embodiments.

In block 106, remaining errors in the measurement results volume are decoded using a global decoder, such as through a minimum-weight perfect-matching (MWPM) decoding technique, Union Find, or through another graph-based decoding technique. Then, in block 108, the results (e.g., a logical result) of the error correction may be provided.

FIG. 2 illustrates an example of a surface code used to encode logical qubits using a set of physical data qubits, according to some embodiments.

In some embodiments, a surface code may be used to correct errors during a quantum computation. A surface code, such as surface code 200, may resemble a two-dimensional planar version of the toric code. The code parameters of a surface code, such as surface code 200, may be defined as $[[d_x d_z, 1, \min(d_x, d_z)]]$, where $d_x$ and $d_z$ are the distances of minimum-weight representatives of the logical X and Z operators of the surface code (which may be referred to as the X and Z distance of the surface code). For example, surface code 200 may be referred to as a $d_x=d_z=5$ surface code, according to some embodiments. Furthermore, the logical $\bar{X}$ and $\bar{Z}$ operators of a surface code (e.g., $\bar{X}$ operator 212 and $\bar{Z}$ operator 214 of surface code 200) may form vertical and horizontal string-like excitations.

The surface code belongs to the family of Calderbank-Shor-Steane (CSS) codes, wherein X and Z-type stabilizers in the bulk of the surface code lattice (e.g., plaquettes such as X-type stabilizer 202 and Z-type stabilizer 204 in surface code 200) correspond to weight-four operators, and there are additional weight-two operators along the boundary of the surface code lattice (e.g., the semi-circles shown in surface code 200). Data qubits, such as data qubit 208, are placed at vertices of the respective stabilizers, and ancilla qubits, such as ancilla qubit 210, are placed at the center of the respective stabilizers, as shown in FIG. 2. Ancilla qubits may be used to store stabilizer measurement outcomes, according to some embodiments. Furthermore, some embodiments of FIG. 2 illustrate the organization of time steps at which gates are applied for a given round of syndrome measurements. For example, as shown in FIG. 2, CNOT gate 206 occurs at timestep 3.

In some embodiments, error syndromes for Calderbank-Shor-Steane codes may be defined as follows: Let $\mathcal{S}_X = \{g_1^{(X)}, g_2^{(X)}, \ldots, g_{r_1}^{(X)}\}$ and $\mathcal{S}_Z = \{g_1^{(Z)}, g_2^{(Z)}, \ldots g_{r_2}^{(Z)}\}$ be the generating set of X and Z-type stabilizers of a Calderbank-Shor-Steane code $\mathcal{C}$, and suppose that the stabilizer measurements are repeated $d_m$ times (e.g., meaning that there are $d_m$ rounds of stabilizer measurements). Then, $s_X(d_m)$ may be defined to be a bit string $(e_X^{(1)} e_X^{(2)} \ldots e_X^{(d_m)}$, where $e_X^{(k)}$ is a bit string of length $r_2$ with $e_X^{(k)}(j)=1$ if and only if $g_j^{(Z)}$ is measured non-trivially in the k'th syndrome measurement round, and is zero otherwise. Similarly, $s_Z(d_m)$ may be defined to be a bit string $(e_Z^{(1)} e_Z^{(2)} \ldots e_Z^{(d_m)})$, where $e_Z^{(k)}$ is a bit string of length $r_1$ with $e_Z^{(k)}(j)=1$ if and only if $g_j^{(X)}$ is measured non-trivially in the k'th syndrome measurement round, and is zero otherwise.

Note that the $s_X(d_m)$ and $s_Z(d_m)$ syndromes in the above definition of error syndromes for Calderbank-Shor-Steane codes may have non-zero bits due to both the presence of data qubit errors as well as measurement errors.

In some embodiments, syndrome differences between consecutive rounds of stabilizer measurements may also be defined as follows: Given the syndromes $s_X(d_m)=(e_X^{(1)} e_X^{(2)} \ldots e_X^{(d_m)})=(e_Z^{(1)} e_Z^{(2)} \ldots e_Z^{(d_m)})$ for the code $\mathcal{C}$, $s_X^{diff}(d_m)$ may be defined as $s_X^{diff}(d_m)=(e_X^{(1)} \tilde{e}_X^{(2)} \ldots \tilde{e}_X^{(d_m)})$, where $\tilde{e}_X^{(k)}$ may be a bit string of length $r_2$ and $\tilde{e}_X^{(k)}(j)=1$ if and only if the measurement outcome of $g_j^{(Z)}$ in round k is different than the measurement outcome of $g_j^{(Z)}$ in round k−1 (for k>1). Similarly, $s_Z^{diff}(d_m)$ may be defined as $s_Z^{diff}(d_m)=(e_Z^{(1)} \tilde{e}_Z^{(2)} \ldots \tilde{e}_Z^{(d_m)})$, where $\tilde{e}_Z^{(k)}$ is a bit string of length $r_1$ and $\tilde{e}_Z^{(k)}(j)=1$ if and only if the measurement outcome of $g_j^{(X)}$ in round k is different than the measurement outcome of $g_j^{(X)}$ in round k−1 (for k>1).

In some embodiments, the standard decoding protocol that may be used to correct errors with a surface code, such as surface code 200, is to perform minimum-weight perfect-matching (MWPM), such as by using the Edmonds Blossom algorithm. In minimum-weight perfect-matching, a graph G may be formed, wherein edges of graph G represent the data qubits of the corresponding surface code (e.g., data qubit 208 in surface code 200), and vertices of graph G represent the ancilla qubits of the corresponding surface code (e.g., ancilla qubit 210 in surface code 200). As described above, ancilla qubits may be associated with stabilizer measurement outcomes, wherein the outcomes may be encoded in the respective ancilla qubits, according to some embodiments.

In some embodiments, in order to distinguish measurement errors from data qubit errors, the error syndrome (e.g., the measurement of all stabilizers) may be repeated r times, wherein r is considered large enough to ensure fault-tolerance. Furthermore, let $m^{(k)}(g_i)=1$ if the stabilizer $g_i$ in round k is measured non-trivially and zero otherwise. Prior to implementing minimum-weight perfect-matching, a vertex $v^{(k)}(g_i)$ in graph G associated with a stabilizer $g_i$ in the k'th syndrome measurement round may be highlighted if and only if $m^{(k)}(g_i) \neq m^{(k-1)}(g_i)$, (e.g., wherein highlighted refers to the syndrome measurement outcome of $g_i$ changing between rounds k−1 and k). More generally, for any fault location $l_k$ in the circuits used to measure the stabilizers of the surface code (e.g., CNOT gates, idling locations, state-preparation, and measurements), all possible Pauli errors $P^{l_k}(j)$ at location $l_k$ (e.g., wherein k being an index through all possible Pauli's) are considered, and are propagated. If propagating the Pauli $P^{l_k}(j)$ results in two highlighted vertices $v^{(k_1)}(g_{j_1})$ and $v^{(k_2)}(g_{j_2})$, an edge e incident to $v^{(k_1)}(g_{j_1})$ and $v^{(k_2)}(g_{j_2})$ may be added to the matching graph G For example, a Pauli Y error in a given surface code can result in more than two highlighted vertices, thus resulting in hyperedges. Such hyperedges may then be mapped to edges associated with X and Z Pauli errors.

In some embodiments which use a minimum-weight perfect-matching global decoder, for a distance $d_x=d_z=d$ surface code with d rounds of syndrome measurements, the decoding complexity of minimum-weight perfect-matching may be referred to as $\mathcal{O}(n^3)$, where $n \propto d^2$, and which corresponds to the number of highlighted vertices in graph G. In other embodiments which use a Union Find global decoder, the decoding complexity may be referred to as $\mathcal{O}(\alpha n)$, where $\alpha$ is the inverse of Ackermann's function.

Although minimum-weight perfect-matching, Union Find, and/or other graph-based global decoders may have polynomial decoding time complexities, this still may not be fast enough for time scales that decoders need to operate on for many practical quantum hardware architectures. Therefore, error correction of a surface code may be performed by local and global decoders, via the methods and techniques described herein. In some embodiments, scalable local neural network decoders may be used prior to using a global decoder (e.g., minimum-weight perfect-matching or Union Find). For example, a local neural network decoder that has an effective distance d' and which can thus correct errors E of weight wt(E)≤(d'−1)/2 may be used before a global decoder, which then may correct any remaining errors which were not corrected by the local decoder (see the description for FIG. 1 herein).

The effect of using a local decoder is to reduce the value of n by removing a first set of errors afflicting the data qubits. Using the methods and techniques described herein, local neural network decoders may be used to correct not only for code capacity noise (e.g., where only data qubits can fail, and error syndromes only have to be measured once) and phenomenological noise (e.g., where measurements can fail in addition to data qubits), but also for circuit-level noise, which introduce additional and complex fault patterns in which a local neural network decoder is trained for.

For some embodiments described herein, circuit-level depolarizing noise (and the related circuit-level depolarizing noise model) may be considered as follows. In some embodiments, a circuit-level noise model may comprise the following definitions:

Each single-qubit gate location is followed by a Pauli X, Y or Z error, each with probability $$\frac{p}{3}.$$

With probability p, each two-qubit gate is followed by a two-qubit Pauli error drawn uniformly and independently from $\{I, X, Y, Z\}^{\otimes 2}\setminus\{I\otimes I\}$.

With probability $$\frac{2p}{3},$$

the preparation of the $|0\rangle$ state is replaced by $|1\rangle = X|0\rangle$. Similarly, with probability $$\frac{2p}{3},$$

the preparation of the $|+\rangle$ state is replaced by $|-\rangle = Z|+\rangle$.

With probability $$\frac{2p}{3},$$

any single qubit measurement has its outcome flipped.

Lastly, with probability p, each idle gate location is followed by a Pauli error drawn uniformly and independently from $\{X, Y, Z\}$.

Training Neural Networks as Local Decoders

As described in FIG. 1 herein, a hierarchical decoding strategy (e.g., local and global decoders) may be used for correcting errors afflicting data qubits encoded in a surface code. In such embodiments, a local decoder may correct errors of up to a certain size, and a global decoder then corrects any remaining errors after implementing the local decoder (see the description for FIG. 3 herein). As described herein, a neural network may be trained as a local decoder using the circuit-level noise model introduced above. In some embodiments, as a result of the training of the local neural network decoder, said decoder may then be scalable and may be applied to arbitrary-sized measurement results volumes $(d_x, d_z, d_m)$, wherein $d_x$ and $d_z$ are the X and Z distances of an arbitrarily sized surface code, and $d_m$ is the number of syndrome measurement rounds (e.g., as shown in FIG. 3).

In some embodiments, the local neural network decoder may have an effective distance $d_{eff} \leq \max(d_x, d_z)$, allowing the local decoder to remove errors arising from at most $(d_{eff}-1)/2$ faults. By removing such errors at the local decoding step of the error correction process (e.g., block 100), the syndrome density may be reduced (e.g., the number of highlighted vertices in the matching graph G used to implement minimum-weight perfect-matching), thus resulting in a faster execution of the global decoding step. By training a three-dimensional fully-convolutional neural network, which will be further explained in the following paragraphs, the local neural network decoder may be able to correct for circuit-level noise (e.g., wherein repeated rounds of syndrome measurements are performed), as opposed to only code capacity noise and/or phenomenological noise. In addition, encoding strategies described herein for training said three-dimensional fully-convolutional neural network allows the neural network to adapt to different boundaries of a surface code lattice, and enhances the neural network's abilities to correct errors within the bulk of the measurement results volume.

FIG. 3 illustrates an example of a local neural network decoder that sweeps through a measurement results volume in order to correct errors via a pattern recognition technique, according to some embodiments.

In some embodiments, decoding, such as with a local neural network decoder, may resemble a pattern recognition technique: for each physical data qubit $q_j$ used in the encoding of the given surface code, and given the syndrome measurements within some local volume $(d'_x, d'_z, d'_m)$ of the surface code lattice, a classifier can predict whether or not there is an error afflicting data qubit $q_j$.

In embodiments described herein, a neural network classifier may be designed to take, as input, a local volume of size $(d'_x, d'_z, d'_m)$, and train it to correct data-qubit errors arising from at most $(d'-1)/2$ faults, wherein $d'=\min(d'_x, d'_z)$. In order to promote scalability, such a neural network classifier may be designed using the methods and techniques described herein such that it corrects errors arising from at most $(d_{eff}-1)/2$ faults even when applied to larger measurement results volumes $(d_x, d_z, d_m)$, where $d_{eff} \leq d'$. In some embodiments, such as those shown in FIG. 3, measurement results volume 300 has a volume of $(d_x, d_z, d_m)$, and the local neural network decoder (represented visually by volumes 302, 304, 306, and 308, e.g., at different moments in spacetime of error correction of measurement results volume 300) has a volume of size $(d'_x, d'_z, d'_m)$. The local neural network decoder is then able to correct spacetime errors (e.g., error patterns that may be separated by space within a given round of syndrome measurements and/or separated by one or more rounds of syndrome measurements) such as pattern 310, according to some embodiments. Other examples of error patterns, such as patterns 312, 314, 316, and 318 may or may not be corrected by the local neural network decoder based on their size in comparison to the size $(d'_x, d'_z, d'_m)$. Patterns that are not corrected by the local neural network decoder may be decoded/corrected by the global decoder (e.g., by the process described in block 106).

Figure 4:
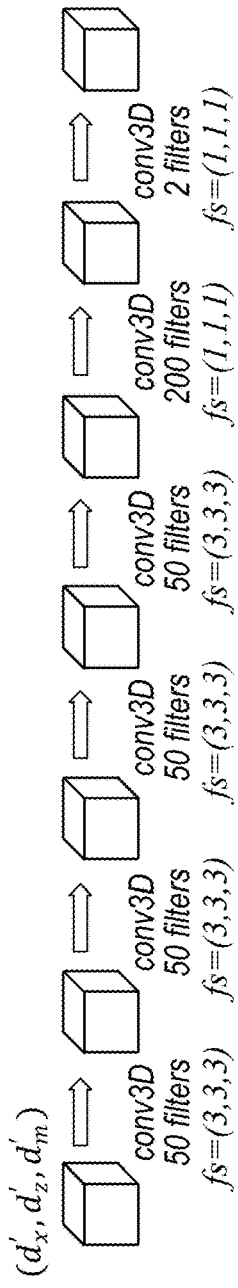
FIG. 4 illustrates an example of a neural network architecture that may be applied to account for circuit-level noise during error correction for syndrome measurement results of a surface code, according to some embodiments.
Figure 5:
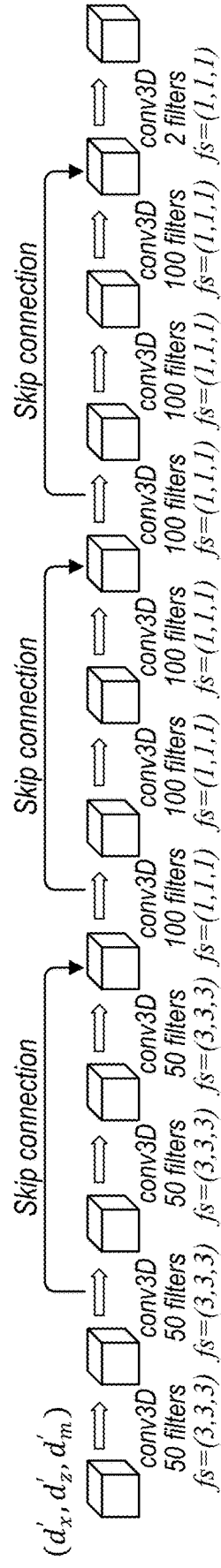
FIG. 5 illustrates another example of a neural network architecture that may be applied to account for circuit-level noise during error correction for syndrome measurement results of a surface code, according to some embodiments.

FIGS. 4 and 5 illustrate examples of neural network architectures that may be applied to account for circuit-level noise during error correction for syndrome measurement results of a surface code, according to some embodiments.

In some embodiments, the network architecture of the local neural network decoder may resemble an enhanced version of a multi-layer perceptron (MLP) with an input layer, hidden layer, and output layer, each of which is a "fully connected" layer where all inputs connect to each neuron in the layer. In some embodiments of a multi-layer perceptron network, the $(d'_x, d'_z, d'_m)$ local volume serves as inputs to a set of N neurons in the input layer. The hidden layer may then take those N neurons as inputs for a set of H neurons, followed by the H hidden layer neuron outputs being inputs to the final layer neurons that produce the prediction. In some embodiments, such as in the network architectures of FIGS. 4 and 5, the methods and techniques described herein are used to implement a network architecture with two outputs, the occurrence of an X-type error, and the occurrence of a Z-type error, with Y-type errors occurring if both X-type and Z-type errors are present. The two outputs may then be compared to the two output targets defined by "trainY" (see the description for "trainY" below).

Said enhancements to the multi-layer perceptron network decoder may pertain to the network being "fully-convolutional," wherein each layer consists of a set of convolution filters (e.g., see the filters shown in FIGS. 4 and 5). This may be considered to be an enhancement over the standard multi-layer perceptron as convolutions efficiently implement a sliding-window computation in which the neural network architecture is given the volume $(d'_x, d'_z, d'_m)$ and proceeds to perform corrections on each qubit in said volume using only local information (e.g., not information outside of the given volume $(d'_x, d'_z, d'_m)$). to produce an output at each location of an input of arbitrary size. In some embodiments in which the neural network is given a local input volume of $(d'_x, d'_z, d'_m)$, a three-dimensional convolution of the same size may be used, such that the first layer may be a set of N $(d'_x, d'_z, d'_m)$ convolutional filters (e.g., N=50 "conv3D" filters in example embodiments shown in FIGS. 4 and 5). This layer, when applied to a local patch of size $(d'_x, d'_z, d'_m)$, produces N outputs. The hidden layer, accepting these N inputs for H outputs, may be viewed as a set of H 1×1×1 convolutional filters. Likewise, the final output layer accepts these H inputs to produce 2 outputs, and can be represented as two 1×1×1 "conv3D" filters.

In some embodiments, a fully-convolutional neural network produces a prediction for the data qubit at the center of the local volume it analyzes, as it sweeps through a measurement results volume of a given surface code lattice (as shown in FIG. 3). The neural network may also be configured to make predictions along a given boundary of the measurement results volume (e.g., as shown by volume 308 in FIG. 3, wherein some of the input field lies outside of measurement results volume 300), according to some embodiments. In such embodiments, the three-dimensional convolution layers may be selectively chosen in order to produce a "same" output, whereby the input is automatically zero-padded beyond a given boundary of the measurement results volume. For example, for a convolution of size 9 to produce an output right at the boundary, the boundary may be padded with an additional 4 values.

An additional enhancement to the neural network architecture may be to improve the representational power of the network by replacing the first layer of convolutional filters with multiple layers, while preserving the overall receptive field of the network. For example, if the first layer had filters of size (9,9,9), then 4 layers with filters of size (3,3,3) also has an effective filter size of (9,9,9), since each additional layer increases the effective filter width by 2 from the first layer's width of 3. If, hypothetically, each layer was linear, the resulting N outputs in the fourth layer would be mathematically equivalent to a single 9×9×9 layer with N outputs. In given embodiments, however, in which each layer is non-linear, with a nonlinear activation function (e.g., ReLu), the two networks may no longer be equivalent, and the neural network architecture with 4 layers of (3,3,3) filters may have more representational power, learning nonlinear combinations of features-of-features-of-features. Additionally, the hidden layer may be expanded with (1,1,1) filters to become multiple layers of (1,1,1) filters, which may increase the neural network's learning capacity.

FIGS. 4 and 5 demonstrate such neural network architectures. A person having ordinary skill in the art should understand that the architectures shown in FIGS. 4 and 5 are not meant to be restrictive, but illustrative of how to implement the neural network architecture designs discussed above. The neural network architecture shown in FIG. 4 has 5 hidden layers, with the first four hidden layers having 50 filters of dimension (3,3,3). These first four hidden layers may resemble feature extractors with a total receptive field of 9×9×9. The last two layers of the architecture shown in FIG. 4 have filters of dimension (1,1,1), with 200 filters being used in the second last layer. The last layer of the architecture has 2 filters, to predict the X and Z error outputs (which may then be compared to the output targets in "trainY"). The example embodiments shown in FIG. 4 have a total of 221,660 parameters.

The neural network architecture shown in FIG. 5 has 10 hidden layers. The first 4 layers have 50 filters of dimension (3,3,3), and the remaining hidden layers have 100 filters of dimension (1,1,1). The example embodiments shown in FIG. 5 have a total of 352,210 parameters. In the neural network architecture shown in FIG. 5, "skip connections" may also be applied in order to avoid exploding and/or vanishing gradients. In some embodiments, a batch normalization is performed after each layer depicted in the neutral network architectures shown in FIGS. 4 and 5, and all layers may use the ReLu activation function (apart for the last layer, wherein a sigmoid activation function may be used) to generate predictions for physical qubit errors throughout the given surface code lattice. The binary cross-entropy loss function may also be applied to train the local neural network decoders described herein, according to some embodiments.

Neural network architectures, such as those shown in FIGS. 4 and 5, may be applied to account for circuit-level noise by learning complex fault patterns that arise from circuit-level noise, according to some embodiments. In addition, such neural network architectures may be implemented as fast decoders that improve the timescales needed for error correction of a quantum hardware.

In order to train the local and fully-convolutional neural network decoders such as those discussed herein, training data sets may be prepared by performing Monte Carlo simulations using the circuit-level noise model described above, with the surface code circuit being used to compute the error syndrome. In some embodiments, the resulting training data sets may then be stored using the following format: The inputs to the local neural network decoder, which may be referred to collectively as "trainX" herein for ease of discussion, is a tensor of shape (m, $d_x$, $d_z$, $d_m$, 5) for a surface code with X and Z distances $d_x$ and $d_z$, with $d_m$ syndrome measurement rounds (with the last round being a round of perfect error correction wherein the data qubits are measured in some basis), and with m being the number of Monte Carlo simulations (e.g., the number of training samples) within the given training data set. The number 5 in "trainX" refers to five additional inputs which are described in the following paragraphs (e.g., syndrome information such as syndrome difference histories $s_X^{diff}(d_m)$ and $s_Z^{diff}(d_m)$, location information such as matrices enc(X) and enc(Z), and temporal boundaries of the given measurement results volume). Using the inputs of "trainX," the local neural network decoder is trained to detect and decode a given set of errors within a given measurement results volume. Such output targets that the local neural network decoder is attempting to match to during training may be referred to as "trainY" herein, also for ease of discussion.

Recalling the definition of syndrome differences described above, the first two of the five additional inputs to "trainX" contain the syndrome differences $s_X^{diff}(d_m)$ and $S_Z^{diff}(d_m)$ obtained for $d_m-1$ rounds of noisy syndrome measurements, followed by one round of perfect error correction, according to some embodiments. Tracking changes in syndrome measurement outcomes between consecutive rounds may ensure that the average syndrome density remains constant across different syndrome measurement rounds. The next two inputs of "trainX" contain spatial information used to enable the local neural network decoder to associate syndrome measurement outcomes with data qubits in both the bulk and along boundaries of the given surface code that can influence the observed outcome. The data is represented as $d_x$ by $d_z$ binary matrices labelled 'enc(X)' and 'enc(Z),' where 1 values are inserted following a particular mapping, which is described in the following paragraphs with regard to FIGS. 6A-7B, between the position of the ancilla qubits (e.g., ancilla qubit 210) and data qubits (e.g., data qubit 208), which interact with the ancilla qubits.

Figures 6A, 6B:
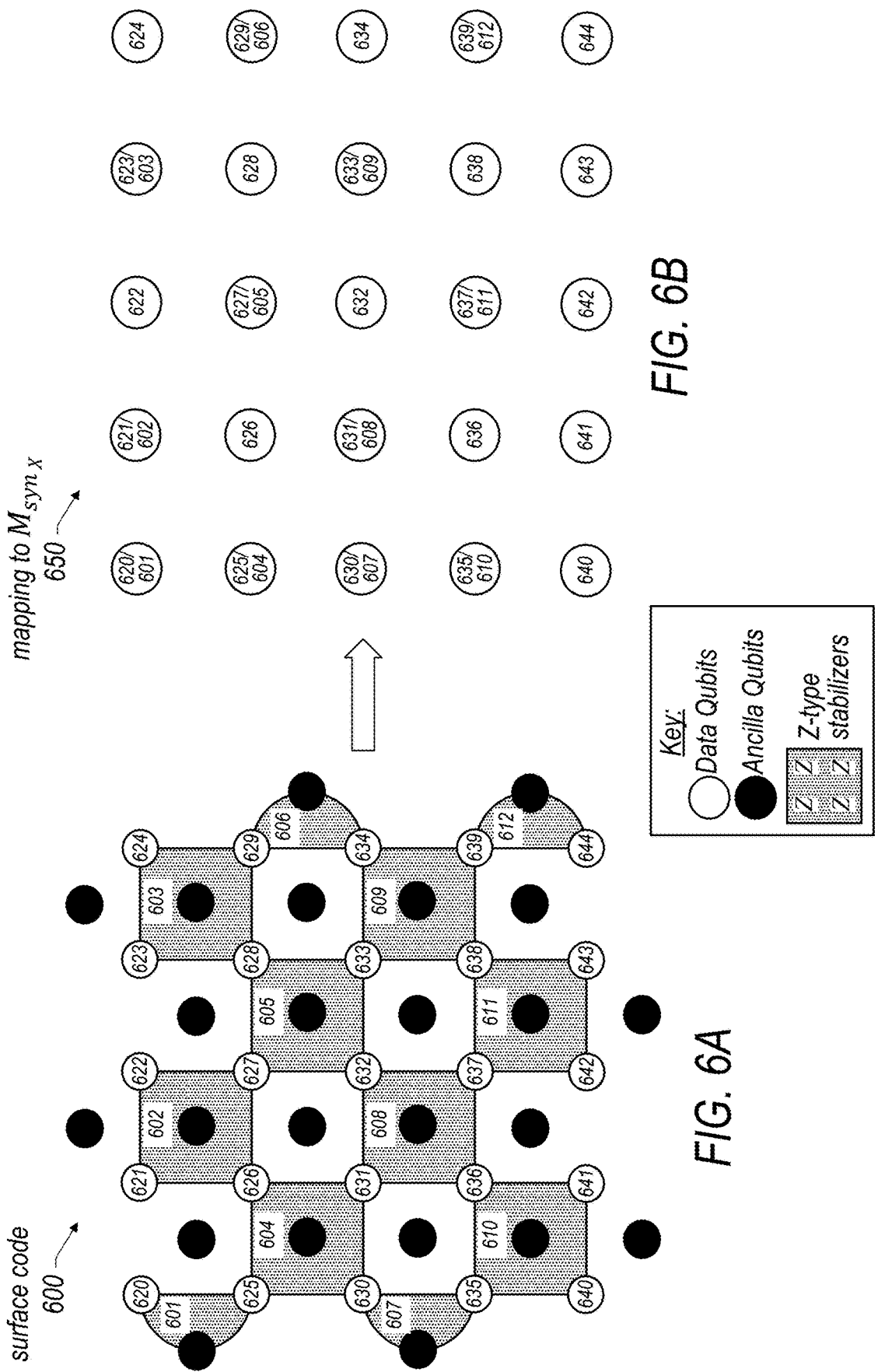
FIGS. 6A and 6B illustrate Z-type stabilizers of a surface code, shown in FIG. 6A, that may be mapped to a matrix representation of X-type error syndromes (e.g., matrix $M_{syn_x}$), shown in FIG. 6B, according to some embodiments.

FIGS. 6A and 6B illustrate Z-type stabilizers of a surface code, shown in FIG. 6A, that may be mapped to a matrix representation of X-type error syndromes (e.g., matrix $M_{syn_X}$), shown in FIG. 6B, according to some embodiments. FIGS. 7A and 7B illustrate X-type stabilizers of a surface code, shown in FIG. 7A, that may be mapped to a matrix representation of Z-type error syndromes (e.g., matrix $M_{syn_Z}$), shown in FIG. 7B, according to some embodiments.

In the following example embodiments pertaining to FIGS. 6A-7B, example $d_x=d_z=5$ surface codes, such as surface code 600 and surface code 700, are used to describe mappings to matrices $M_{syn_X}$ and $M_{syn_Z}$, respectively. The first two of five input channels to "trainX" may correspond to syndrome information, such as syndrome difference histories $s_X^{diff}(d_m)$ and $s_Z^{diff}(d_m)$, by which changes in syndromes between consecutive rounds may be tracked (e.g., and not the syndromes themselves). In order for the local neural network decoder to associate syndrome measurement outcomes with the corresponding data qubit errors resulting in the given measured syndrome, syndrome measurement outcomes for the j'th round are converted to two-dimensional d×d binary matrices labeled $M_{syn_X}(j)$ and $M_{syn_Z}(j)$ following the mappings shown in FIGS. 6A-7B, including how to construct the $M_{syn_X}(j)$ and $M_{syn_Z}(j)$ matrices based on the measurement outcomes of each stabilizer of the surface code in round j. Then, to get the final representation for $s_X^{diff}(d_m)$ and $s_Z^{diff}(d_m)$, the matrices $\tilde{M}_{syn_X}(j)=M_{syn_X}(j) \oplus M_{syn_X}(j-1)$ and $\tilde{M}_{syn_Z}(j)=M_{syn_Z}(j) \oplus M_{syn_Z}(j-1)$ for $j \geq 2$ are computed, with $\tilde{M}_{syn_X}(1)=M_{syn_X}(1)$ and $\tilde{M}_{syn_Z}(1)=M_{syn_Z}(1)$.

In FIG. 6A, Z-type stabilizers of the d=5 surface code 600 are labeled 601-612, respectively. (Note that X-type stabilizers are left unlabeled in embodiments shown in FIG. 6A for ease of description below of the mappings using Z-type stabilizers for FIGS. 6A-6B.) The Z-type stabilizers 601-612 are labeled from 1 to $(d^2-1)/2=12$ going left to right, and top to bottom along surface code 600, as shown in FIG. 6A. Subsequently, FIG. 6B describes a mapping of the Z-type stabilizer measurement outcomes (e.g., X-type error syndromes) for the d=5 surface code 600 to the matrix $M_{syn_X}$ (e.g., mapping to $M_{syn_X}$ 650), which has d rows and d columns, following the d=5 surface code 600. For the Z-type stabilizers shown in FIG. 6A, the corresponding bit $b_k^{(X)} \in \{0,1\}$ where $1 \leq k \leq (d^2-1)/2$ (which may be one if the stabilizer is measured non-trivially and zero otherwise) may be mapped to a data qubit (e.g., a given data qubit of data qubits 620-644) located at the top left corner of the square if the Z-type stabilizer is weight-4, or if the Z-type stabilizer is a weight-2 stabilizer along the right boundary of surface code 600. For example, Z-type stabilizer 602 may be mapped to data qubit 621, and Z-type stabilizer 606 may be mapped to data qubit 629, according to some embodiments. For weight-2 stabilizers along the left boundary of surface code 600, the bit is mapped to the top right data qubit (e.g., a given data qubit of data qubits 620-644). For example, Z-type stabilizer 601 may be mapped to data qubit 620, according to some embodiments. Mappings for the remaining 9 Z-type stabilizers of surface code 600 to respective data qubits of surface code 600 are shown in mapping to $M_{syn_X}$ 650 in FIG. 6B.

In some embodiments, mapping to $M_{syn_X}$ 650 is used to generate the binary matrix $M_{syn_X}$: In some embodiments in which a given Z-type stabilizer of Z-type stabilizers 601-612 is measured non-trivially, a 'one' is entered into binary matrix $M_{syn_X}$ corresponding to the location of the data qubit the given stabilizer was mapped to. For example, if Z-type stabilizer 602 was measured non-trivially, a 'one' may be entered into binary matrix $M_{syn_X}$ for the corresponding data qubit 621 location within the d rows and d columns of binary matrix $M_{syn_X}$. In some embodiments in which a given Z-type stabilizer is measured trivially, a 'zero' is entered into binary matrix $M_{syn_X}$.

In FIG. 7A, X-type stabilizers of the d=5 surface code 700 are labeled 701-712, respectively. (Note that Z-type stabilizers are left unlabeled in embodiments shown in FIG. 7A for ease of description below of the mappings using X-type stabilizers for FIGS. 7A-7B.) The X-type stabilizers 701-712 are labeled from 1 to $(d^2-1)/2=12$ going top to bottom, and left to right along surface code 700, as shown in FIG. 7A. Subsequently, FIG. 7B describes a mapping of the X-type stabilizer measurement outcomes (e.g., Z-type error syndromes) for the d=5 surface code 700 to the matrix $M_{syn_Z}$ (e.g., mapping to $M_{syn_z}$ 750), which has d rows and d columns, following the d=5 surface code 700.

For the X-type stabilizers shown in FIG. 7A, the corresponding bit $b_k^{(Z)}$ where $1 \le k \le (d^2-1)/2$ (which may be one if the stabilizer is measured non-trivially and zero otherwise) may be mapped to a data qubit (e.g., a given data qubit of data qubits 720-744) located at the top left corner of a given X-type stabilizer, apart from weight-2 X-type stabilizers on the top boundary of surface code 700, for which the corresponding bit $b_k^{(Z)}$ may be mapped to the bottom left data qubit of the given X-type stabilizer. For example, X-type stabilizer 701 may be mapped to data qubit 720, and X-type stabilizer 704 may be mapped to data qubit 721, according to some embodiments. Mappings for the remaining 10 X-type stabilizers of surface code 700 to respective data qubits of surface code 700 are shown in mapping to $M_{syn_z}$ 750 in FIG. 7B.

As described above with regard to binary matrix $M_{syn_x}$, when a given X-type stabilizer of X-type stabilizers 701-712 is measured non-trivially, a 'one' is entered into binary matrix $M_{syn_z}$ corresponding to the location of the data qubit the given stabilizer was mapped to. For example, if X-type stabilizer 701 was measured non-trivially, a 'one' may be entered into binary matrix $M_{syn_z}$ for the corresponding data qubit 720 location within the d rows and d columns of binary matrix $M_{syn_z}$. In some embodiments in which a given X-type stabilizer is measured trivially, a 'zero' is entered into binary matrix $M_{syn_z}$.

Continuing with the discussion of the five additional inputs to "trainX," the second two of the five additional inputs may correspond to location information about qubit placements within the dimensions of the measurement results volume, such as matrices 'enc(X)' and 'enc(Z),' which may be identical in each syndrome measurement round unless the given surface code lattice changes shape. (Note that some example embodiments of performing a parity measurement via lattice surgery, in which a given surface code lattice does change shape, are discussed with regard to FIGS. 18A-19 herein). The matrices 'enc(X)' and 'enc(Z)' may be encoded using similar processes as the encoding of the matrices $M_{syn_x}$ and $M_{syn_z}$, described above with regard to FIGS. 6A-7B. However, for matrices 'enc(X)' and 'enc(Z),' a 'one' is always inserted regardless of whether a given stabilizer is measured non-trivially or trivially, and 'zeros' are inserted in other matrix locations (e.g., in embodiments in which the surface code lattice does not change shape). For example, according to mapping to $M_{syn_x}$ 650, as shown in FIG. 6B, a 'one' would be entered into 'enc(X)' for locations corresponding to data qubits 620, 621, 623, 625, 627, 629, 630, 631, 633, 635, 637, and 639, and a 'zero' would be entered into 'enc(X)' for locations corresponding to data qubits 622, 624, 626, 628, 632, 634, 636, 638, 640, 641, 642, 643, and 644. In a second example, according to mapping to $M_{syn_z}$ 750, as shown in FIG. 7B, a 'one' would be entered into 'enc(Z)' for locations corresponding to data qubits 720, 721, 722, 723, 726, 728, 730, 732, 736, 738, 740, and 742, and a 'zero' would be entered into 'enc(Z)' for locations corresponding to data qubits 724, 725, 727, 729, 731, 733, 734, 735, 737, 739, 741, 743, and 744. These mappings are summarized as:

$$enc(X)_j = \begin{pmatrix} 1 & 1 & 0 & 1 & 0 \\ 1 & 0 & 1 & 0 & 1 \\ 1 & 1 & 0 & 1 & 0 \\ 1 & 0 & 1 & 0 & 1 \\ 0 & 0 & 0 & 0 & 0 \end{pmatrix}$$

-continued $$enc(Z)_j = \begin{pmatrix} 1 & 1 & 1 & 1 & 0 \\ 0 & 1 & 0 & 1 & 0 \\ 1 & 0 & 1 & 0 & 0 \\ 0 & 1 & 0 & 1 & 0 \\ 1 & 0 & 1 & 0 & 0 \end{pmatrix}$$

where $j \in \{1, \ldots, d_m\}$.

In some embodiments, matrices 'enc(X)' and 'enc(Z)' are provided for each syndrome measurement round, following the notation $j \in \{1, \ldots, d_m\}$ described above. Matrices 'enc(X)' and 'enc(Z)' may be identical in each round (e.g., $\{1, \ldots, d_m\}$) unless the given surface code lattice changes shape between consecutive syndrome measurement rounds (e.g., during a given lattice surgery protocol—see the description for FIGS. 18A-19 herein).

In some embodiments in which a local neural network decoder is decoding a subset of a total measurement results volume and the subset is located in the bulk of the measurement results volume (e.g., volume 302 or 306 when decoding measurement results volume 300), syndromes associated with a particular data qubit may change shape depending on which data qubit is observed (e.g., by comparing data qubits surrounding data qubit 626 versus data qubits surrounding data qubit 627 in mapping to $M_{syn_x}$ 650). In some embodiments in which the matrices 'enc(X)' and 'enc(Z)' encode this information, providing such inputs to "trainX" may help the local neural network decoder distinguish between the different types of data qubits within a given measurement results volume when the local neural network decoder's receptive field is decoding data qubits in the bulk of the measurement results volume, at a boundary of the measurement results volume (see the following paragraphs), etc.

FIG. 8A illustrates the placements of boundary qubits for X-type stabilizers for a given surface code, according to some embodiments. FIG. 8B illustrates the placements of boundary qubits for Z-type stabilizers of a given surface code, according to some embodiments.

Similarly to providing locations of data qubits within the bulk, 'enc(X)' and 'enc(Z)' may allow the local neural network decoder to identify data qubits along the boundaries of a given measurement results volume (e.g., volume 308 when decoding measurement results volume 300). For embodiments described herein, boundary X-type data qubits may refer to data qubits located along the horizontal top and bottom boundaries of a given surface code lattice (e.g., boundary X-type data qubits ($b_X$) 802 in surface code 800), and boundary Z-type data qubits may refer to data qubits located along the vertical left and right boundaries of a given surface code lattice (e.g., boundary Z-type data qubits ($b_Z$) 808 in surface code 800).

Providing such inputs (e.g., location information pertaining to dimension sizes of a given measurement results volume, locations of data qubits within the bulk and/or at the boundaries, etc.) to "trainX" improves performance as compared to only specifying locations pertaining to data qubits at the boundaries.

Continuing with the discussion of the five additional inputs to "trainX," the fifth of the five additional inputs may correspond to a specification of temporal boundaries of a given measurement results volume. In some embodiments, the last round of error correction for a given measurement results volume (e.g., measurement results volume 300) is a round of perfect error correction in which the data qubits may be measured in some basis, and therefore it is relevant to specify such information in "trainX." For some embodiments described herein, a round of perfect error correction may be defined as a syndrome measurement round in which no new errors are introduced, and the perfect error correction round arises when the data qubits are measured directly in some basis (e.g., at the end of the computation). In some embodiments, a measurement error which occurs when the data qubits are measured directly (e.g., during a round of perfect error correction) is equivalent to an error on such data qubits in the prior round (e.g., the second-to-last round of syndrome measurements), and the syndrome measurement outcome may be compatible with the errors afflicting the data qubits arising from the second-to-last round. As such, since the last syndrome measurement round (e.g., a round of perfect error correction) behaves differently than other rounds of syndrome measurements, specifying the first and last rounds of syndrome measurements in "trainX" allows the trained local neural network decoder to generalize to measurement results volumes with arbitrary $d_m$ values (e.g., arbitrary numbers of rounds of syndrome measurements for arbitrarily sized surface code lattices).

In some embodiments, an input to "trainX" pertaining to temporal boundaries may be represented using $d_x \times d_z$ binary matrices for each syndrome measurement round. For example, the encoding may resemble matrices which are filled with 'ones' for rounds 1 and $d_m$ (e.g., the first and last rounds of syndrome measurements), and filled with 'zeros' for rounds of syndrome measurements in between (e.g., rounds 2 to $d_m-1$).

As introduced above, output targets in "trainY" may contain the locations of X and Z data errors afflicting data qubits of a given measurement results volume for syndrome measurement rounds 1 to $d_m$ that the local neural network decoder is attempting to predict during training. As "trainY" may contain the locations of actual data errors afflicting data qubits within the simulated measurement results volume, "trainY" may be referred to as ground truth information to be used during a supervised learning technique such as those described herein, and predicted data errors, decoded by the local neural network decoder during training, may be referred to as "alleged" data errors until the alleged data errors are verified and/or compared against the actual data errors in "trainY." Such locations may be stored in "trainY" in a tensor of shape (m, $d_x$, $d_z$, $d_m$, 2). In some embodiments, in order for the data stored in "trainY" to be compatible with "trainX," changes in data qubit errors between consecutive syndrome measurement rounds are tracked rather than the data qubit errors themselves in each round, since "trainX" tracks changes in syndrome measurement outcomes between consecutive rounds (see the description for syndrome differences, and inputs to "trainX" $s_X^{diff}(d_m)$ and $s_Z^{diff}(d_m)$ described above). Tracking changes in data qubit errors may also ensure that the average error densities are independent of the number of syndrome measurement rounds, according to some embodiments. This is advantageous, as otherwise, the number of syndrome measurement rounds needed to train such local neural network decoders would be very large in order for said networks to generalize well to arbitrary values of $d_m$. Tracking changes in data qubit errors between rounds reduces the number of syndrome measurement rounds needed to effectively train such local neural network decoders, according to some embodiments.

A further implementation parameter that may be considered in the process of training a local neural network decoder such as those described herein is a homological equivalence convention for errors. In some embodiments, when performing Monte Carlo simulations to collect and prepare training data samples for training the local neural network decoder, there may be cases in which two errors, such as errors $E_1$ and $E_2$, have the same syndrome (e.g., $s(E_1)=s(E_2)$), with $E_1 E_2 = g$ and where g is in the stabilizer group of the surface code. In such embodiments, $E_1$ and $E_2$ may be considered to be homologically equivalent for a given surface code $\mathcal{C}$ if $s(E_1)=s(E_2)$, and $E_1 E_2 \in \mathcal{S}$, wherein $\mathcal{S}$ is the stabilizer group of $\mathcal{C}$ (e.g., $E_1$ and $E_2$ are homologically equivalent for a code $\mathcal{C}$ if $E_1$ and $E_2$ have the same error syndrome, and are identical up to products of stabilizers). Determining a particular convention and/or fixed choice for representing homologically equivalent errors in "trainY," such as the example errors $E_1$ and $E_2$, may lead to significant performance improvements of the local neural network decoder. (Such a convention is further described with regard to FIGS. 9A and 9B below.)

For a given training sample of the m training samples in "trainY" with a tensor of shape (m, $d_x$, $d_z$, $d_m$, 2), the first channel may consist of $d_m$ binary d×d matrices $M_e^{(X(\alpha,\beta))}(j)$, with $1 \leq j \leq d_m$ being the label for a particular syndrome measurement round, and $\alpha, \beta \in \{1, 2, \ldots, d\}$ labeling the data qubit coordinates in the given surface code lattice. As "trainY" tracks changes in data qubit errors between consecutive syndrome measurement rounds (see the description for syndrome differences herein), $M_e^{(X(\alpha,\beta))}(j)=1$ if the data qubit at coordinate $(\alpha,\beta)$ has a change in an X or Y error between rounds j−1 and j, and is zero otherwise, according to some embodiments. Similarly, the second channel of "trainY" consists of $d_m$ binary d×d matrices $M_e^{(X(\alpha,\beta))}(j)$, which tracks changes of Z or Y data qubit errors between consecutive syndrome measurement rounds.

FIGS. 9A and 9B illustrate a homological equivalence convention used for X-type and Z-type errors, respectively, according to some embodiments.

In some embodiments, examples of how a homological equivalence convention may be determined for training a local neural network decoder and subsequently applied to a given surface code (e.g., surface codes 900 and 920) are described in embodiments shown in FIGS. 9A and 9B. For example, in FIG. 9A, a given weight-4, X-type stabilizer may be represented by $g_k^{(X)}$, with $1 \leq k \leq (d^2-1)/2$, and the data qubit in the top left corner of said stabilizer may be represented by $(\alpha,\beta)$. Any weight-3 X error, with support on $g_k^{(X)}$, may be reduced to a weight-one error by multiplying the error by $g_k^{(X)}$. Similarly, a weight-4 X error with support on $g_k^{(X)}$ is equal to $g_k^{(X)}$) and can thus be removed entirely. Weight-2 X errors at weight-2 X-type stabilizers along the top and bottom boundaries of the given surface code lattice may also be removed. For ease of discussion herein, such weight-reduction transformations may be referred to as "weightReductionX" functions, which apply the weight-reduction transformations described above to each stabilizer. A given homological equivalence convention may also include equivalence conventions, such as those described in the following paragraphs. Also for each of discussion herein, such equivalence transformations may be referred to as "fixEquivalenceX" functions.

In some embodiments, "fixEquivalenceX" transformations may include the following transformations, wherein $E_x$ may be assumed to be a weight-2 X error with support on a weight-4 stabilizer $g_k^{(X)}$ of surface code 900, wherein the top left qubit of the given stabilizer has coordinates $(\alpha,\beta)$:

Suppose $E_x$ has support at the coordinates $(\alpha+1, \beta)$ and $(\alpha+1,\beta+1)$. Then "fixEquivalenceX" may map $E_x$ to a weight-2 error at coordinates $(\alpha,\beta)$ and $(\alpha,\beta+1)$. Thus, horizontal X errors at the bottom of $g_k^{(X)}$ are mapped to horizontal X errors at the top of $g_k^{(X)}$.

Suppose $E_x$ has support at the coordinates $(\alpha,\beta)$ and $(\alpha+1, \beta)$. Then "fixEquivalenceX" may map $E_x$ to a weight-2 error at coordinates $(\alpha,\beta+1)$ and $(\alpha+1,\beta+1)$. Thus, vertical X errors at the left of $g_k^{(X)}$ are mapped to vertical X errors at the right of $g_k^{(X)}$.

Suppose $E_x$ has support at the coordinates $(\alpha,\beta)$ and $(\alpha+1,\beta+1)$. Then "fixEquivalenceX" may map $E_x$ to a weight-2 error at coordinates $(\alpha,\beta+1)$ and $(\alpha+1, \beta)$. Thus, diagonal X errors from the top left to bottom right of $g_k^{(X)}$ are mapped to diagonal X errors at the top right to bottom left of $g_k^{(X)}$.

Further embodiments of "fixEquivalenceX" transformations may include the following additional transformations, wherein $g_k^{(X)}$ is assumed to be a weight-2 X-type stabilizer along the top boundary of surface code 900, with the left-most qubit in its support having coordinates $(\alpha,\beta)$.

- If $E_x$ is a weight-1 error at coordinates $(\alpha,\beta+1)$, "fixEquivalenceX" may map $E_x$ to a weight-1 error at coordinates $(\alpha,\beta)$.
- If $g_k^{(X)}$ is a weight-2 X-type stabilizer along the bottom of the surface code lattice with the left-most qubit in its support having coordinates $(\alpha,\beta)$, and $E_x$ is a weight-1 error at coordinates $(\alpha,\beta)$, then "fixEquivalenceX" may map $E_x$ to a weight-1 error at coordinates $(\alpha,\beta+1)$.

In some embodiments, "weightReductionX" and "fixEquivalenceX" functions may be applied to all X-type stabilizers of the given surface code lattice in each syndrome measurement round. It follows that the "weightReductionX" function may be applied first, then the "fixEquivalenceX" function, for efficiency purposes, according to some embodiments. For ease of discussion herein, such an application process of "weightReductionX" and "fixEquivalenceX" functions may be referred to collectively as a "simplifyX" function, wherein "weightReductionX" and "fixEquivalenceX" functions are applied to all X-type stabilizers of the given surface code lattice in each syndrome measurement round, with $E_x$ errors in round $1 \le j \le d_m$ being described by the binary matrix $M_e^{(X(\alpha,\beta))}(j)$ for all $(\alpha,\beta)$ data-qubit coordinates. As such, "simplifyX" may map matrices $M_e^{(X(\alpha,\beta))}(j)$ to homologically equivalent matrices $\tilde{M}_e^{(X(\alpha,\beta))}(j)$ using the "weightReductionX" and "fixEquivalenceX" transformation functions described above. In some embodiments, the homological equivalence convention for X data qubit errors may be implemented by repeatedly calling the "simplifyX" function until all matrices $M_e^{(X(\alpha,\beta))}(j)$ satisfy the condition $$simplifyX\left(M_e^{(X(\alpha,\beta))}(j)\right) = M_e^{(X(\alpha,\beta))}(j)$$

for all syndrome measurement rounds j and data qubit coordinates $(\alpha,\beta)$.

In some embodiments, similar functions, referred to herein for ease of discussion as "weightReductionZ," which may reduce the weights of Z errors at each Z-type stabilizer in a given surface code lattice (e.g., surface code 920), and "fixEquivalenceZ," which may be chosen such that it is rotationally symmetric to the function "fixEquivalenceX" under a 90-degree rotation of the surface code lattice, may also be defined as part of the given homological equivalence convention used when training the given local neural network decoder. In such embodiments, the homological equivalence convention for Z data qubit errors may be implemented by repeatedly calling the "simplifyZ" function (which may map matrices $M_e^{(Z(\alpha,\beta))}(j)$ to homologically equivalent matrices $\tilde{M}_e^{(Z(\alpha,\beta))}(j)$ using the "weightReductionZ" and "fixEquivalenceZ" transformation functions) until all matrices $M_e^{(Z(\alpha,\beta))}(j)$ satisfy the condition $$simplifyZ\left(M_e^{(Z(\alpha,\beta))}(j)\right) = M_e^{(Z(\alpha,\beta))}(j)$$

for all syndrome measurement rounds j and data qubit coordinates $(\alpha,\beta)$.

Errors which may be invariant under transformations of the "simplifyX" and "simplifyZ" functions are shown in FIGS. 9A and 9B, respectively. Examples of errors within surface code 900 which may be invariant under the transformations of the "simplifyX" function are highlighted by dashed lines 902, 904, 906, 908, and 910. Examples of errors within surface code 920 which may be invariant under the transformations of "simplifyZ" are highlighted by dashed lines 922, 924, 926, 928, and 930.

A person having ordinary skill in the art should understand that the example embodiments of "weightReductionX," "weightReductionZ," "fixEquivalenceX," and "fixEquivalenceZ" described above are not meant to be limiting, and that other combinations of homological equivalence conventions may be applied for the methods and techniques described herein. Furthermore, in practice, a homological equivalence convention, such as those discussed herein, may be determined during training of a local neural network decoder and subsequently applied to ground truth information, such as "trainY" discussed herein, in order for a local neural network decoder to more efficiently learn relationships between syndromes and errors within a given training data set, according to some embodiments.

Further considerations when training a local neural network decoder that may influence performance, in addition to the neural network architecture (see the descriptions for FIGS. 4 and 5 herein) and to how the training data is represented in "trainX" and "trainY," as discussed above, may also pertain to the depolarizing error rate p used to generate the training data, and to the size of the input volume $(d'_x, d'_z, d'_m)$. For example, the local receptive field of the neural network architectures shown in FIGS. 4 and 5 is 9×9×9. As such, in some embodiments the input volume $(d'_x, d'_z, d'_m)$. may then have a size of (13,13,18) to allow the local neural network decoder to see spatial and temporal data located purely in the bulk of the measurement results volume (e.g., without being influenced by boundary effects). A person having ordinary skill in the art should understand that an input volume with a size of (13,13,18) is meant to be an example embodiment of an input volume for a local receptive field of 9×9×9. Other combinations of local receptive fields and/or input volume sizes may be used to train such local neural network decoders and are meant to be encompassed in the description herein as well.

FIG. 10 is a flow diagram illustrating a process of training a local neural network decoder to be used to perform error correction for a surface code, according to some embodiments.

In some embodiments, the methods and techniques for training a local neural network decoder may resemble the process shown in FIG. 10. In block 1000, a local decoder may be trained such that it may be used to perform error correction on arbitrarily-sized measurement results volumes and account for circuit-level noise. As discussed above, as the local neural network decoder may compare the results it obtains using "trainX" to the output targets in "trainY," techniques described herein for training the local decoder may resemble a supervised learning process, according to some embodiments. A person having ordinary skill in the art should understand that while simulated measurement results volumes (e.g., training data sets) used to train local neural network decoders such as those described herein may have given dimensions (e.g., given surface code dimensions, a given number of rounds of syndrome measurements, etc.), this is not meant to be restrictive in terms of the measurement results volume sizes that the trained local neural network decoder (e.g., post-training via methods and techniques for training local neural network decoders described herein) may be used for in implementation. An effect of applying the methods and techniques described herein for training local neural network decoders is such that the trained local neural network decoders may be used for arbitrarily-sized measurement results volumes.

In block 1002, a neural network architecture, such as those shown in FIGS. 4 and 5 herein, is determined with the purpose of accounting for circuit-level noise. The neural network architecture may resemble the architectures shown in FIGS. 4 and 5, or another neural network architecture that may achieve this purpose (e.g., typically with 6 layers or more). In block 1004, the chosen neural network architecture is provided the inputs of "trainX," including training data samples, syndrome difference histories $s_X^{diff}(d_m)$ and $s_Z^{diff}(d_m)$, matrices enc(X) and enc(Z), and the temporal boundaries of the given measurement results volume with dimensions ($d_x$, $d_z$, $d_m$), according to some embodiments. In block 1006, the local neural network decoder makes predictions as to where errors on data qubits are located within the measurement results volume. Such predictions may be referred to as "alleged" error predictions, as the local neural network decoder then compares these alleged error predictions to ground truth information in "trainY." In block 1008, these predictions are compared to the output targets in "trainY." In some embodiments, this process described by blocks 1000-1008 may be repeated multiple times and/or on multiple training data sets such that the local neural network decoder may be pre-trained for arbitrary measurement results volume sizes. In block 1010, a local neural network decoder that has been trained via methods and techniques described in blocks 1000-1008 may then be provided for use in performing error correction for rounds of syndrome measurements of arbitrarily-sized measurement results volumes.

In some embodiments, local neural network decoders may be implemented using classical computing hardware, as neural network evaluations involve little conditional logic, and therefore may maximize the use of pipelined data pathways. However, due to costs and design implementation considerations of many current hardware architectures, such as slow design iteration, custom manufacturing, bounded size, and integration with existing electronics, selection of such classical computing hardware may require special consideration. In some embodiments, candidate technologies for implementation of local neural network decoders may include application-specific integrated circuits (ASICs) and/or Field-Programmable Gate Arrays (FPGAs).

Using application-specific integrated circuits (ASICs) allow the implementation of local neural network decoders to perform on time scales sufficient for running quantum algorithms, such as those discussed herein. FPGAs may be used for neural network evaluation as well. An FPGA may include a set of components, such as flip-flops, look-up tables (LUTs), block RAM (BRAM), configurable logic blocks (CLBs), and digital signal processing (DSP) slices, each of whose inputs may be selectively routed into one another to perform complex computations ranging from fixed high-performance arithmetic circuits to entire programmable processors.

In addition, a person having ordinary skill in the art should understand that computing devices, such as computing device 2000, may be used to generate training data sets (e.g., via Monte Carlo simulations) that may be used to train local neural network decoders such as those described herein. The same or difference computing devices, such as the classical computing hardware described above, may then be used to implement trained local neural network decoders. Furthermore, same and/or additional computing devices, such as additional implementations of computing device 2000, may be used to perform error correction for arbitrarily-sized measurement results volumes using a local and global decoding scheme such as those described herein.

Removing Vertical Pairs of Highlighted Vertices Following a Local Decoding Error Correction Step In some embodiments, decoding portions of the measurement results volume via a local neural network decoder (e.g., in the process described with regard to block 102) may contribute to the creation of pairs of highlighted vertices in the matching graph (e.g., see the description for matching graph G, which may be used to implement minimum-weight perfect-matching during the global decoding step herein). Such creation of pairs of highlighted vertices may be a result of the local decoder correctly identifying and correcting given errors via syndrome difference information (e.g., such as the CNOT gate failure described in FIGS. 11A-11E). However, the following methods and techniques for treating the resulting vertical pairs of highlighted vertices may be used prior to decoding the measurement results volume via a global decoder in order to reduce the syndrome density prior to commencing the global decoding step. FIGS. 11A-11E illustrate an example of such a creation of a vertical pair of highlighted vertices due to the local neural network decoder correctly identifying a CNOT gate failure. Following the below description of how such pairs may be created due to the local decoding step, two methods for removing said vertical pairs prior to commencing the global decoding step are then described, namely syndrome collapse and vertical cleanup.

FIG. 11A illustrates a hypothetical example of having a failure of a CNOT gate during a given round j of syndrome measurements for the surface code shown in the figure, according to some embodiments.

FIG. 11A illustrates a given surface code 1100 at a given round j of syndrome measurements made to surface code 1100. Surface code 1100 contains data qubits, such as data qubits 1102 and 1110, and ancilla qubits, such as ancilla qubits 1104, 1112, and 1114, and contains X-type stabilizers, such as X-type stabilizer 1108, and Z-type stabilizers, such as Z-type stabilizer 1106. Also shown in FIG. 11A are timesteps (e.g., labels 2, 3, 4, and 5) during which CNOT gates (e.g., CNOT gates 1116 and 1118) are measured within a given stabilizer (e.g., CNOT gate 1116 is measured at timestep 2 and CNOT gate 1118 is measured at timestep 5).

The series of figures demonstrated in FIGS. 11A-11E follow a hypothetical example in which CNOT gate 1116 fails during timestep 2 during round j of the given Z-type stabilizer measurement. The failure of the CNOT gate 1116 measurement during timestep 2 between ancilla qubit 1112 and data qubit 1110 results in an X⊗I error in the j'th syndrome measurement round, and in an X error on data qubit 1110. However, given the timestep orderings of the CNOT gate measurements shown in FIG. 11A, the X error on data qubit 1110 will be detected via the CNOT gate 1118 measurement during timestep 5 between ancilla qubit 1114 and data qubit 1110 during j'th syndrome measurement round (e.g., the error is detected by the Z-type stabilizer with ancilla qubit 1114, and not by the Z-type stabilizer with ancilla qubit 1112). This error detection is marked by the dashed circle surrounding ancilla qubit 1114 in FIG. 11A. This is referred to as a "highlighted" vertex herein. As it will be shown in FIGS. 11B-11E, having a local neural network decoder correctly identify the failure of the CNOT gate 1116 using syndrome information gathered during rounds j and j+1 may lead to a pair of highlighted vertices (shown in FIG. 11E).

FIG. 11B illustrates the propagation of the CNOT gate failure, introduced in FIG. 11A, into round j+1 of the syndrome measurements for the surface code, according to some embodiments.

As illustrated by surface code at round j+1 1120 in FIG. 11B, the X error on data qubit 1110 caused by the failure of CNOT gate 1116 during the j'th syndrome measurement round is detected both by the Z-type stabilizer with ancilla qubit 1114 and by the Z-type stabilizer with ancilla qubit 1112 in round j+1. This error detection is marked by dashed circles surrounding ancilla qubit 1112 and ancilla qubit 1114 in FIG. 11B, also marking said ancilla qubits as highlighted vertices. In some embodiments, such a failure mechanism may be referred to as a space-time correlated error.

FIG. 11C illustrates a subset of a matching graph corresponding to the surface code shown in FIG. 11A following round j of the syndrome measurements, according to some embodiments.

In subset of matching graph 1122, the X error on data qubit 1110 during the j'th syndrome measurement round is marked on the lower edge of the subset, and ancilla qubit 1114 is marked as a highlighted vertex. (Note that the dashed lines in the upper half of subset of matching graph 1122 are meant to emphasize the focus on round j in FIG. 11C. FIG. 11D focuses on the effect in the matching graph when the error is propagated through round j+1.) As described above, a vertex (e.g., vertex 1114 in FIG. 11C) in matching graph G associated with the stabilizer $g_k$ is highlighted in round j if the measurement outcome of $g_k$ changes from rounds j−1 to j.

FIG. 11D illustrates the subset of the matching graph following round j+1 of the syndrome measurements, according to some embodiments.

In subset of matching graph 1124, in addition to the X error marked on the lower edge of the subset corresponding to round j, an additional X error is marked on the upper edge of the subset to represent the propagation of the CNOT gate failure into round j+1. From the perspective of the local neural network decoder, after receiving said information about measurements that took place during round j+1, the local neural network decoder may now correctly identify the fault pattern described in FIGS. 11A-11D and remove the X error on data qubit 1110 (via the process described in FIG. 11E below).

FIG. 11E illustrates the subset of the matching graph following an error correction made by a local decoder, resulting in the creation of a vertical pair of highlighted vertices, according to some embodiments.

Subset of matching graph 1126 shows how matching graph G may transform after the local neural network decoder applies an error correction to the X error on data qubit 1110. As the local neural network decoder identifies that the given X error seen in both rounds j and j+1 is due to CNOT gate 1116, the highlighted vertices are transformed such that ancilla qubit 1112 is highlighted both in rounds j and j+1, forming a vertical pair of highlighted vertices. The reader may note that even though the local neural network decoder has made a correct error correction, the pair of highlighted vertices are still formed (and the syndrome density may not be reduced as a consequence of this particular type of space-time error detection). Furthermore, in some embodiments, since the local neural network decoder may receive information about syndrome differences of multiple rounds of syndrome measurements at once (e.g., as defined by volume size ($d'_x$, $d'_z$, $d'_m$)), the local decoder may perform a correction on a given data qubit in a round before the error actually occurs as part of a pattern recognition technique (e.g., a pattern that may extend into a second set of rounds of syndrome measurements that may not be "viewed" at the same time as a first set of rounds of syndrome measurements due at least in part to a volume size ($d'_x$, $d'_z$, $d'_m$) of the local decoder), leading to the creation of a vertical pair of highlighted vertices.

In some embodiments, the creation of vertical pairs arising from a correction performed by the local neural network decoder due to a two-qubit gate failure, such as a series described in FIGS. 11A-11E, is intrinsic to circuit-level noise for a given surface code. Therefore, in order to reduce the syndrome density before the global decoder step (e.g., the process described in block 106), it may be advantageous to apply syndrome collapse and/or vertical cleanup in order to remove vertical pairs of highlighted vertices, as described in the following paragraphs.

Removing Vertical Pairs of Highlighted Vertices: Performing Syndrome Collapse by Sheets FIGS. 12A-C illustrate a visual representation of performing syndrome collapse by sheets for a given measurement results volume in order to treat vertical pairs of highlighted vertices, according to some embodiments.

Figure 12C:
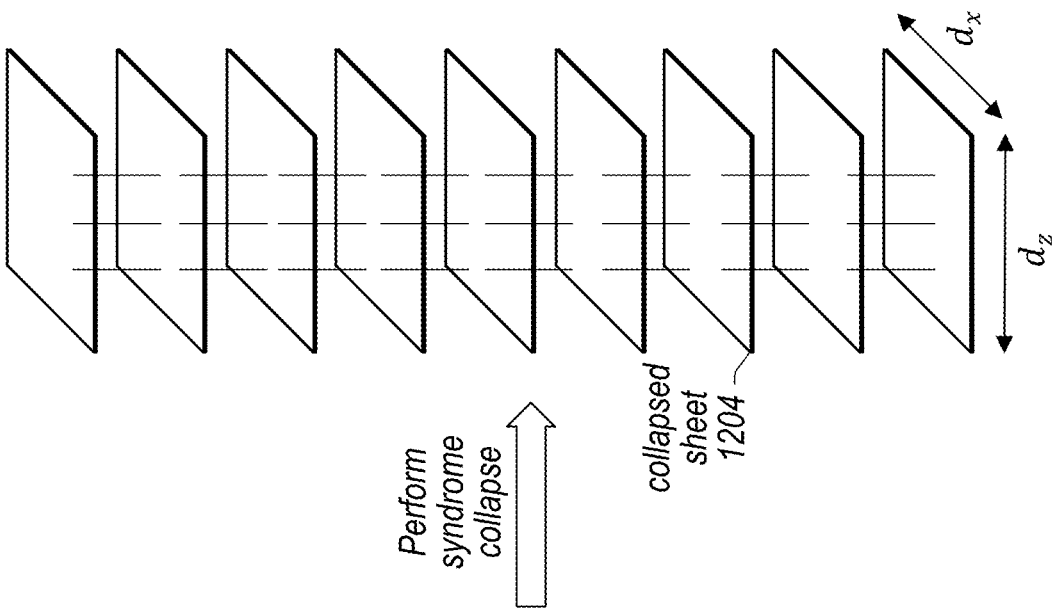
FIGS. 12A-C illustrate a visual representation of performing syndrome collapse by sheets for a given measurement results volume in order to treat vertical pairs of highlighted vertices, according to some embodiments.
Figure 12B:
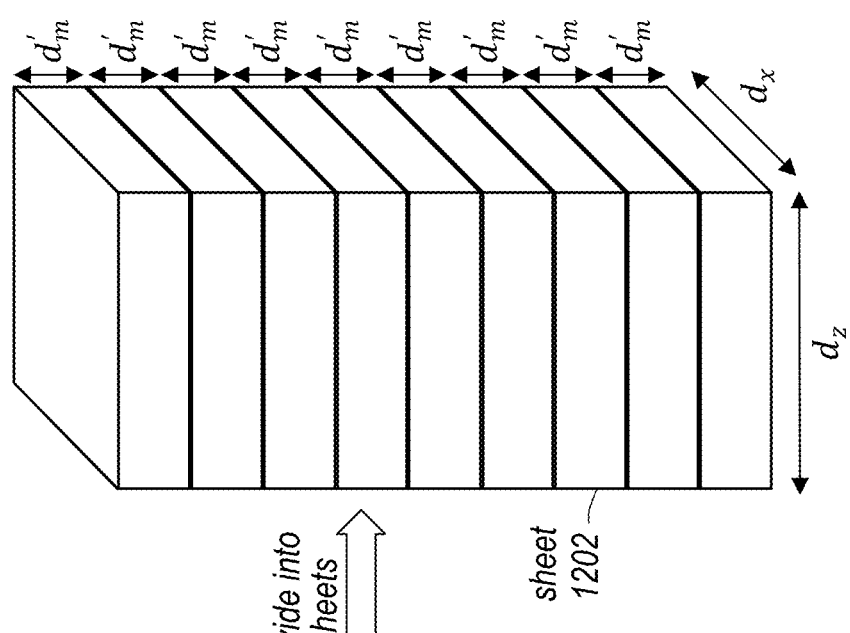
Figure 12A:
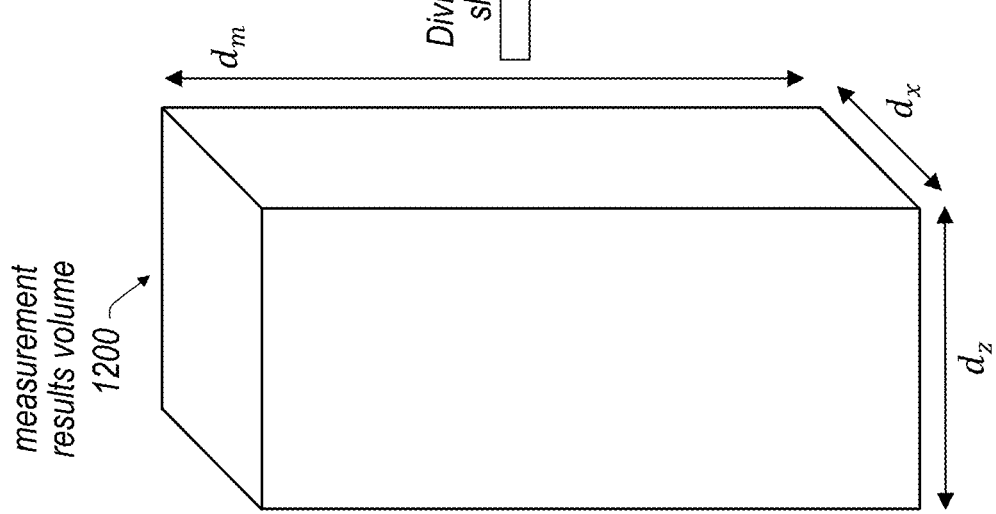

In FIG. 12A, measurement results volume 1200 has dimensions ($d_x$, $d_z$, $d_m$), and it may be assumed that a first error correction by a local neural network decoder has already been made (e.g., via a process step such as that described in block 102). As a first step in the process of performing syndrome collapse, measurement results volume 1200 may be divided into sheets (e.g., sheet 1202) with dimensions of ($d_x$, $d_z$, $d'_m$), respectively, as shown in FIG. 12B. In some embodiments, the temporal dimension $d'_m$ may correspond to a given number of hidden layers in the chosen neural network architecture (see the description for FIGS. 4 and 5 herein), and/or may be tuned as an optimization of the process of syndrome collapse.

As a second step in the process of performing syndrome collapse, each sheet may then be "collapsed" into collapsed sheets (e.g., collapsed sheet 1204). "Collapsing," or "compressing," the sheets may refer to adding all of the syndromes in the given sheet modulo 2, as described in the following paragraphs, which may cause vertical pairs of highlighted vertices to be removed. Note that vertical pairs of highlighted vertices (e.g., corresponding highlighted vertices that are temporally separated by one round of syndrome measurements) within a given sheet may be removed via this process of collapsing the sheets in addition to one or more other types of vertically-separated pairs of highlighted vertices (e.g., corresponding highlighted vertices that are temporally separated by more than one round of syndrome measurements that still are within a given sheet).

In some embodiments, the procedure visually demonstrated in FIGS. 12A-12C may be further explained by considering that the syndrome difference $s_x^{diff}$ ($d_m$) may be defined as $s_X^{diff}(d_m)=(e_X^{(1)}\ \tilde{e}_X^{(2)}\ \ldots\ \tilde{e}_X^{(d_m)})$ and that $d_m=\gamma d'_m$ for some integer $\gamma$. Syndrome difference $s_X^{diff}(d_m)$ may then be partitioned as:

$$s_X^{diff}(d_m)=(e_X^{(1)}\tilde{e}_X^{(2)}\ \ldots\ \tilde{e}_X^{(d_m)}|\tilde{e}_X^{(d_m+1)}\ \ldots$$
$$\tilde{e}_X^{(2d'_m)}|\ \ldots\ |\tilde{e}_X^{(d_m-d'_m+1)}\ \ldots\ \tilde{e}_X^{(d_m)}),$$

A syndrome collapse by sheets of size $d'_m$ (e.g., sheet 1202) transforms $S_X^{diff}(d_m)$ as $$\bar{s}_X^{diff}(d_m)=\left(\bar{e}_X^{(1)}\bar{e}_X^{(2)}\ \ldots\ \bar{e}_X^{(\gamma)}\right),$$

where $$\bar{e}_X^{(j)}=\bigoplus_{i=1}^{d'_m}\tilde{e}_X^{((j-1)d'_m+i)},$$

with the sum being performed modulo 2. (In embodiments in which j=1, the first term in the above equation becomes $e_X^{(1)}$.) In some embodiments in which $d_m$ is not a multiple of $d'_m$, there may be $[d_m/d'_m]$ sheets, with the last sheet having size $d_m-\beta d'_m$, where $\beta=[d_m/d'_m]$. A person having ordinary skill in the art should understand that the above steps may also be applied for the transformation of syndrome difference $s_Z^{diff}(d_m)$.

In some embodiments, performing a syndrome collapse by sheets may reduce the size of the original matching graph G (e.g., matching graph G prior to the syndrome collapse procedure) since G contained $d_m$ sheets prior to performing the collapse. For ease of description herein, the matching graph after performing syndrome collapse may be referred to as $G_{sc}$. In the following paragraphs, FIGS. 13A and 13B demonstrate how performing syndrome collapse may remove vertical pairs, and how performing syndrome collapse without first performing error correction via a local neural network decoder may result in a logical error (as this would remove the global decoder's ability to correct errors in the $G_{sc}$ matching graph that are temporally separated).

FIG. 13A illustrates a subset of a matching graph following an error correction made by a local decoder to which syndrome collapse is applied in order to treat vertical pairs of highlighted vertices that were generated, at least in part, due to the error correction made by the local decoder, according to some embodiments. FIG. 13B illustrates a subset of a matching graph that has not been subjected to error correction made by a local decoder prior to the use of syndrome collapse to treat vertical pairs of highlighted vertices, resulting in a logical X-type error after the syndrome collapse is performed, according to some embodiments.

FIG. 13A demonstrates syndrome collapse being performed onto subset of matching graph 1300 after a local decoding step via a local neural network decoder, according to some embodiments. As shown in the figure, 5 rounds of syndrome measurements are being collapsed into a sheet (see the description for FIGS. 12A-12C herein), resulting in a temporal sheet dimension of 5 rounds. Horizontal edges (e.g., edge 1304) of subset of matching graph 1300 correspond to data qubits of the given surface code, and vertices (e.g., vertices 1306, 1308, 1310, 1312, and 1314) of subset of matching graph 1300 correspond to stabilizer measurement outcomes. The squares (e.g., square 1302) correspond to boundary vertices connected by edges of zero weight. As shown in FIG. 13A, there are two vertical pairs of highlighted vertices: vertices 1306 and 1308, and vertices 1310 and 1312, and data qubit error (e.g., the edge marked by an 'X') may be part of a chosen minimum-weight path (e.g., marked by the thicker gray edge) to be corrected by a global decoder. After performing syndrome collapse, the two sets of vertical pairs are removed, leaving only highlighted vertex 1314. The remaining error may be corrected during a global decoding stage, such as by minimum-weight perfect-matching.

Furthermore, by performing syndrome collapse on a given surface code of distance d after the application of the local neural network decoder, with $d'_m=\mathcal{O}(d_{eff})$ (wherein $d_{eff}$ is the effective distance of the local neural network decoder which depends on the local receptive field and size of the volume that the local neural network decoder was trained on), syndrome collapse may result in a global effective distance which is equal or close to d, according to some embodiments. This results from the assumption that errors contained within each sheet arising from less than or equal to $(d_{eff}-1)/2$ faults are removed by the local neural network decoder using the methods and techniques described herein, resulting in a faster overall decoding time.

FIG. 13B demonstrates syndrome collapse being performed onto subset of matching graph 1320 without having first performed error correction by a local neural network decoder. As shown in the figure, a sequence of X data qubit errors which are temporally separated (e.g., edges marked by 'X') may be paired together in a minimum-weight path (e.g., marked by the thicker gray edges), effectively correcting the X data qubit errors. After performing syndrome collapse to subset of matching graph 1320, however, the global decoder error correction results in a logical X error.

Figure 14:
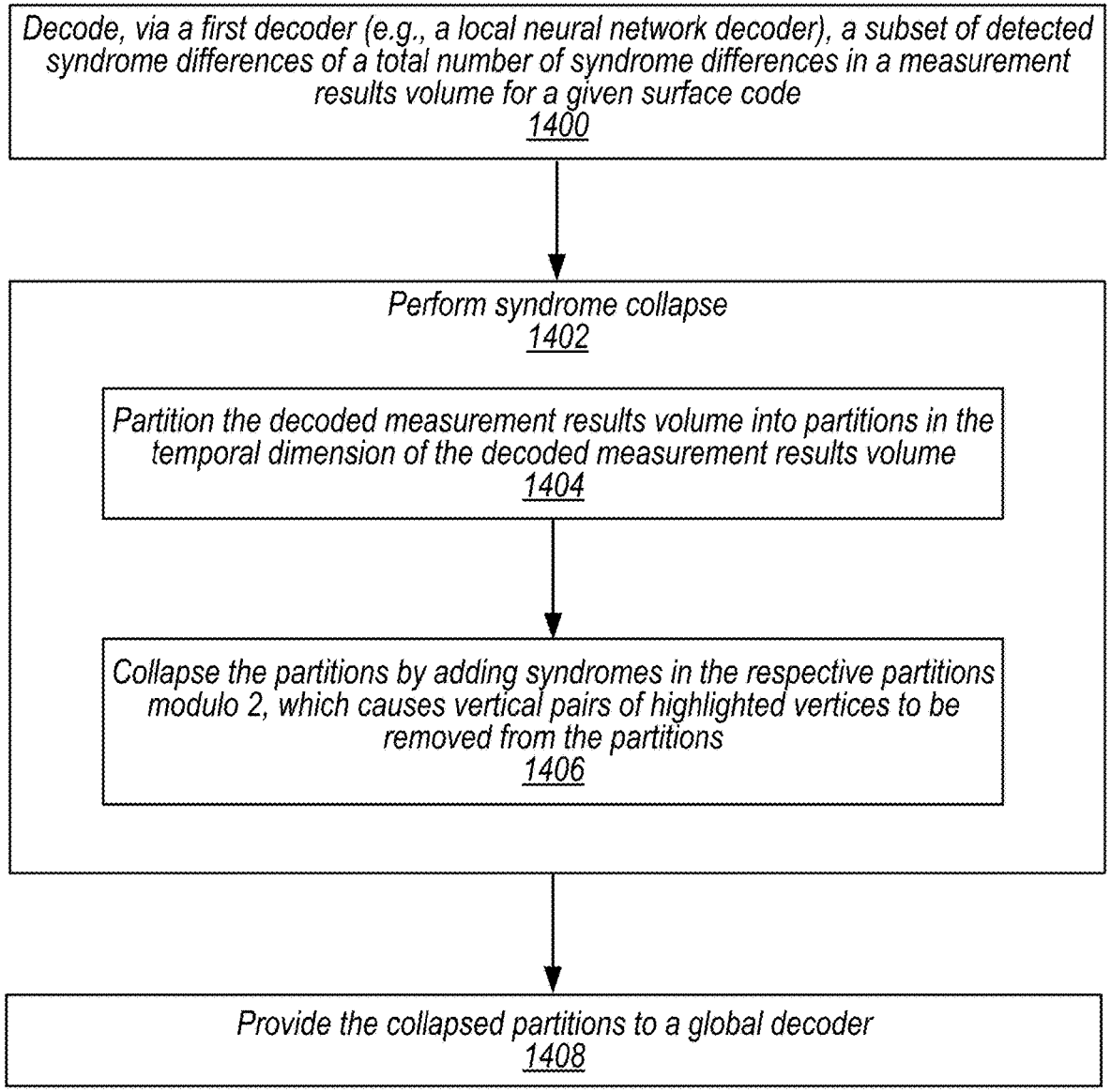
FIG. 14 is flow diagram illustrating a process of performing syndrome collapse by sheets for a given measurement results volume in order to treat vertical pairs of highlighted vertices, according to some embodiments.

FIG. 14 is flow diagram illustrating a process of performing syndrome collapse by sheets for a given measurement results volume in order to treat vertical pairs of highlighted vertices, according to some embodiments.

In block 1400, a measurement results volume is decoded via a decoder (e.g., a local neural network decoder), such as those discussed herein with regard to at least FIGS. 1-10. In some embodiments, the decoder may resemble a local neural network decoder, or other embodiments of one or more decoders which may be configured to perform error correction for surface codes. In block 1402, syndrome collapse is performed to remove vertical pairs of highlighted vertices before the resulting matching graph is provided to a global decoder. Such vertical pairs of highlighted vertices may have been generated during a local neural network decoding stage, such as in the example embodiments shown in FIGS. 11A-11E and in block 1400.

A process of performing syndrome collapse may resemble processes such as those shown in blocks 1404 and 1406 and the visual steps shown in FIGS. 12A-12C and 13A, according to some embodiments. In block 1404, a measurement results volume with dimensions $(d_x, d_z, d_m)$ may be partitioned into partitions (e.g., sheets) of said volume, each with dimensions $(d_x, d_z, d'_m)$. In block 1406, the sheets may then be collapsed by adding syndromes in the respective sheets modulo 2, as discussed above, with the effect of said collapsing being that vertical pairs of highlighted vertices are removed from the partitions (e.g., see the description for FIG. 13A herein). Finally, in block 1410, the resulting collapsed partitions (with vertical pairs of highlighted vertices removed) may be provided to a global decoder (e.g., a minimum-weight perfect-matching decoding protocol). As discussed above, the process of performing syndrome collapse (e.g., blocks 1402-1406) may reduce the syndrome density, allowed for a faster and more efficient global decoding stage, and may also reduce a size of a matching graph (e.g., due to a collapsing of the sheets) with respect to a matching graph provided by a decoder described in block 1400.

Removing Vertical Pairs of Highlighted Vertices: Performing Vertical Cleanup

Figure 15:
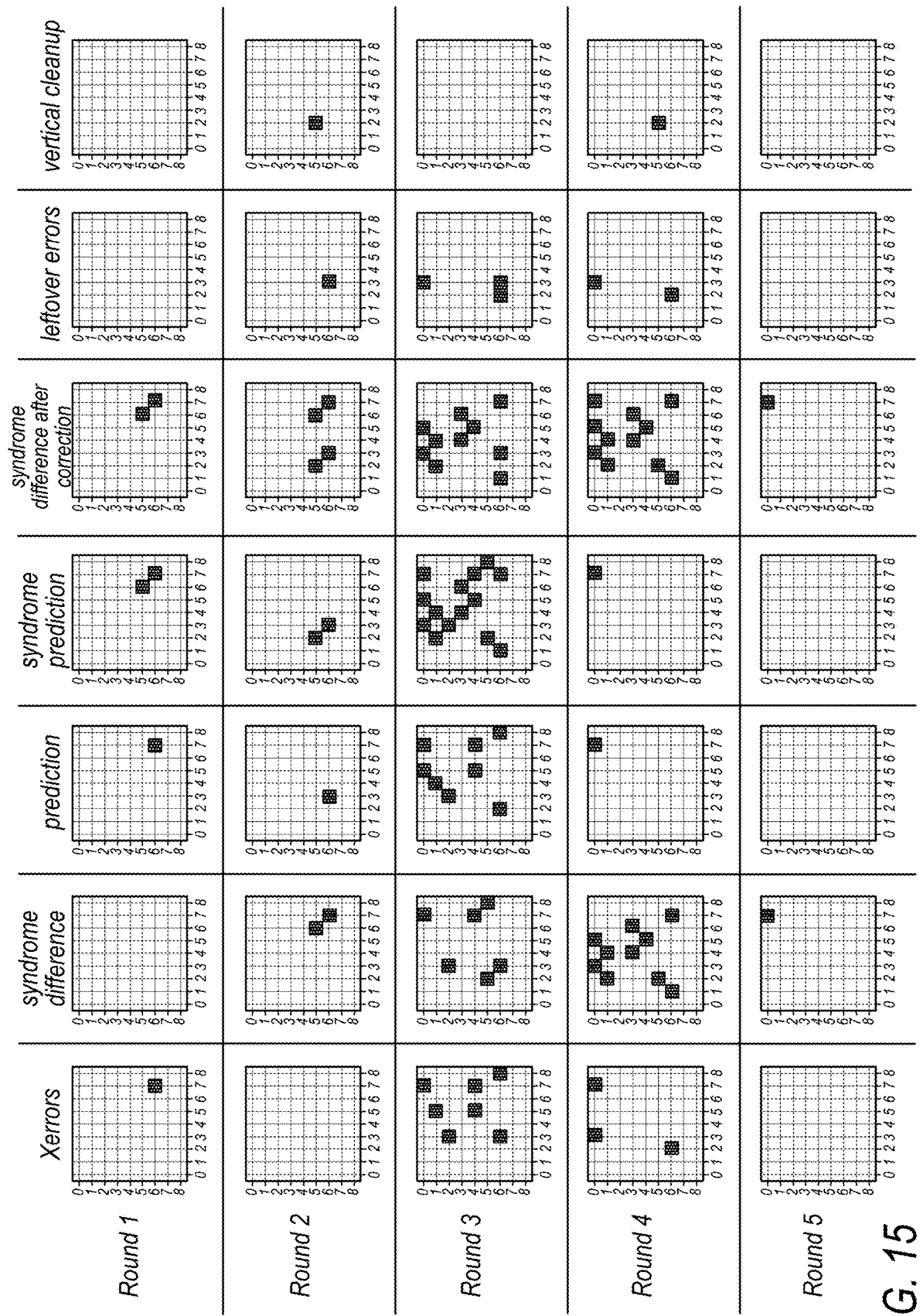
FIG. 15 illustrates performing vertical cleanup, following an error correction by a local decoder, for a given measurement results volume in order to treat vertical pairs of highlighted vertices, according to some embodiments.

FIG. 15 illustrates performing vertical cleanup, following an error correction by a local decoder, for a given measurement results volume in order to treat vertical pairs of highlighted vertices, according to some embodiments.

In some embodiments, vertical pairs of highlighted vertices may also be corrected using vertical cleanup. FIG. 15 demonstrates an example of the use of the 11-layer neural network architecture, shown in FIG. 5, as a trained local decoder. In the figure, each row contains a series of plots corresponding to a syndrome measurement round (e.g., the top row corresponds to round 1, the bottom row corresponds to round 5, etc.) for X-type Pauli errors occurring in a given $d_x = d_z = d = 9$ surface code for 5 consecutive syndrome measurement rounds.

The first column of FIG. 15 (labeled 'Xerrors') marks changes in X data qubit errors from the previous round. The second column (labeled 'syndrome difference') marks changes in observed syndromes from the previous round. The third column (labeled 'prediction') provides the correction applied by the local neural network decoder during the local decoding stage (e.g., as shown by at least FIGS. 11A-11E herein). The fourth column (labeled 'syndrome prediction') corresponds to the syndrome compatible with the applied correction. The fifth column (labeled 'syndrome difference after correction') shows the remaining syndromes after the correction has been applied. The sixth column (labeled 'leftover errors') shows any remaining X data qubit errors after the correction has been applied. In some embodiments, some pairs of X data qubit errors in the sixth column may be identified as being vertical pairs of highlighted vertices. The seventh column (labeled 'vertical cleanup') shows the remaining syndromes after all vertical pairs of highlighted vertices have been removed during the process of vertical cleanup. As described above, vertical pairs may be formed when the vertex associated with the measurement of a stabilizer $g_i$ is highlighted in two consecutive syndrome measurement rounds during error correction (e.g., during error correction via a local neural network decoder).

As seen by the plots in the last column of FIG. 15, removing vertical pairs of highlighted vertices which are present after the local neural network decoder has been applied may reduce the syndrome density before the global decoding stage. For the syndrome difference $s_X^{diff}(d_m) = (e_X^{(1)} \tilde{e}_X^{(2)} \ldots \tilde{e}_X^{(d_m)})$, the syndrome in the first round (e.g., the top row in FIG. 15) may be written as $e_X^{(1)}$. If $e_X^{(1)}(j)=1$ and $\tilde{e}_X^{(2)}(j)=1$ for some $j \in \{1, \ldots, r_2\}$, then $e_X^{(1)}(j)$ may be set to $e_X^{(2)}(j) = \tilde{e}_X^{(2)}(j) = 0$. Such a process may be repeated by comparing $\tilde{e}_X^{(m)}(j)$ and $\tilde{e}_X^{(m+1)}(j)$ for $m \in \{2, \ldots, d_m\}$ and for all $j \in \{1, \ldots, r_2\}$, and setting them to zero if $\tilde{e}_X^{(m)}(j) = \tilde{e}_X^{(m+1)}(j) = 1$. A person having ordinary skill in the art should understand that a similar step may be performed for the syndrome differences $s_Z^{diff}(d_m)$.

As also discussed above with regard to syndrome collapse, performing vertical cleanup without first applying a decoding step (e.g., via a local neural network decoder) may result in logical errors at the global decoding stage. An example of performing vertical cleanup without the use of a local neural network decoder is discussed with regard to FIGS. 16A and 16B below. In some embodiments, by applying techniques such as syndrome collapse and/or vertical cleanup, such logical errors at the global decoding stage may be avoided.

Figure 16A:
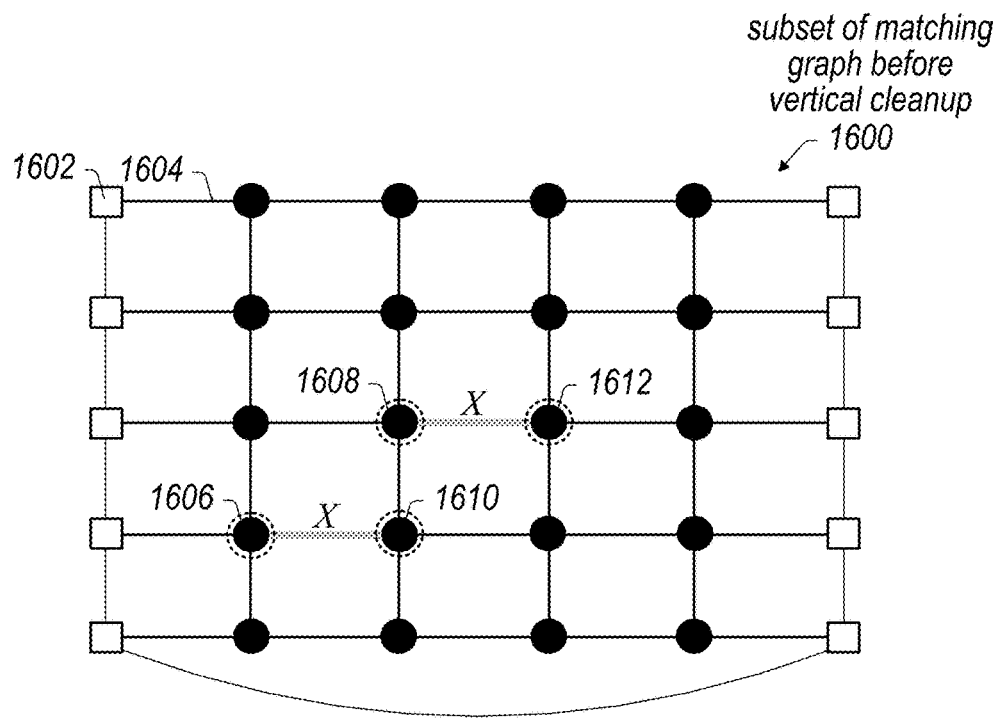
FIGS. 16A and 16B illustrate a subset of a matching graph that has not been subjected to error correction made by a local decoder prior to the use of vertical cleanup to treat vertical pairs of highlighted vertices, resulting in a logical X-type error, according to some embodiments.
Figure 16B:
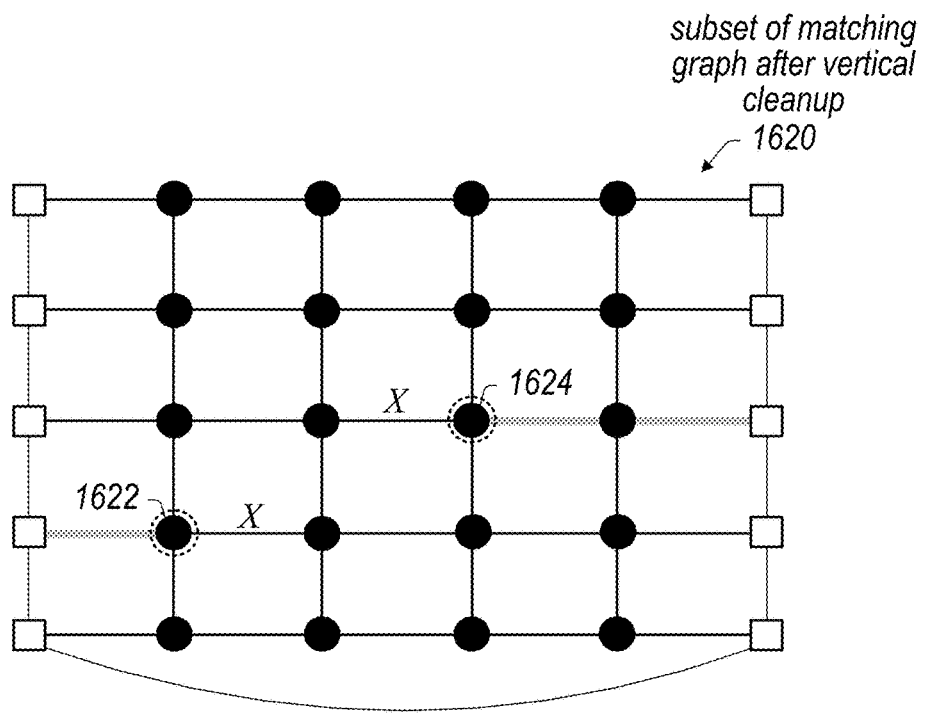

FIGS. 16A and 16B illustrate a subset of a matching graph that has not been subjected to error correction made by a local decoder prior to the use of vertical cleanup to treat vertical pairs of highlighted vertices, resulting in a logical X-type error, according to some embodiments.

In subset of matching graph before vertical cleanup 1600 for correcting X errors, horizontal edges (e.g., edge 1604) of subset of matching graph before vertical cleanup 1600 correspond to data qubits of the given d=5 surface code, and vertices (e.g., vertices 1606, 1608, 1610, and 1612) of subset of matching graph before vertical cleanup 1600 correspond to stabilizer measurement outcomes. The squares (e.g., square 1602) correspond to boundary vertices connected by edges of zero weight. In FIG. 16A, two X-type errors are temporally separated by one syndrome measurement round, along with the corresponding highlighted vertices. At the moment depicted in FIG. 16A (e.g., before performing vertical cleanup), the thicker gray edges correspond to a chosen minimum-weight correction (e.g., via a global decoder) which could remove the X errors, resulting in no logical fault. However, as shown in FIG. 16B, if vertical cleanup were to be performed prior to a global decoding step (and without first performing an error correction by a local decoder), this may result in a logical fault (e.g., the error that would have been correctable in FIG. 16A if no vertical cleanup is performed becomes uncorrectable when vertical cleanup is performed, as shown in FIG. 16B).

In subset of matching graph after vertical cleanup 1620 of FIG. 16B, vertical cleanup is performed to subset of matching graph before vertical cleanup 1600, and the resulting highlighted vertices (e.g., vertices 1622 and 1624) in subset of matching graph after vertical cleanup 1620 may lead to a logical fault during a subsequent error correction via a global decoder (e.g., minimum-weight perfect-matching).

Figure 17:
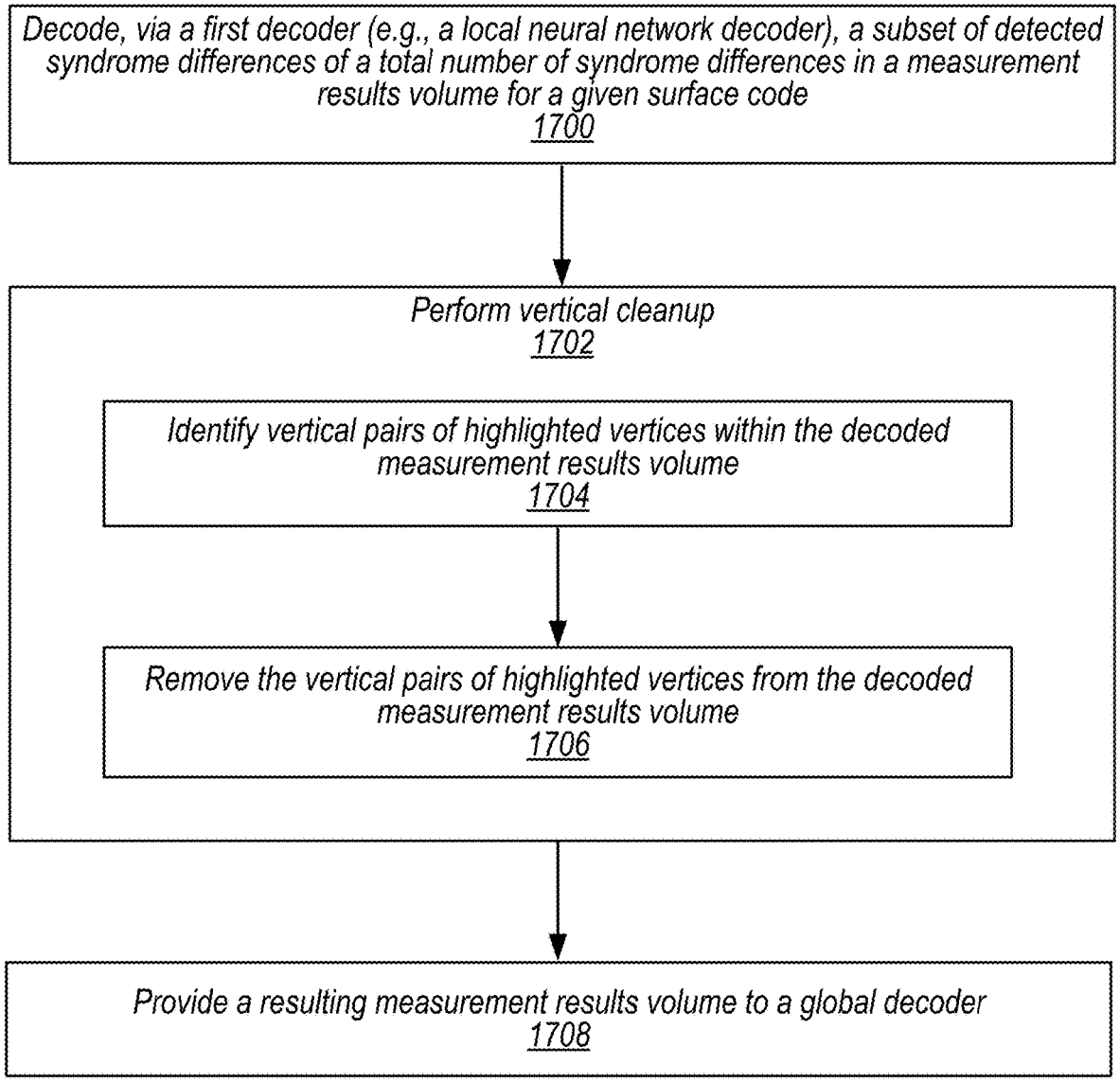
FIG. 17 is flow diagram illustrating a process of performing vertical cleanup for a given measurement results volume in order to treat vertical pairs of highlighted vertices, according to some embodiments.

FIG. 17 is flow diagram illustrating a process of performing vertical cleanup for a given measurement results volume in order to treat vertical pairs of highlighted vertices, according to some embodiments.

In block 1700, a measurement results volume is decoded via a decoder (e.g., a local neural network decoder), such as those discussed herein with regard to at least FIGS. 1-10. As described with regard to block 1400 above, the decoder may resemble a local neural network decoder, or other embodiments of one or more decoders which may be configured to perform error correction for surface codes. In block 1702, vertical cleanup is performed before the decoded matching graph is then provided to a global decoder. A process of performing vertical cleanup may resemble the process shown in blocks 1704 and 1706, wherein vertical pairs of highlighted vertices are identified and subsequently removed, such as in the methods discussed above with regard to at least FIG. 15. Finally, a resulting matching graph (with the vertical pairs of highlighted vertices removed) is provided to a global decoder in block 1708.

Figure 18A:
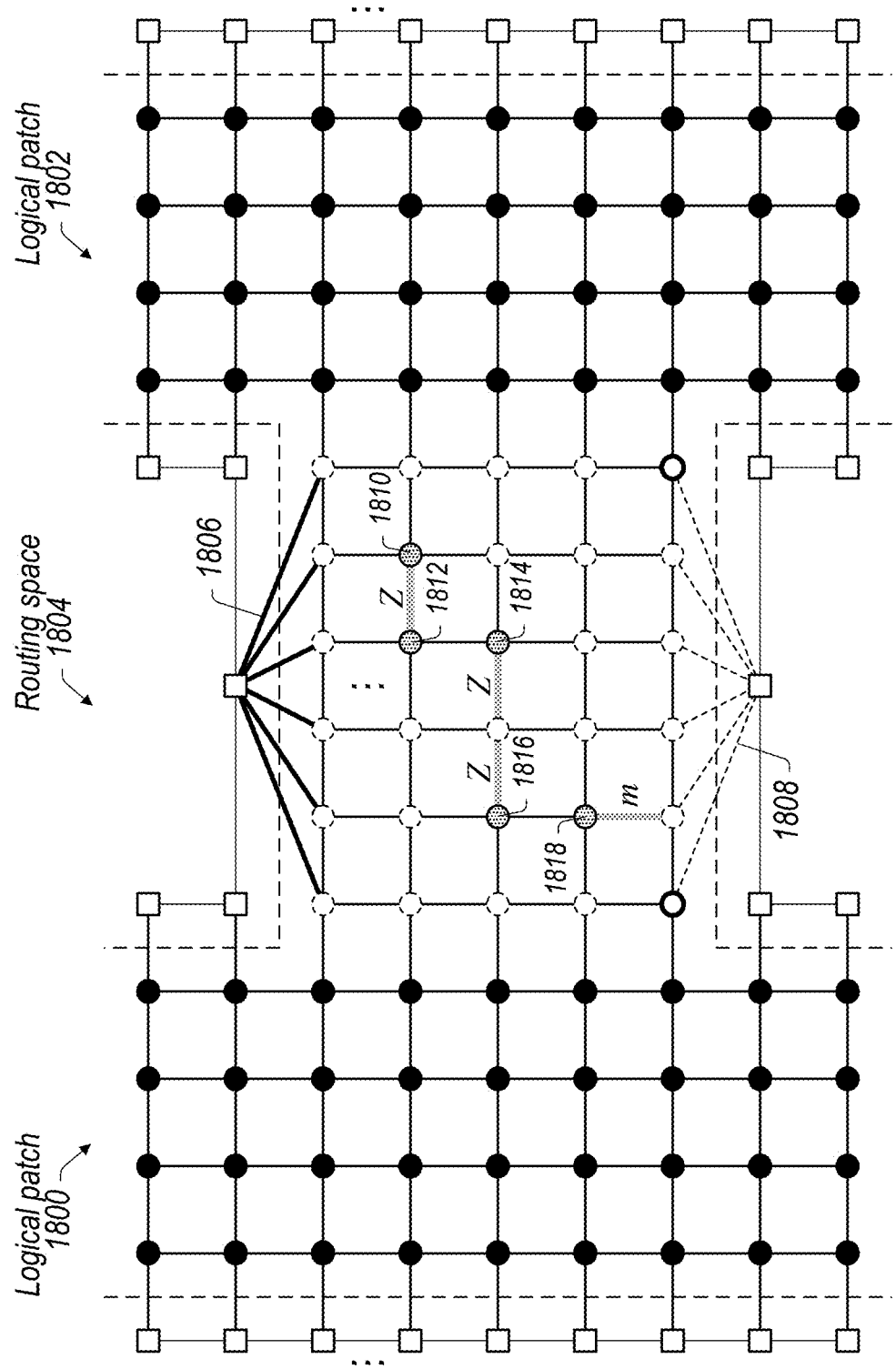
FIG. 18A illustrates a slice of a matching graph, used to correct errors during an X⊗X multi-qubit Pauli measurement performed via lattice surgery, in which a global decoder is able to correct said errors, according to some embodiments.
Figure 18B:
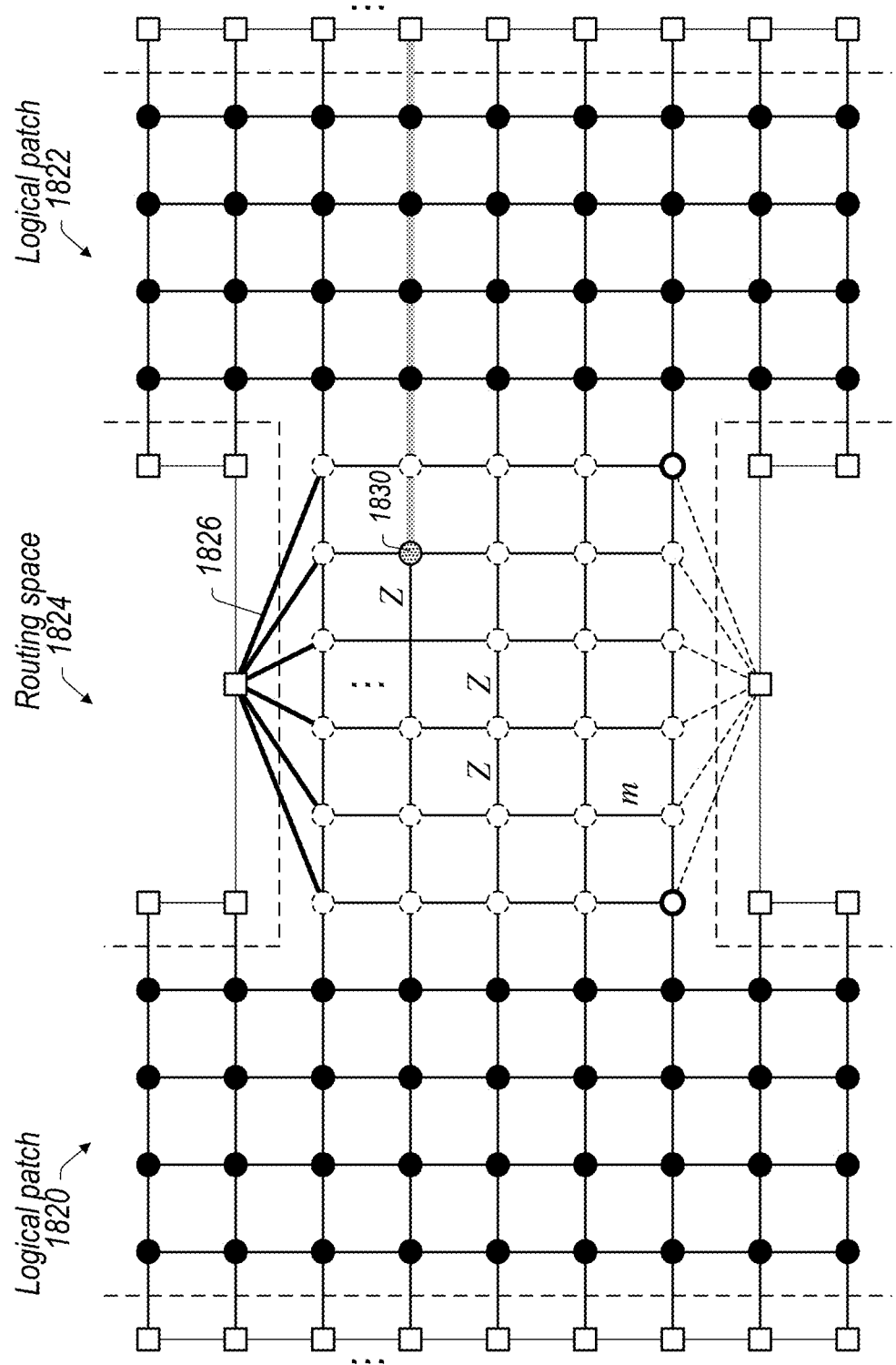
FIG. 18B illustrates a slice of a matching graph, used to correct errors during an X⊗X multi-qubit Pauli measurement performed via lattice surgery, in which the matching graph is subjected to error correction made by a global decoder (e.g., without the use of a local decoding stage), resulting in a logical Z-type error, according to some embodiments.

Furthermore, performing vertical cleanup may be applied during a lattice surgery protocol (e.g., a protocol to merge two or more previously separate logical surface code patches together such that operations such as parity measurements may be performed on or across the merged logical surface code patches), according to some embodiments. FIGS. 18A and 18B demonstrate the effects of performing a vertical cleanup without the prior use of a local decoding stage when implementing a multi-qubit Pauli measurement via lattice surgery, motivating the use of the local and global decoding schemes with vertical cleanup discussed herein.

FIG. 18A illustrates a slice of a matching graph, used to correct errors during an X⊗X multi-qubit Pauli measurement performed via lattice surgery, in which a global decoder is able to correct said errors, according to some embodiments. FIG. 18B illustrates a slice of a matching graph, used to correct errors during an X⊗X multi-qubit Pauli measurement performed via lattice surgery, in which the matching graph is subjected to vertical cleanup (e.g., without first applying a local decoding stage) and error correction made by a global decoder, resulting in a logical Z-type error.

In some embodiments, performing an X⊗X multi-qubit Pauli measurement using two surface code patches may resemble the two-dimensional slice of the matching graph used to correct Z-type errors during a lattice surgery protocol shown in FIG. 18A. When performing the X⊗X measurement, the two surface code patches (e.g., logical patch 1800 and logical patch 1802) are merged into one patch by preparing qubits in the routing region (e.g., routing space 1806) in the |0⟩ state, and a gauge fixing step may be performed, wherein the X-type operators are measured.

In some embodiments, in the first round of the merge of logical patch 1800 and logical patch 1802, the X-type measurements performed in routing space region may random, but the product of all such measurements encode the parity of the logical X⊗X operator being measured. However, measurement errors (marked by an 'm' in FIG. 18A) may result in the wrong parity being measured, and/or any fault mechanism resulting in an error which anticommutes with the X⊗X operator being measured may cause the wrong parity to be measured. In some embodiments, this may be referred to as a time-like failure. As such, repeated rounds of syndrome measurements (e.g., the temporal dimension of FIG. 18A) may be performed on the merged surface code patches, with the time-like distance given by the number of syndrome measurement rounds.

In some embodiments, such as some of the embodiments shown in FIG. 18A, such error strings (marked by thicker gray edges in FIG. 18A) may be combined with data qubit errors (e.g., data qubit errors 1810, 1812, 1814, 1816, and 1818) within the same X-type measurements, resulting in vertical pairs (e.g., vertical pair 1812 and 1814, and vertical pair 1816 and 1818). However, if vertical pairs of highlighted vertices (e.g., vertical pair 1812 and 1814, and vertical pair 1816 and 1818) were to be removed and starting from the syndrome measurement round directly after the merge within the lattice surgery protocol (e.g., without the use of a local decoding stage), the effective time-like distance may be at most $d_{eff} \leq d_m - 2$, and such a sequence of decoding may result in logical faults, according to some embodiments. Temporal edges incident to vertices in routing space 1804 (e.g., top temporal boundary 1806 and bottom temporal boundary 1808) have also been marked in FIG. 18A for reference. For the series of Z-type errors and measurement errors occurring in routing space 1804 shown in FIG. 18A, the measurement error may cause the parity of the multi-qubit Pauli measurement to be flipped. The corrections are shown by the edges highlighted by thick gray lines. In some embodiments, the Z-type errors may be removed, via a global decoder, and the parity of X⊗X may then be flipped to the correct value.

Figure 19:
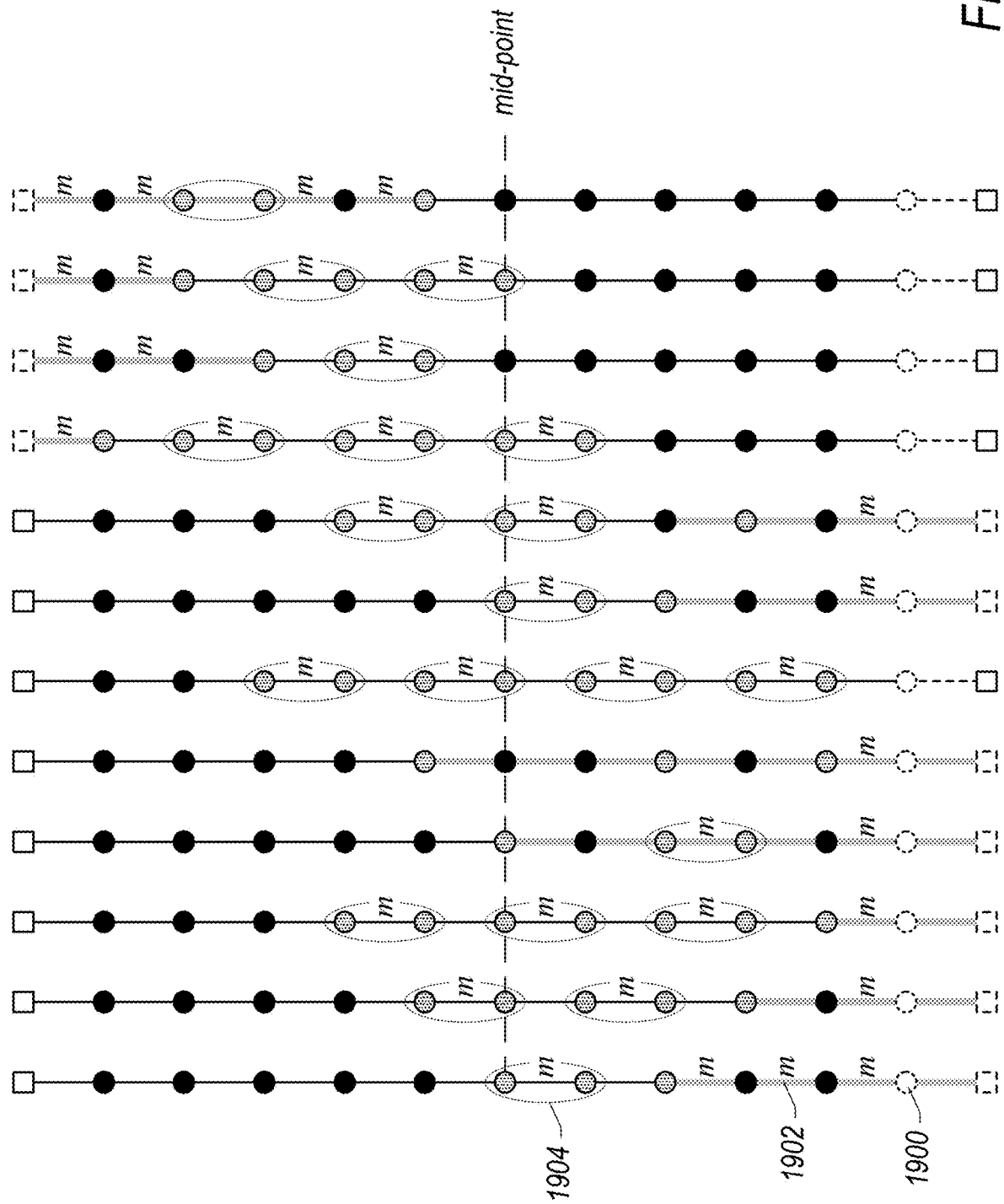
FIG. 19 illustrates example configurations of measurement errors on a given stabilizer during a multi-qubit parity measurement implemented via lattice surgery to which vertical cleanup is applied in either a top-down or bottom-up method, according to some embodiments.

FIG. 18B demonstrates a similar example performing an X⊗X multi-qubit Pauli measurement using two surface code patches (e.g., logical patch 1820 and logical patch 1822) and a lattice surgery protocol, wherein data qubits are prepared in routing space 1824, to correct Z-type errors. As opposed to embodiments shown in FIG. 18A, however, vertical cleanup (as described herein) may be performed, but without having previously performed an error correction by a decoder (e.g., a local neural network decoder). For example, as shown in FIG. 18B, strings of measurement errors starting from the first round of the merge patch (e.g., routing space 1824) may be unaffected by the implementation of a vertical cleanup, since a single vertex at the end of the measurement error string would be highlighted (e.g., vertex 1830). This may cause the minimum-weight perfect-matching to perform a string of Z-type corrections to a Z-type boundary, which may result in a logical Z error on either surface code patch 1820 or 1822 (e.g., logical patch 1822 as shown in the example shown in FIG. 18B). Alternatively, the minimum-weight perfect-matching may cause a match to the top temporal boundary 1826, which may then cause a time-like failure. FIGS. 18A and 18B have motivated the use to local and global decoding schemes with vertical cleanup, as discussed herein. FIG. 19 demonstrates examples of how said methods may be applied such that fast decoding throughput and latency times for quantum algorithms may be obtained.

FIG. 19 illustrates example configurations of measurement errors on a given stabilizer during a multi-qubit parity measurement implemented via lattice surgery to which vertical cleanup is applied in either a top-down or bottom-up method, according to some embodiments.

FIG. 19 shows example configurations of measurement errors (e.g., measurement errors labeled by 'm' in FIG. 19) on the same stabilizer during a given multi-qubit parity measurement implemented via lattice surgery (e.g., a multi-qubit parity measurement implemented via lattice surgery such as in the examples given in FIGS. 18A and 18B). Each column of FIG. 19 corresponds to a different configuration of measurement errors for a given ancilla qubit. Time (e.g., consecutive rounds of syndrome measurements) flows from the bottom of FIG. 19 to the top, and temporal edges connecting to the boundary vertices follow the convention shown in FIGS. 18A and 18B. Dashed circles (e.g., circles in the row of circles containing vertex 1900) represent vertices in the first syndrome measurement round. Measurement outcomes of this first round may random, and thus such vertices are not highlighted. Pairs of highlighted vertices (e.g., pairs of vertices encircled in dashed ovals such as pair of highlighted vertices 1904) may be removed when performing a vertical cleanup procedure, and edges covered by thick gray lines (e.g., edge 1902) indicate a path chosen by a global, minimum-weight perfect-matching decoder after performing vertical cleanup.

Furthermore, for $d_m$ syndrome measurement rounds (with $d_m$ being odd in the example embodiments shown in FIG. 19), the round labeled "mid-point" is the $(d_m+1)/2$ round of syndrome measurements. In some embodiments, if a distribution is such that the syndrome density above the mid-point is greater than the syndrome density below the mid-point, the vertical cleanup may be done from bottom to top along FIG. 19 (e.g., starting from the round where the data qubits in the routing space are initialized, and moving towards the round where they are measured). If the syndrome density below the mid-point is greater than the syndrome density above the mid-point, the vertical cleanup may be performed from top to bottom (e.g., starting from the round where the data qubits in the routing space are measured, and moving towards the round where they are initialized), according to some embodiments. If syndrome densities above and below the mid-point are the same, then a direction for the vertical cleanup may be chosen at random. By strategically choosing such directions for performing vertical cleanup, the effective time-like distance may be increased as compared to always choosing the same temporal-direction convention (e.g., without regard to a syndrome density above/below the mid-point) for performing vertical cleanup, according to some embodiments. In addition, by choosing the direction in which the vertical cleanup may be performed (e.g., top to bottom or bottom to top, temporally), the global, minimum-weight perfect-matching decoder may match the highlighted vertices to the correct temporal boundary, avoiding logical faults.

In some embodiments, in order to ensure that a given minimum-weight perfect-matching path does not map to a temporal boundary (e.g., top temporal boundary 1806 and bottom temporal boundary 1808 in FIG. 18A), which may cause an incorrect flipping of the parity of the multi-qubit Pauli measurement, a large enough value of $d_m$ may be chosen such that $n_v^c > n_v$ and $d_m > 4m-5$ (wherein the number of vertical edges which connect two vertices that do not go through a temporal boundary vertex is $n_v = 2m-3$ and the number of vertical edges connecting two vertices that do go through a temporal boundary is $n_v^c = d_m - 2m+2$). In some embodiments, this may cause the runtime of a given quantum algorithm to increase. In such cases, a temporal encoding of lattice surgery protocol (see the following paragraphs) may be used to reduce said runtime.

In some embodiments, when applying a local neural network decoder, space-like and/or time-like error chains, such as the examples shown in FIG. 19, may be within the effective distance of the local neural network decoder, and therefore may be removed. Longer error chains than the examples shown in FIG. 19, and possibly those combined with measurement errors, may still be problematic if they occur far from the bottom temporal boundary and may require a larger surface code distance d as well as more syndrome measurement rounds to increase the time-like distance. However, such effects could be partially offset by applying a temporal encoding of lattice surgery protocol, according to some embodiments.

Temporal Encoding of Lattice Surgery Protocol

A key idea behind temporal encoding of lattice surgery (TELS) is to use fast, noisy lattice surgery operations, with this noise corrected by encoding the sequence of Pauli measurements within a classical error correction code. Thus, more noise can be tolerated in the Pauli measurements, requiring fewer rounds of syndrome measurements during a lattice surgery protocol, wherein logical failures arising during a sequence of Pauli measurements implemented via lattice surgery can be corrected using a classical error correcting code.

This encoding can be thought of as taking place in the time domain, so the encoding does not directly lead to additional qubit overhead costs. There can be a small additive qubit cost when temporal encoding of lattice surgery (TELS) is used for magic state injection, with magic states needing to be stored for slightly longer times.

Temporal Encoding of Lattice Surgery Protocol: Parallelizable Pauli Measurements In some embodiments, a sequence of Pauli measurements can be grouped in larger sets of parallelizable Pauli measurements. Let $P_{[t,t+k]} := \{P_t, P_{t+1}, \ldots, P_{t+k}\}$ be a subsequence of Pauli operators. $P_{[t,t+k]}$ is a parallelizable set if: all Pauli operators commute; and any Clifford corrections can be commuted to the end of the sub-sequence. For example, a parallelizable set is given when magic states are used to perform a $T^{\oplus k}$ gate. Therefore, given a circuit with $\mu$ T-gates and T-depth $\gamma$, the Pauli measurement sequence can be split into a sequence of $\gamma$ parallelizable sets of average size $k := \mu/\gamma$.

In time-optimal Pauli based computation, an n-qubit computation of T-depth $\gamma$ can be reduced to runtime $O(n+\gamma)$. However, the space-time volume is not compressed by using the time-optimal approach, so that reducing the algorithm runtime to 10% of a seqPBC runtime would require at least a 10× increase in qubit cost.

Temporal Encoding of Lattice Surgery Protocol: Encoding of Pauli Measurements

In some embodiments, temporal encoding of lattice surgery takes advantage of parallelizable Pauli sets to speed up lattice surgery while maintaining a given level of certainty (e.g., low error rate). However, unlike other approaches, it does not incur a multiplicative qubit overhead cause, and thus reduces an overall space-time cost of performing a quantum algorithm.

Due to the properties of a parallelizable Pauli set, all Pauli operators within the set can be measured in any order. Furthermore, any set S that generates the group $(P_t, P_{t+1}, \ldots, P_{t+k})$ can be measured. If the set S is overcomplete, there will be some linear dependencies between the measurements that can be used to detect (and correct) for any errors in the lattice surgery measurements. For example, consider the simplest parallelizable set $\{P_1, P_2\}$ and let $d_m$ be the required lattice surgery time, so performing both measurements takes $2(d_m+1)$ error correction cycles. Instead, $\{P_1, P_2, P_1P_2\}$ could be measured. If the third measurement outcome (e.g., $P_1P_2$) is not equal to the product of the first two measurements (e.g., the product of $P_1$ and $P_2$), then it can be determined that something has gone wrong and the measurements can be repeated to gain more certainty of the true values. By measuring the overcomplete set $\{P_1, P_2, P_1P_2\}$ an extra lattice surgery measurement has been performed. However, this extra measurement (resulting in an overcomplete set) allows a single lattice surgery failure to be tolerated without causing a logical error. This is because the single lattice surgery failure can be detected, and when re-measuring the original set $\{P_1, P_2\}$ a second lattice surgery failure would need to occur to produce a wrong measurement outcome. This allows for fewer rounds of lattice surgery measurements to be taken ($d''_m$) and still avoid errors. For example, $d''_m \ll d_m$ while still achieving a same overall success probability. Also, since the overall time in non-temporally encoded lattice surgery is $2(d_m+1)$, if the measurements are such that $3d''_m \ll 2d_m$, then the computation has been speed up.

In general, given a parallelizable Pauli set $$P = \{P_t, P_{t+1}, \ldots, P_{t+k}\},$$

Pauli operators can be defined as $$Q[x] := \prod_{j=0}^{k-1} P_{t+j}^{x_j}$$

where x is a length k binary column vector. Given a set S that generates all the required Pauli operators, such that $\langle S \rangle = \langle P \rangle$, the elements of the set can be written as $$S = \{Q[x^1], Q[x^2], \ldots, Q[x^k]\}$$

with superscripts denoting different vectors. Since this is a generating set, the vectors $\{x^1, x^2, \ldots, x^k\}$ span the relevant space. Furthermore, a matrix G can be defined with these vectors as columns and such a matrix specifies the temporal encoding of lattice surgery (TELS) protocol. In the simple $k=2$ example as shown in FIG. 13, $S = \{P_1, P_2, P_1P_2\}$, and G is defined as $$G = \begin{pmatrix} 1 & 0 & 1 \\ 0 & 1 & 1 \end{pmatrix} = (x^1 \ x^2 \ x^3).$$

Notice that the rows of the above matrix generate the code words of the [3, 2, 2] classical code. In general G can be considered as the generator matrix for the code words of an [n, k, d] classical code. This is referred to herein as the measurement code for the temporal encoding of lattice surgery (TELS) protocol. Note that k is the number of (unencoded) Pauli operators in the generating set. The full-rank G matrix is considered where k equals the number of rows in G. The number n represents how many Pauli measurements are physically performed in the encoded scheme and corresponds to the number of columns in G. The distance d is the lowest weight vector in the row-span of G.

In order to show that the code distance d does in fact capture the ability of TELS to correct errors, the redundancy in lattice surgery measurements can be formalized as follows. For any length n binary vector $u=(u_1, u_2, \ldots, u_n)$, $$\prod_{j:u_j=1} Q[x^j] = Q\left[\sum_l u_l x^l\right].$$

Since the matrix G is full-rank and has more columns than rows, there will exist "u" such that $\Sigma_j u_j x^j = 0$. For these "u" it is true that.

$$\prod_{j:u_j=1} Q[x^j] = 1.$$

Therefore, these "u" vectors describe redundancy in the measurements. The condition $\Sigma_j u_j x^j = 0$ can be rewritten compactly as Gu=0. Following the convention in coding theory, this set of "u" is called the dual of G and denoted as:

$$G^\perp := \{u : Gu = 0 (\bmod 2)\}.$$

Next, consider that this redundancy can be used to detect time-like lattice surgery errors. For example, let $m=\{m_1, m_2, \ldots, m_n\}$ be a binary vector denoting the outcomes of the lattice surgery Pauli measurements in the set S. That is, if a measurement of $Q[x^j]$ gives outcome "+1" set $m_j=0$ and when the measurement of $Q[x^j]$ gives "−1" set $m_j=1$. Given a $u \in G^\perp$, we know that Pauli operators product to the identity so when there are no time-like lattice surgery errors we have $$\prod_{j:u_j=1} m_j = u \cdot m = 0 (\bmod 2).$$

Conversely, if it observed that $$\prod_{j:u_j=1} m_j = u \cdot m = 1 (\bmod 2),$$

then it is known that a time-like lattice surgery error has occurred. For example, consider m=s+e, where "s" is the ideal measurement outcome and "e" is the error measurement outcome. The ideal measurement outcomes are always self-consistent and so they always satisfy u·s=0 for all $u \in G^\perp$. Therefore, it can be seen that an error "e" is undetected if and only if u·e=0 for some $u \in G^\perp$. This is equivalent to undetected errors "e" being in the row-span of G (since the dual of the dual is always the original space). Recall, the distance d denotes the lowest (non-zero) weight vector in the row-span of G. Therefore, d also denotes the smallest number of time-like lattice surgery errors needed for them to be undetected by TELS. Consequently, if $\mathbb{P}$ is the probability of a single time-like error, TELS error-detection will fail with probability $O(\mathbb{P}^d)$.

As an example, take the Pauli set $\{P_t, P_{t+1}, \ldots, P_{t+k}\}$ and measure each of these observables separately, and then measure the product of them so that the measurement code has the generator matrix $$G = \begin{pmatrix} 1 & 0 & \ldots & 0 & 1 \\ 0 & 1 & \ldots & 0 & 1 \\ \vdots & \vdots & \vdots & \vdots & \vdots \\ 0 & 0 & \ldots & 1 & 1 \end{pmatrix},$$

which is an identity matrix padded with an extra column that is an all 1 vector. Therefore, this corresponds to a [α+1, α, 2] classical code that detects a single error. Concatenating such a code m times gives a code with parameters $[(\alpha+1)^m, \alpha^m, 2^m]$. Another example that can be considered is an example wherein a simple [8, 4, 4] extended Hamming code is used as the measurement code with generator matrix $$G = \begin{pmatrix} 0 & 0 & 0 & 0 & 1 & 1 & 1 & 1 \\ 1 & 1 & 1 & 1 & 0 & 0 & 0 & 0 \\ 1 & 1 & 0 & 0 & 1 & 1 & 0 & 0 \\ 1 & 0 & 1 & 0 & 1 & 0 & 1 & 0 \end{pmatrix}.$$

This corresponds with replacing $\{P_1, P_2, P_3, P_4\}$ with S containing the 8 operators $$S = \{P_2 P_3 P_4, P_2 P_3, P_2 P_4, P_2, P_1 P_3 P_4, P_1 P_3, P_1 P_4, P_1\}.$$

Because the generator matrix has distance 4, this scheme will detect up to 3 errors. This Hamming code is the m=3 member of a family of $[2^m, 2^m-m-1, 4]$ extended Hamming codes. There are several viable strategies to handle a detected error.

In some embodiments, the following detect/remeasure strategy is used: if a distance d measurement code is used with lattice surgery performed for time $d_m$, then whenever an error is detected the Pauli operators are "remeasured" but this time using the original Pauli set $P=\{P_t, P_{t+1}, \ldots, P_{t+k}\}$ instead of using the overcomplete set S. For the remeasure round, the lattice surgery is performed using an amount of time $\lceil qd_m \rceil$ where q is some constant scaling factor. The expected runtime to execute the protocol is then $$T = n(d_m+1) + p_d k d d_m,$$

where $P_d$ is the probability of detecting an error.

Embodiments of the present disclosure may be described in view of the following clauses:

Clause 1. A system, comprising:
one or more quantum hardware devices configured to implement a quantum surface code; and
one or more computing devices configured to perform error correction for measurement results of a plurality of rounds of syndrome measurements of a quantum surface code, wherein:
the measurement results form a measurement results volume bounded by first and second dimensions corresponding to dimensions of the quantum surface code and a third dimension corresponding to a number of rounds included in the plurality of rounds of syndrome measurements; and to perform the error correction, the one or more computing devices are further configured to:

decode the measurement results volume, via a local neural network decoder configured to account for circuit-level noise, wherein the local neural network decoder incrementally decodes a first set of detected syndrome differences of a total number of syndrome differences in the measurement results volume;

decode the decoded measurement results volume, via a global decoder, wherein the global decoder decodes a second set of detected syndrome differences remaining in the decoded measurement results volume subsequent to the decoding via the local neural network decoder; and provide error-corrected results of measurement results of the plurality of rounds of syndrome measurements of the quantum surface code.

Clause 2. The system of clause 1, wherein the circuit-level noise is based, at least in part, on one or more of the following:

one or more errors pertaining to single qubit gates acting on given qubits of a given quantum surface code of the quantum surface codes;

one or more errors pertaining to multi-qubit gates between given qubits of the given quantum surface code;

one or more measurement errors pertaining to the plurality of rounds of syndrome measurements;

one or more errors pertaining to ancilla qubit reset timesteps of the plurality of rounds of syndrome measurements; or one or more errors pertaining to idling of given qubits of the quantum surface code.

Clause 3. The system of clause 1, wherein the local neural network decoder has a three-dimensional, fully-convolutional, neural network architecture.

Clause 4. The system of clause 1, wherein the local neural network decoder has been trained, via a supervised learning technique, to account for circuit-level noise within the measurement results of the plurality of rounds of syndrome measurements of the quantum surface code.

Clause 5. The system of clause 1, wherein to perform the error correction, the one or more computing devices are further configured to:

treat, prior to the decode the decoded measurement results volume via the global decoder, vertical pairs of highlighted vertices in the decoded measurement results volume, wherein to treat the vertical pairs of highlighted vertices causes a syndrome density in the decoded measurement results volume to be reduced.

Clause 6. The system of clause 5, wherein to treat the vertical pairs of highlighted vertices, the one or more computing devices are further configured to:

perform a syndrome collapse technique; or perform a vertical cleanup technique.

Clause 7. The system of clause 1, wherein to decode the decoded measurement results volume, via the global decoder, the one or more computing devices are further configured to perform a graph-based decoding technique to decode the second set of detected syndrome differences.

Clause 8. A method, comprising:

performing error correction for measurement results of a plurality of rounds of syndrome measurements of a quantum surface code, wherein:

the measurement results form a measurement results volume bounded by first and second dimensions corresponding to dimensions of the quantum surface code and a third dimension corresponding to a number of rounds included in the plurality of rounds of syndrome measurements; and said performing the error correction comprises:

decoding the measurement results volume, via a local neural network decoder, wherein:

the local neural network decoder incrementally decodes a first set of detected syndrome differences of a total number of syndrome differences in the measurement results volume; and said decoding the measurement results volume accounts for circuit-level noise; and decoding the decoded measurement results volume, via a global decoder, wherein the global decoder decodes a second set of detected syndrome differences remaining in the decoded measurement results volume subsequent to the decoding via the local neural network decoder; and providing error-corrected results of measurement results of the plurality of rounds of syndrome measurements of the quantum surface code.

Clause 9. The method of clause 8, wherein the circuit-level noise is based, at least in part, on one or more of the following:

one or more errors pertaining to single qubit gates acting on given qubits of a given quantum surface code of the quantum surface codes;

one or more errors pertaining to multi-qubit gates between given qubits of the given quantum surface code;

one or more measurement errors pertaining to the plurality of rounds of syndrome measurements;

one or more errors pertaining to ancilla qubit reset timesteps of the plurality of rounds of syndrome measurements; or one or more errors pertaining to idling of given qubits of the quantum surface code.

Clause 10. The method of clause 8, wherein said performing the error correction further comprises:

treating, prior to said decoding the decoded measurement results volume via the global decoder, vertical pairs of highlighted vertices in the decoded measurement results volume, wherein said treating the vertical pairs of highlighted vertices causes a syndrome density in the decoded measurement results volume to be reduced.

Clause 11. The method of clause 10, wherein the vertical pairs of highlighted vertices in the decoded measurement results volume are generated based, at least in part, on the decoding, via the local neural network decoder.

Clause 12. The method of clause 10, wherein the treating the vertical pairs of highlighted vertices comprises:

performing syndrome collapse, wherein the performing the syndrome collapse comprises:

partitioning the decoded measurement results volume into partitions in the third dimension of the decoded measurement results volume; and adding syndromes of respective syndrome densities in each partition modulo 2 to collapse the respective partitions, wherein said collapse results in a removal of the vertical pairs of highlighted vertices.

Clause 13. The method of clause 10, wherein the treating the vertical pairs of highlighted vertices comprises:
  performing vertical cleanup, wherein the performing vertical cleanup comprises:
    identifying vertical pairs of highlighted vertices in the decoded measurement results volume; and
    removing the vertical pairs of highlighted vertices.

Clause 14. The method of clause 13, wherein a temporal direction pertaining to the performing vertical cleanup is selected based, at least in part, on a distribution of syndrome differences within the syndrome density in the decoded measurement results volume.

Clause 15. The method of clause 8, further comprising:
  training, via a supervised learning technique, the local neural network decoder to be used for said performing the error correction for the measurement results of the plurality of rounds of syndrome measurements of the quantum surface code, wherein said training comprises:
    providing a training data set of measurement results corresponding to a simulated plurality of rounds of syndrome measurements for a simulated quantum surface code that form dimensions of a simulated measurement results volume;
    determining predictions of locations of alleged errors on data qubits within the training data set;
    comparing the predictions of locations of alleged errors to ground truth information, wherein the ground truth information comprises actual locations of errors on data qubits within the training data set; and
    providing the trained local decoder to be used for said performing the error correction for the measurement results of the plurality of rounds of syndrome measurements of the quantum surface code.

Clause 16. The method of clause 15, wherein the training data set further comprises at least one or more of the following:
  syndrome information for the simulated plurality of rounds of syndrome measurements;
  location information about qubit placement within the dimensions of the simulated measurement results volume; and
  temporal boundaries information about the simulated plurality of rounds of syndrome measurements.

Clause 17. The method of clause 15, further comprising:
  determining a homological equivalence convention to be applied to homologically equivalent errors within the actual locations of the errors on the data qubits within the training data set, wherein the homological equivalence convention comprises at least one or more of:
    one or more weight-reduction transformations; or
    one or more equivalence transformations; and
  applying the homological equivalence convention to the ground truth information.

Clause 18. A non-transitory, computer-readable, medium storing program instructions that, when executed on or across one or more processors, cause the one or more processors to:
  perform error correction for measurement results of a plurality of rounds of syndrome measurements of a quantum surface code, wherein:
    the measurement results form a measurement results volume bounded by first and second dimensions corresponding to dimensions of the quantum surface code and a third dimension corresponding to a number of rounds included in the plurality of rounds of syndrome measurements; and
    to perform the error correction, the program instructions further cause the one or more processors to:
      decode the measurement results volume, via a local neural network decoder, such that the local neural network decoder accounts for circuit-level noise, wherein the local neural network decoder incrementally decodes a first set of detected syndrome differences of a total number of syndrome differences in the measurement results volume; and
      decode the decoded measurement results volume, via a global decoder, wherein the global decoder decodes a second set of detected syndrome differences remaining in the decoded measurement results volume subsequent to the decoding via the local neural network decoder; and
    provide error-corrected results of measurement results of the plurality of rounds of syndrome measurements of the quantum surface code.

Clause 19. The non-transitory, computer-readable medium of clause 18, wherein the circuit-level noise is based, at least in part, on one or more of the following:
  one or more errors pertaining to single qubit gates acting on given qubits of a given quantum surface code of the quantum surface codes;
  one or more errors pertaining to multi-qubit gates between given qubits of the quantum surface code;
  one or more measurement errors pertaining to the plurality of rounds of syndrome measurements;
  one or more errors pertaining to ancilla qubit reset timesteps of the plurality of rounds of syndrome measurements; or
  one or more errors pertaining to idling of given qubits of the quantum surface code.

Clause 20. The non-transitory, computer-readable medium of clause 18, wherein to perform the error correction, the program instructions further cause the one or more processors to:
  treat, prior to the decode the decoded measurement results volume via the global decoder, vertical pairs of highlighted vertices in the decoded measurement results volume, wherein to treat the vertical pairs of highlighted vertices causes a syndrome density in the decoded measurement results volume to be reduced.

Clause 21. A system, comprising:
  one or more quantum hardware devices configured to implement a quantum surface code; and
  one or more computing devices configured to perform error correction for measurement results of a plurality of rounds of syndrome measurements of the quantum surface code, wherein:
    the measurement results form a measurement results volume bounded by first and second dimensions corresponding to dimensions of the quantum surface code and a third dimension corresponding to a number of rounds included in the plurality of rounds of syndrome measurements; and
    to perform the error correction, the one or more computing devices are further configured to:
      decode, via a first decoder, a subset of detected syndrome differences of a total number of syndrome differences in the measurement results volume;
      treat vertical pairs of highlighted vertices in the decoded measurement results volume, wherein to treat the vertical pairs of highlighted vertices causes a syndrome density in the decoded measurement results volume to be reduced; and provide a resulting measurement results volume to a global decoder.

Clause 22. The system of clause 21, wherein to treat the vertical pairs of highlighted vertices, the one or more computing devices are further configured to:
perform syndrome collapse, wherein to perform the syndrome collapse, the one or more computing devices are further configured to:
partition the decoded measurement results volume into partitions of the decoded measurement results volume in the third dimension of the decoded measurement results volume; and
add syndrome differences of respective syndrome densities in each partition modulo 2 to collapse the respective partitions, wherein said collapse results in a removal of the vertical pairs of highlighted vertices.

Clause 23. The system of clause 21, wherein to treat the vertical pairs of highlighted vertices, the one or more computing devices are further configured to:
perform vertical cleanup, wherein to perform the vertical cleanup, the one or more computing devices are further configured to:
identify vertical pairs of highlighted vertices in the decoded measurement results volume; and
remove the vertical pairs of highlighted vertices.

Clause 24. The system of clause 23, wherein:
the quantum surface code comprises logical patches of surface code, merged via lattice surgery;
a first half of the syndrome density in the decoded measurement results volume, comprising an initialization round of the plurality of rounds of syndrome measurements, has a larger density of syndromes with respect to a second half of the syndrome density, comprising a last round of the plurality of rounds of syndrome measurements; and
a temporal direction pertaining to the remove the vertical pairs of highlighted vertices corresponds to moving from the last round of the plurality of rounds of syndrome measurements towards the initialization round of the plurality of rounds of syndrome measurements.

Clause 25. The system of clause 23, wherein:
the quantum surface code comprises logical patches of surface code, merged via lattice surgery;
a first half of the syndrome density in the decoded measurement results volume, comprising an initialization round of the plurality of rounds of syndrome measurements, has a smaller density of syndromes with respect to a second half of the syndrome density, comprising a last round of the plurality of rounds of syndrome measurements; and
a temporal direction pertaining to the remove the vertical pairs of highlighted vertices corresponds to moving from the initialization round of the plurality of rounds of syndrome measurements towards the last round of the plurality of rounds of syndrome measurements.

Clause 26. The system of clause 23, wherein:
the quantum surface code comprises logical patches of surface code, merged via lattice surgery;
a first half of the syndrome density in the decoded measurement results volume, comprising an initialization round of the plurality of rounds of syndrome measurements, has a same density of syndromes with respect to a second half of the syndrome density, comprising a last round of the plurality of rounds of syndrome measurements; and
a temporal direction pertaining to the remove the vertical pairs of highlighted vertices corresponds to moving from the initialization round of the plurality of rounds of syndrome measurements towards the last round of the plurality of rounds of syndrome measurements or to moving from the from the last round towards the initialization round.

Clause 27. The system of clause 21, wherein:
the first decoder is a local neural network decoder; and
the local neural network decoder has been trained, via a supervised learning technique, to account for circuit-level noise within the measurement results of the plurality of rounds of syndrome measurements of the quantum surface code.

Clause 28. The system of clause 27, wherein the circuit-level noise is based, at least in part, on one or more of the following:
one or more errors pertaining to single qubit gates acting on given qubits of a given quantum surface code of the quantum surface codes;
one or more errors pertaining to multi-qubit gates between given qubits of the quantum surface code;
one or more measurement errors pertaining to the plurality of rounds of syndrome measurements;
one or more errors pertaining to ancilla qubit reset timesteps of the plurality of rounds of syndrome measurements; or
one or more errors pertaining to idling of given qubits of the quantum surface code.

Clause 29. The system of clause 21, wherein the vertical pairs of highlighted vertices in the decoded measurement results volume are generated based, at least in part, on the decoding, via the first decoder, the subset of detected syndrome differences.

Clause 30. A method, comprising:
performing error correction for measurement results of a plurality of rounds of syndrome measurements of a quantum surface code, wherein:
the measurement results form a measurement results volume bounded by first and second dimensions corresponding to dimensions of the quantum surface code and a third dimension corresponding to a number of rounds included in the plurality of rounds of syndrome measurements; and
said performing the error correction comprises:
decoding, via a first decoder, a subset of detected syndrome differences of a total number of syndrome differences in the measurement results volume;
treating vertical pairs of highlighted vertices in the decoded measurement results volume, wherein said treating the vertical pairs of highlighted vertices causes a syndrome density in the decoded measurement results volume to be reduced; and
providing a resulting measurement results volume to a global decoder.

Clause 31. The method of clause 30, wherein the treating the vertical pairs of highlighted vertices comprises:
performing syndrome collapse, wherein the performing the syndrome collapse comprises:
partitioning the decoded measurement results volume into partitions of the decoded measurement results volume in the third dimension of the decoded measurement results volume; and
adding syndrome differences of respective syndrome densities in each partition modulo 2 to collapse the respective partitions, wherein said collapse results in a removal of the vertical pairs of highlighted vertices.

Clause 32. The method of clause 31, wherein said performing the error correction further comprises:
  decoding, via the global decoder, remaining syndrome differences in the collapsed partitions; and
  providing error-corrected results of the measurement results of the plurality of rounds of syndrome measurements of the quantum surface code.

Clause 33. The method of clause 30, wherein the treating the vertical pairs of highlighted vertices comprises:
  performing vertical cleanup, wherein the performing vertical cleanup comprises:
    identifying vertical pairs of highlighted vertices in the decoded measurement results volume; and
    removing the vertical pairs of highlighted vertices.

Clause 34. The method of clause 33, wherein a temporal direction pertaining to the treating the vertical pairs of highlighted vertices is determined based, at least in part, on a distribution of syndrome differences within the syndrome density in the decoded measurement results volume.

Clause 35. The method of clause 30, wherein said performing the error correction further comprises:
  decoding, via the global decoder, remaining syndrome differences in the resulting measurement results volume; and
  providing error-corrected results of the measurement results of the plurality of rounds of syndrome measurements of the quantum surface code.

Clause 36. The method of clause 30, wherein the vertical pairs of highlighted vertices in the decoded measurement results volume are generated based, at least in part, on the decoding, via the first decoder, the subset of detected errors.

Clause 37. The method of clause 30, wherein:
  the first decoder is a local neural network decoder; and
  the local neural network decoder has been trained, via a supervised learning technique, to account for circuit-level noise within the measurement results of the plurality of rounds of syndrome measurements of the quantum surface code.

Clause 38. A non-transitory, computer-readable, medium storing program instructions that, when executed on or across one or more processors, cause the one or more processors to:
  perform error correction for measurement results of a plurality of rounds of syndrome measurements of a quantum surface code, wherein:
    the measurement results form a measurement results volume bounded by first and second dimensions corresponding to dimensions of the quantum surface code and a third dimension corresponding to a number of rounds included in the plurality of rounds of syndrome measurements; and
    to perform the error correction, the program instructions further cause the one or more processors to:
      decode, via a decoder, a subset of detected syndrome differences of a total number of syndrome differences in the measurement results volume;
      treat vertical pairs of highlighted vertices in the decoded measurement results volume, wherein to treat the vertical pairs of highlighted vertices causes a syndrome density in the decoded measurement results volume to be reduced; and
      provide a resulting measurement results volume to a global decoder.

Clause 39. The non-transitory, computer-readable medium of clause 38, wherein to treat the vertical pairs of highlighted vertices, the program instructions further cause the one or more processors to:
  perform syndrome collapse, wherein to perform the syndrome collapse, the program instructions further cause the one or more processors to:
    partition the decoded measurement results volume into partitions of the decoded measurement results volume in the third dimension of the decoded measurement results volume; and
    add syndrome differences of respective syndrome densities in each partition modulo 2 to collapse the respective partitions, wherein said collapse results in a removal of the vertical pairs of highlighted vertices.

Clause 40. The non-transitory, computer-readable medium of clause 38, wherein to treat the vertical pairs of highlighted vertices, the program instructions further cause the one or more processors to:
  perform vertical cleanup, wherein to perform the vertical cleanup, the program instructions further cause the one or more processors to:
    identify vertical pairs of highlighted vertices in the decoded measurement results volume; and
    remove the vertical pairs of highlighted vertices.

Illustrative Computer System

Figure 20:
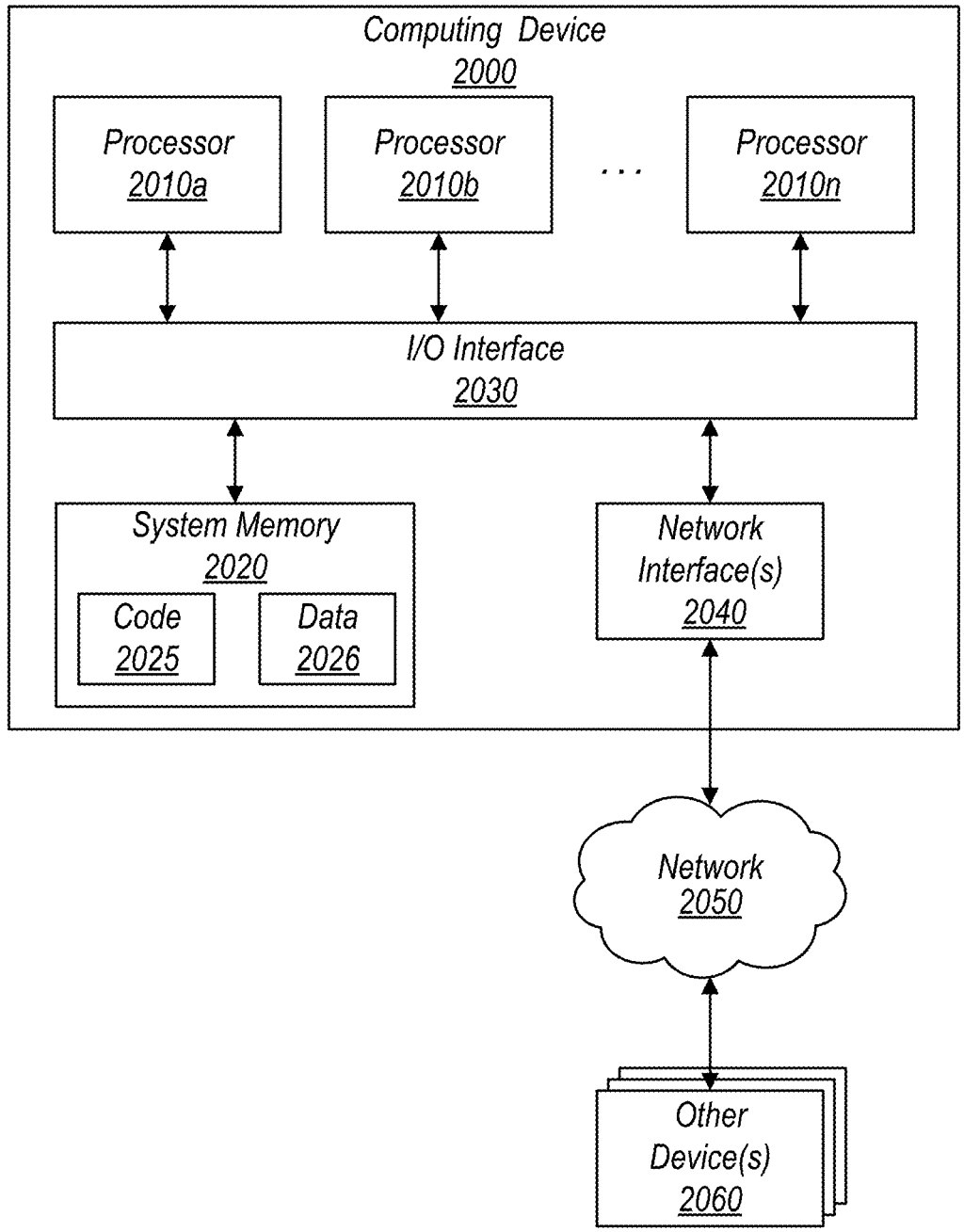
FIG. 20 is a block diagram illustrating an example computing device that may be used in at least some embodiments.

FIG. 20 is a block diagram illustrating an example computing device that may be used in at least some embodiments. In some embodiments, the computing device 2000 shown in FIG. 20 may be used to implement any of the techniques described above in FIGS. 1-19.

FIG. 20 illustrates such a general-purpose computing device 2000 as may be used in any of the embodiments described herein. In the illustrated embodiment, computing device 2000 includes one or more processors 2010 coupled to a system memory 2020 (which may comprise both non-volatile and volatile memory modules) via an input/output (I/O) interface 2030. Computing device 2000 further includes a network interface 2040 coupled to I/O interface 2030. Classical computing functions such as preparing training data sets for a local neural network decoder, training a local neural network decoder, controlling a quantum hardware device, and other non-quantum operations as described herein may be performed on a classical computer system, such as computing device 2000.

In various embodiments, computing device 2000 may be a uniprocessor system including one processor 2010, or a multiprocessor system including several processors 2010 (e.g., two, four, eight, or another suitable number). Processors 2010 may be any suitable processors capable of executing instructions. For example, in various embodiments, processors 2010 may be general-purpose or embedded processors implementing any of a variety of instruction set architectures (ISAs), such as the x86, PowerPC, SPARC, or MIPS ISAs, or any other suitable ISA. In multiprocessor systems, each of processors 2010 may commonly, but not necessarily, implement the same ISA. In some implementations, graphics processing units (GPUs) may be used instead of, or in addition to, conventional processors.

System memory 2020 may be configured to store instructions and data accessible by processor(s) 2010. In at least some embodiments, the system memory 2020 may comprise both volatile and non-volatile portions; in other embodiments, only volatile memory may be used. In various embodiments, the volatile portion of system memory 2020 may be implemented using any suitable memory technology, such as static random-access memory (SRAM), synchronous dynamic RAM or any other type of memory. For the non-volatile portion of system memory (which may comprise one or more NVDIMMs, for example), in some embodiments flash-based memory devices, including NAND-flash devices, may be used. In at least some embodiments, the non-volatile portion of the system memory may include a power source, such as a supercapacitor or other power storage device (e.g., a battery). In various embodiments, memristor based resistive random-access memory (ReRAM), three-dimensional NAND technologies, Ferroelectric RAM, magneto resistive RAM (MRAM), or any of various types of phase change memory (PCM) may be used at least for the non-volatile portion of system memory. In the illustrated embodiment, program instructions and data implementing one or more desired functions, such as those methods, techniques, and data described above, are shown stored within system memory 2020 as code 2025 and data 2026.

In some embodiments, I/O interface 2030 may be configured to coordinate I/O traffic between processor 2010, system memory 2020, and any peripheral devices in the device, including network interface 2040 or other peripheral interfaces such as various types of persistent and/or volatile storage devices. In some embodiments, I/O interface 2030 may perform any necessary protocol, timing or other data transformations to convert data signals from one component (e.g., system memory 2020) into a format suitable for use by another component (e.g., processor 2010). In some embodiments, I/O interface 2030 may include support for devices attached through various types of peripheral buses, such as a variant of the Peripheral Component Interconnect (PCI) bus standard or the Universal Serial Bus (USB) standard, for example. In some embodiments, the function of I/O interface 2030 may be split into two or more separate components, such as a north bridge and a south bridge, for example. Also, in some embodiments some or all of the functionality of I/O interface 2030, such as an interface to system memory 2020, may be incorporated directly into processor 2010.

Network interface 2040 may be configured to allow data to be exchanged between computing device 2000 and other devices 2060 attached to a network or networks 2050, such as other computer systems or devices. In various embodiments, network interface 2040 may support communication via any suitable wired or wireless general data networks, such as types of Ethernet network, for example. Additionally, network interface 2040 may support communication via telecommunications/telephony networks such as analog voice networks or digital fiber communications networks, via storage area networks such as Fibre Channel SANs, or via any other suitable type of network and/or protocol.

In some embodiments, system memory 2020 may represent one embodiment of a computer-accessible medium configured to store at least a subset of program instructions and data used for implementing the methods and apparatus discussed in the context of FIG. 1 through FIG. 19. However, in other embodiments, program instructions and/or data may be received, sent or stored upon different types of computer-accessible media. Generally speaking, a computer-accessible medium may include non-transitory storage media or memory media such as magnetic or optical media, e.g., disk or DVD/CD coupled to computing device 2000 via I/O interface 2030. A non-transitory computer-accessible storage medium may also include any volatile or non-volatile media such as RAM (e.g., SDRAM, DDR SDRAM, RDRAM, SRAM, etc.), ROM, etc., that may be included in some embodiments of computing device 2000 as system memory 2020 or another type of memory. In some embodiments, a plurality of non-transitory computer-readable storage media may collectively store program instructions that when executed on or across one or more processors implement at least a subset of the methods and techniques described above. A computer-accessible medium may further include transmission media or signals such as electrical, electromagnetic, or digital signals, conveyed via a communication medium such as a network and/or a wireless link, such as may be implemented via network interface 2040. Portions or all of multiple computing devices such as that illustrated in FIG. 20 may be used to implement the described functionality in various embodiments; for example, software components running on a variety of different devices and servers may collaborate to provide the functionality. In some embodiments, portions of the described functionality may be implemented using storage devices, network devices, or special-purpose computer systems, in addition to or instead of being implemented using general-purpose computer systems. The term "computing device", as used herein, refers to at least all these types of devices, and is not limited to these types of devices.

CONCLUSION

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, volatile or non-volatile media such as RAM (e.g., SDRAM, DDR, RDRAM, SRAM, etc.), ROM, etc., as well as transmission media or signals such as electrical, electromagnetic, or digital signals, conveyed via a communication medium such as network and/or a wireless link.

The various methods as illustrated in the Figures above and described herein represent exemplary embodiments of methods. The methods may be implemented in software, hardware, or a combination thereof. The order of method may be changed, and various elements may be added, reordered, combined, omitted, modified, etc.

It will also be understood that, although the terms first, second, etc., may be used herein to describe various elements, these elements should not be limited by these terms. These terms are only used to distinguish one element from another. For example, a first contact could be termed a second contact, and, similarly, a second contact could be termed a first contact, without departing from the scope of the present invention. The first contact and the second contact are both contacts, but they are not the same contact.

Various modifications and changes may be made as would be obvious to a person skilled in the art having the benefit of this disclosure. It is intended to embrace all such modifications and changes and, accordingly, the above description is to be regarded in an illustrative rather than a restrictive sense.

What is claimed is:

1. A method to train, via a supervised learning technique, a local decoder to be used to perform error correction for quantum surface codes, the method comprising:
   determining a three-dimensional, fully-convolutional neural network architecture for the local decoder such that the three-dimensional, fully-convolutional neural network architecture accounts for circuit-level noise;
   providing a training data set of simulated measurement results that form a simulated measurement results volume, bounded by first and second dimensions corresponding to dimensions of a simulated quantum surface code and a third dimension corresponding to a number of rounds included in a plurality of rounds of syndrome measurements, wherein the training data set further comprises:
- syndrome difference information for the number of rounds;
- location information about qubit placement within the first, second, and third dimensions of the simulated measurement results volume; and
- temporal boundaries information about the number of rounds;

determining predictions of locations of alleged errors on data qubits within the training data set;

comparing the predictions of locations of alleged errors to ground truth information, wherein the ground truth information comprises actual locations of errors on data qubits within the training data set; and providing the trained local decoder.

2. The method of claim 1, wherein the circuit-level noise is based, at least in part, on one or more of the following:
- one or more errors pertaining to single qubit gates acting on given qubits of a given quantum surface code of the quantum surface codes;
- one or more errors pertaining to multi-qubit gates between given qubits of the given quantum surface code;
- one or more measurement errors pertaining to a given plurality of rounds of syndrome measurements of the given quantum surface code;
- one or more errors pertaining to ancilla qubit reset timesteps of the given plurality of rounds of syndrome measurements of the given quantum surface code; or
- one or more errors pertaining to idling of given qubits of the given quantum surface code.

3. The method of claim 1, further comprising determining a homological equivalence convention to be applied to homologically equivalent errors within the actual locations of the errors on the data qubits within the training data set, wherein the homological equivalence convention comprises one or more of:
- one or more weight-reduction transformations; and
- one or more equivalence transformations.

4. The method of claim 3, wherein the comparing the predictions of the locations of alleged errors to the ground truth information comprises applying the homological equivalence convention to the ground truth information.

5. The method of claim 1, wherein:
- the determining the three-dimensional, fully-convolutional neural network architecture for the local decoder is based, at least in part, on respective sizes of the first, second, and third dimensions of the training data set of simulated measurement results; and
- one or more respective sizes of the three-dimensional fully-convolutional neural network architecture are smaller than one or more of the corresponding respective sizes of the first, second, and third dimensions of the training data set of simulated measurement results.

6. The method of claim 1, further comprising generating the training data set, wherein the generating comprises:
- performing one or more Monte Carlo simulations to obtain the simulated measurement results, wherein the one or more Monte Carlo simulations are based, at least in part, on a circuit-level noise model.

7. The method of claim 1, further comprising:
performing error correction for other measurement results of a given quantum surface code of the quantum surface codes, wherein said performing the error correction comprises:
- decoding the other measurement results, via the trained local decoder, wherein the trained local decoder incrementally decodes a first set of detected syndrome differences of a total number of syndrome differences in the other measurement results.

8. The method of claim 7, wherein the performing the error correction for the other measurement results further comprises:
- decoding the decoded other measurement results, via a global decoder, wherein the global decoder decodes a second set of detected syndrome differences in the decoded other measurement results subsequent to the decoding via the trained local decoder.

9. The method of claim 7, wherein at least one dimension of the given quantum surface code and at least one dimension of the first and second dimensions of the simulated quantum surface code are different in size.

10. The method of claim 7, wherein the third dimension of the simulated measurement results volume and a number of rounds of syndrome measurements in the other measurement results of the given quantum surface code are different.

11. A system, comprising:
one or more computing devices configured to perform training for a local decoder that is configured to account for circuit-level noise, wherein to perform the training, the one or more computing devices are further configured to:
- provide a training data set of simulated measurement results that form a simulated measurement results volume, bounded by first and second dimensions corresponding to dimensions of a simulated quantum surface code and a third dimension corresponding to a number of rounds included in a plurality of rounds of syndrome measurements, wherein the training data set further comprises:
  - syndrome information for the number of rounds;
  - location information about qubit placement within the first, second, and third dimensions of the simulated measurement results volume; and
  - temporal boundaries information about the number of rounds;
- determine predictions of locations of alleged errors on data qubits within the training data set;
- compare the predictions of locations of alleged errors to ground truth information, wherein the ground truth information comprises actual locations of errors on data qubits within the training data set; and
- provide the trained local decoder for use in performing error correction for quantum surface codes.

12. The system of claim 11, wherein the circuit-level noise is based, at least in part, on one or more of the following:
- one or more errors pertaining to single qubit gates acting on given qubits of a given quantum surface code of the quantum surface codes;
- one or more errors pertaining to multi-qubit gates between given qubits of the given quantum surface code;
- one or more measurement errors pertaining to a given plurality of rounds of syndrome measurements of the given quantum surface code;
- one or more errors pertaining to ancilla qubit reset timesteps of the given plurality of rounds of syndrome measurements of the given quantum surface code; or one or more errors pertaining to idling of given qubits of the given quantum surface code.

13. The system of claim 11, further comprising:
one or more quantum hardware devices configured to implement a given quantum surface code, wherein at least one of the one or more computing devices or one or more additional computing devices are configured to:
perform a first error correction step for other measurement results of the given quantum surface code of the quantum surface codes, wherein to perform the error correction for the other measurement results, the at least one of the one or more computing devices or one or more additional computing devices are further configured to decode the other measurement results, via the trained local decoder.

14. The system of claim 11, wherein the syndrome information for the number of rounds is configured such that respective syndrome densities for respective rounds of the plurality of rounds of syndrome measurements are not correlated with the number of rounds.

15. The system of claim 11, wherein a given qubit placement at a boundary of the simulated measurement results volume may be determined based, at least in part, on the location information about qubit placement within the first, second, and third dimensions of the simulated measurement results volume.

16. One or more non-transitory, computer-readable media storing program instructions that when executed on or across one or more processors, cause the one or more processors to:
train, via a supervised learning technique, a local decoder to be used to perform error correction for quantum surface codes, wherein to train the local decoder, the program instructions further cause the one or more processors to:
determine a three-dimensional, fully-convolutional neural network architecture for the local decoder such that the three-dimensional, fully-convolutional neural network architecture accounts for circuit-level noise;
provide a training data set of simulated measurement results that form a simulated measurement results volume, bounded by first and second dimensions corresponding to dimensions of a simulated quantum surface code and a third dimension corresponding to a number of rounds included in a plurality of rounds of syndrome measurements, wherein the training data set further comprises:
syndrome information for the number of rounds;
location information about qubit placement within the first, second, and third dimensions of the simulated measurement results volume; and
temporal boundaries information about the number of rounds;
determine predictions of locations of alleged errors on data qubits within the training data set;
compare the predictions of locations of alleged errors to ground truth information, wherein the ground truth information comprises actual locations of errors on data qubits within the training data set; and
provide the trained local decoder.

17. The non-transitory, computer-readable medium of claim 16, wherein the circuit-level noise is based, at least in part, on one or more of the following:
one or more errors pertaining to single qubit gates acting on given qubits of a given quantum surface code of the quantum surface codes;
one or more errors pertaining to multi-qubit gates between given qubits of the given quantum surface code;
one or more measurement errors pertaining to a given plurality of rounds of syndrome measurements of the given quantum surface code;
one or more errors pertaining to ancilla qubit reset timesteps of the given plurality of rounds of syndrome measurements of the given quantum surface code; or
one or more errors pertaining to idling of given qubits of the given quantum surface code.

18. The non-transitory, computer-readable medium of claim 16, wherein the program instructions further cause the one or more processors to:
determine a homological equivalence convention to be applied to homologically equivalent errors within the actual locations of the errors on the data qubits within the training data set, wherein the homological equivalence convention comprises at least one or more of:
one or more weight-reduction transformations; or
one or more equivalence transformations; and
apply the homological equivalence convention to the ground truth information.

19. The non-transitory, computer-readable medium of claim 16, wherein the program instructions further cause the one or more processors to:
generate the training data set, wherein to generate the training data set, the program instructions further cause the one or more processors to:
perform one or more Monte Carlo simulations to obtain the simulated measurement results, wherein the one or more Monte Carlo simulations are based, at least in part, on a circuit-level noise model.

20. The non-transitory, computer-readable medium of claim 16, wherein the syndrome information comprises syndrome differences between respective sets of consecutive rounds of the plurality of rounds of syndrome measurements.

* * * * *